United States Patent
Fujii et al.

(10) Patent No.: US 7,312,558 B2
(45) Date of Patent: Dec. 25, 2007

(54) PIEZOELECTRIC ELEMENT, INK JET HEAD, ANGULAR VELOCITY SENSOR, AND INK JET RECORDING APPARATUS

(75) Inventors: Satoru Fujii, Osaka (JP); Takeshi Kamada, Nara (JP); Atsushi Tomozawa, Osaka (JP); Eiji Fujii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 392 days.

(21) Appl. No.: 11/097,924

(22) Filed: Apr. 1, 2005

(65) Prior Publication Data

US 2005/0218756 A1 Oct. 6, 2005

(30) Foreign Application Priority Data

Apr. 2, 2004 (JP) ............................. 2004-109689
Apr. 23, 2004 (JP) ............................. 2004-127862

(51) Int. Cl.
*H01L 41/187* (2006.01)
*H01L 41/04* (2006.01)
*H01L 41/16* (2006.01)

(52) U.S. Cl. ................. 310/358; 257/347; 252/62.9 R; 252/62.9 PZ; 501/134

(58) Field of Classification Search ........ 310/358–361; 252/26.9 R, 26.9 PZ; 501/134
See application file for complete search history.

(56) References Cited

U.S. PATENT DOCUMENTS

2003/0098632 A1* 5/2003 Takeuchi et al. ............ 310/328
2004/0206296 A1* 10/2004 Lee et al. ...................... 117/2
2004/0256948 A1* 12/2004 Solberg ....................... 310/311
2005/0127795 A1* 6/2005 Torii et al. ................... 310/360
2005/0146772 A1* 7/2005 Murata et al. ............... 359/291

FOREIGN PATENT DOCUMENTS

JP 06116095 A 4/1994

(Continued)

OTHER PUBLICATIONS

Ryoichi Takayama et al.; "Preparation of epitaxial $Pb(Zr_xTi_{1-x})O_3$ thin fims and their crystallographic, pyroelectric, and ferroelectric properties"; Journal of Applied Physics, vol. 65, No. 4; pp. 1666-1670; Feb. 1989.

Kouji Sumi et al.; "Structure and Piezoelectric Properties of $0.9Pb(Zr,Ti)O_3$-$0.1Pb(Mg, Nb) O_3$ Films Prepared by Metalorganic Deposition Process"; Japanese Journal of Applied Physics; vol. 38, No. 2A, pp. 886-889; Feb. 1999.

(Continued)

*Primary Examiner*—J. San Martin
(74) *Attorney, Agent, or Firm*—Harness, Dickey & Pierce, P.L.C.

(57) ABSTRACT

In a piezoelectric element, a cubic or tetragonal orientation control layer (15) is provided on a first electrode layer (14), and formed on the orientation control layer (15) is a piezoelectric layer (16) having a rhombohedral or tetragonal crystalline structure and made of lead zirconate titanate to which a Pb-containing complex perovskite compound expressed by the chemical formula $Pb(A_aB_b)O_3$ has been added in an amount that is from 1 mol % to 50 mol %. The piezoelectric layer (16) is formed so that the crystal grains thereof become columnar grains which extend in the thickness direction of the piezoelectric layer (16) and in which the ratio of the average cross-sectional diameter to the length is from 1/50 to 1/14.

24 Claims, 19 Drawing Sheets

FOREIGN PATENT DOCUMENTS

| | | |
|---|---|---|
| JP | 10-081016 A | 3/1998 |
| JP | 10-209517 A | 8/1998 |
| JP | 11-191646 A | 7/1999 |
| JP | 3021930 | 1/2000 |
| JP | 2000-252544 A | 9/2000 |
| JP | 2001-088294 A | 4/2001 |

OTHER PUBLICATIONS

P Muralt et al.; "Texture control of $PbTiO_3$ and $Pb(Zr, Ti)O_3$ thin films with $TiO_2$ seeding"; Journal of Applied Physics vol. 83, No. 7; pp. 3835-3841; Apr. 1998.

* cited by examiner

Piezoelectric layer
First electrode layer
Substrate

Pb-containing complex perovskite compound content (mol%)

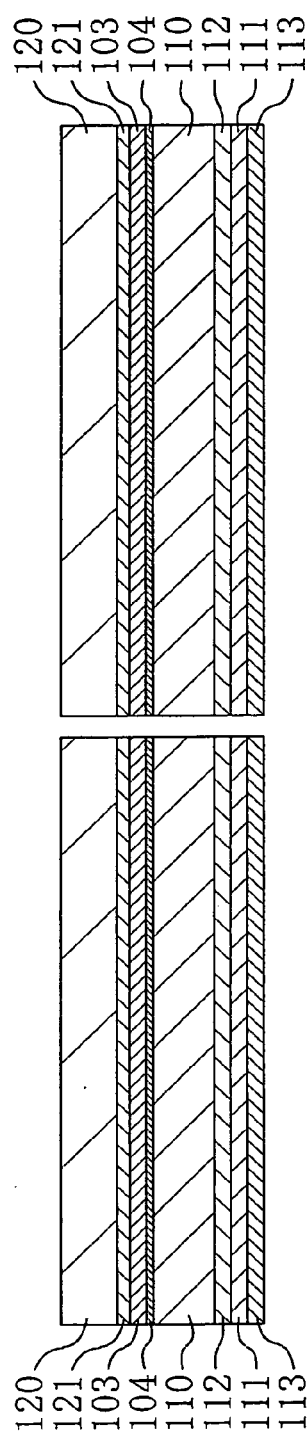
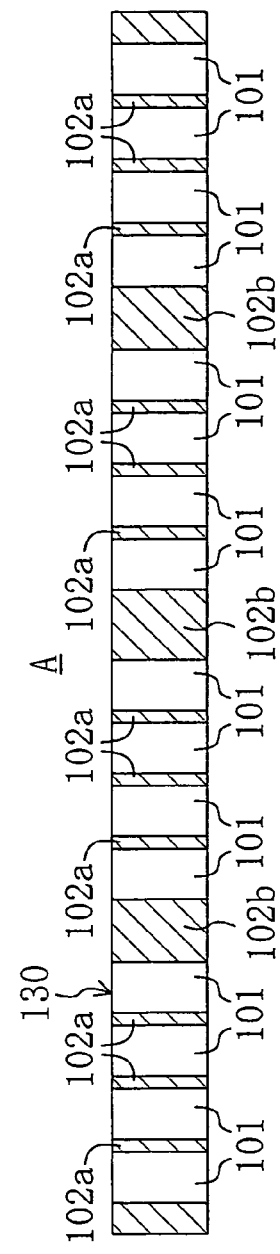
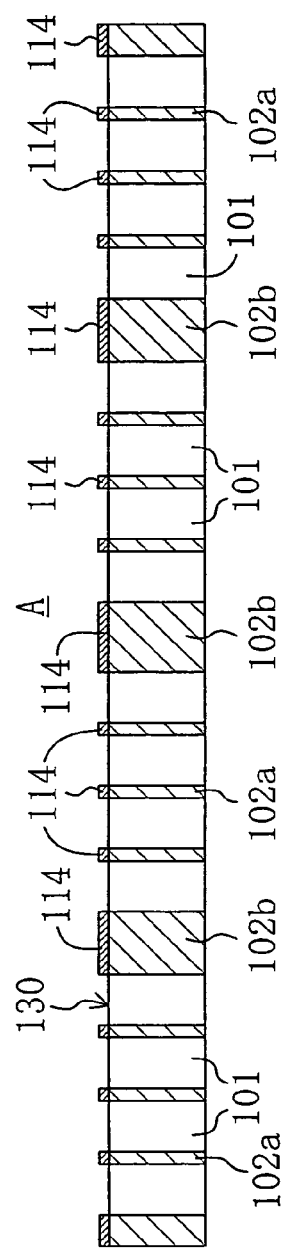
FIG. 12A
FIG. 12B
FIG. 12C

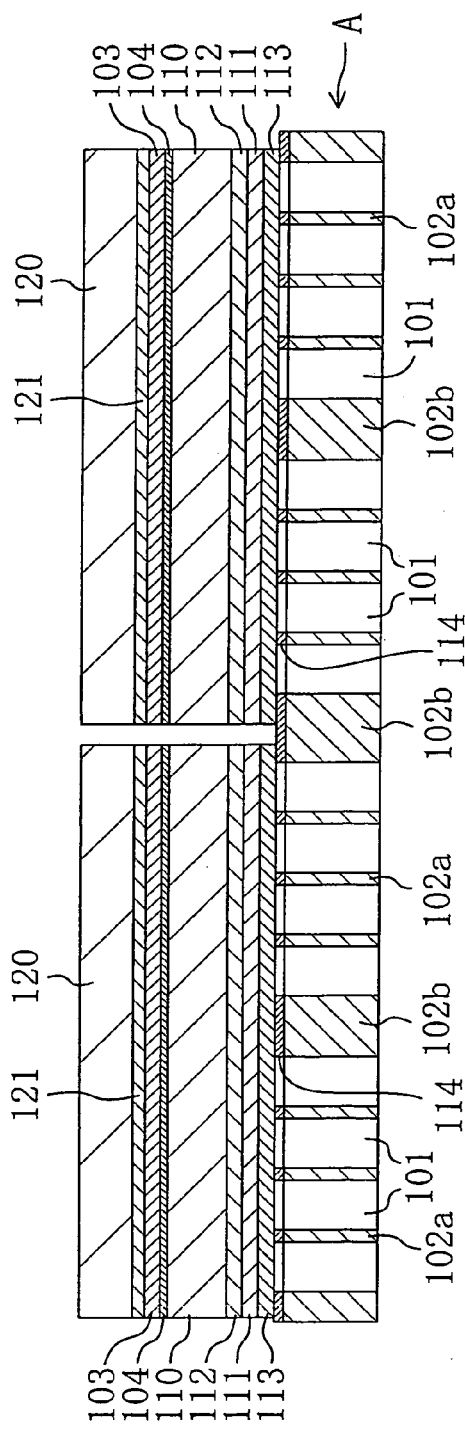
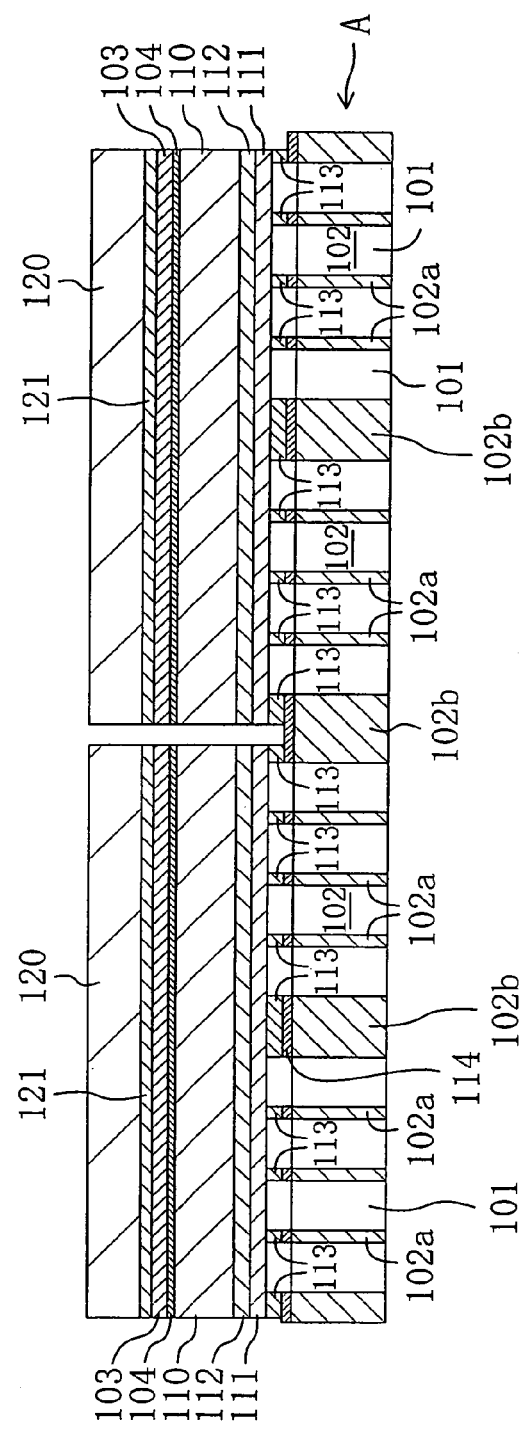

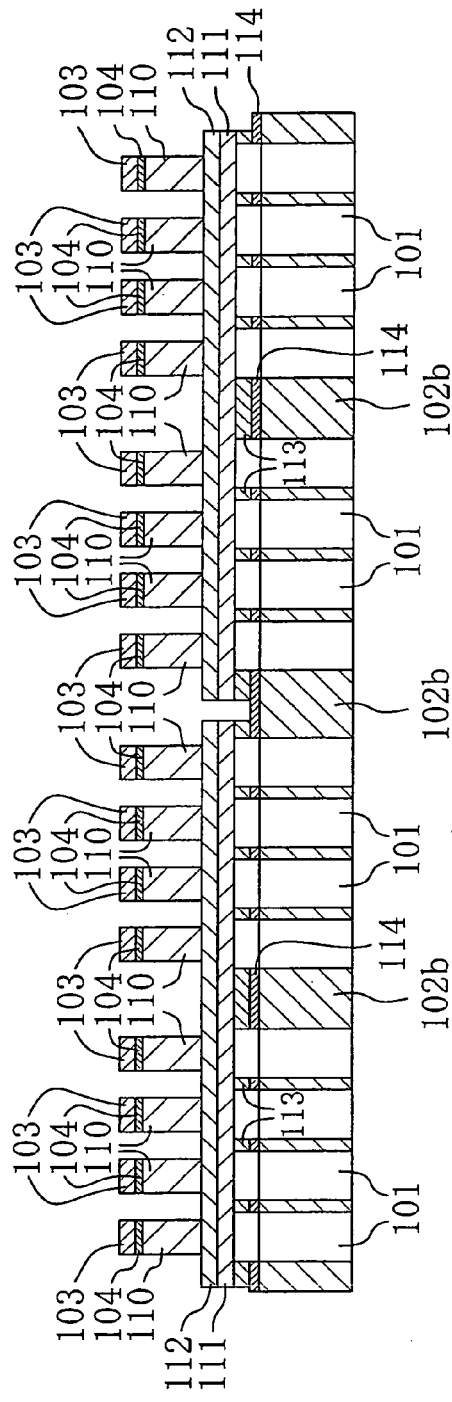
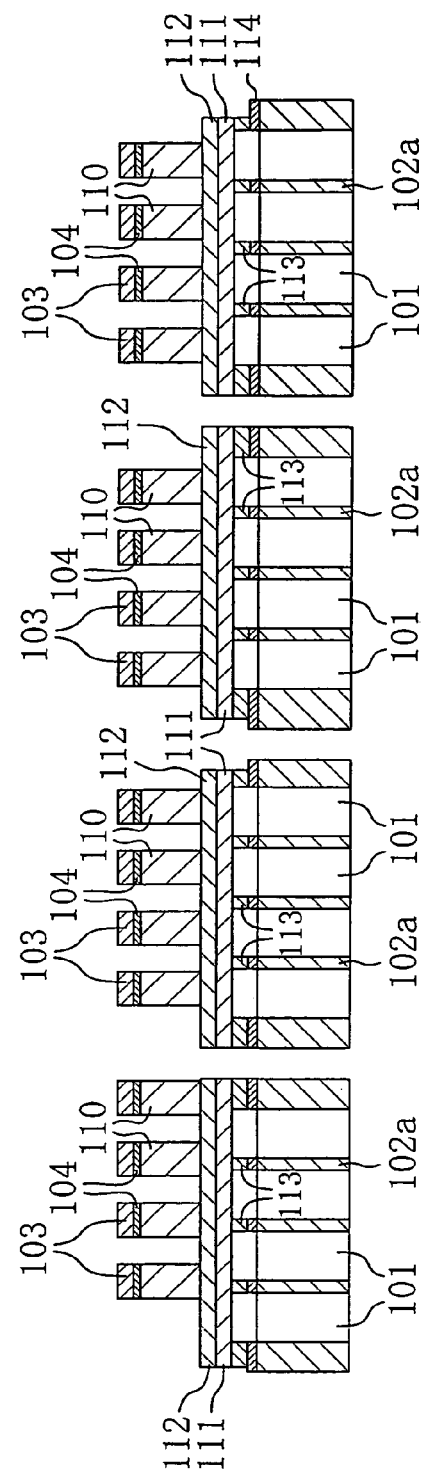
FIG. 15A
FIG. 15B

PIEZOELECTRIC ELEMENT, INK JET HEAD, ANGULAR VELOCITY SENSOR, AND INK JET RECORDING APPARATUS

CROSS-REFERENCE TO RELATED APPLICATION

This application claims priority under 35 U.S.C. §119 on Patent Applications No. 2004-109689 filed in Japan on Apr. 2, 2004 and No. 2004-127862 filed in Japan on Apr. 23, 2004, the entire contents of which are hereby incorporated by reference.

BACKGROUND OF THE INVENTION

1. Field of the Invention

The present invention relates to a piezoelectric element having an electromechanical conversion function, an ink jet head using the piezoelectric element, an angular velocity sensor, a method for manufacturing the same, and an ink jet recording apparatus including the ink jet head as printing means.

2. Description of Conventional Art

Generally, a piezoelectric material is a material capable of converting a mechanical energy to an electrical energy and vice versa. A typical example of a piezoelectric material is lead zirconate titanate having a perovskite crystalline structure ($Pb(Zr,Ti)O_3$) (hereinafter referred to as "PZT"). In PZT, the greatest piezoelectric displacement is obtained in the <001> direction (the c axis direction) in the case of a tetragonal system, and in the <111> direction in the case of a rhombohedral system. However, many of the piezoelectric materials are polycrystals made up of a collection of crystal grains, and the crystallographic axes of the crystal grains are oriented randomly. Therefore, the spontaneous polarizations Ps are also arranged randomly.

Along with the recent downsizing of electronic appliances, there is a strong demand for reducing the size of piezoelectric elements using a piezoelectric material. In order to meet the demand, more piezoelectric elements are already used in the form of thin films whose volumes can be significantly reduced from those of sinters, which have conventionally been used in various applications, and active researches and developments have been made for reducing the thickness of thin-film piezoelectric elements. For example, in the case of tetragonal PZT, the spontaneous polarization Ps is oriented in the c axis direction. Therefore, in order to realize superior piezoelectric characteristics even with a reduced thickness, the c axes of crystal grains forming a PZT thin film need to be aligned vertical to the substrate plane. In order to realize such an alignment, a sputtering method has been used in the prior art. Specifically, on a single crystal substrate made of magnesium oxide (MgO) having an NaCl-type crystalline structure, which has been cut out so that the surface thereof is along the crystal orientation of the (100) plane, a (100)-oriented Pt electrode thin film is formed as a lower electrode on the substrate, and a PZT thin film whose c axis is oriented vertical to the surface of the Pt electrode is formed on the Pt electrode at a temperature of 600 to 700° C. (see, for example, Journal of Applied Physics vol. 65 No. 4 (published on 15 Feb. 1989 from the American Physical Society) pp. 1666-1670, and Japanese Unexamined Patent Publication No. 10-209517). In such a case, if a piezoelectric layer having a thickness of 0.1 μm and made of $PbTiO_3$ or $(Pb,La)TiO_3$, free of Zr, is formed as a base layer for the PZT thin film on the (100)-oriented Pt electrode before the formation of the PZT thin film, and then the PZT thin film having a thickness of 2.5 μm is formed on the piezoelectric layer by a sputtering method, it is less likely that a layer of a low crystallinity made of a Zr oxide is formed early in the formation of the PZT thin film, thereby allowing the PZT thin film to have a higher crystallinity. Specifically, in the obtained PZT thin film, the degree of (001) orientation ("α(001)") is about 100%.

Herein, α(001) is defined as follows:

$\alpha(001) = I(001)/\Sigma I(hkl).$

ΣI(hkl) is the sum of diffraction peak intensities from various crystal planes of PZT having a perovskite crystalline structure for a Cu—Kα 2θ range of 10° to 70° in an X-ray diffraction method. Note that the (002) plane and the (200) plane are not included in ΣI(hkl) as they are equivalent to the (001) plane and (100) plane.

However, this method uses an MgO single crystal substrate as a base substrate, thereby increasing the cost of the piezoelectric element, and thus the cost of an ink jet head using the piezoelectric element. Moreover, another drawback is that the variety of the substrate material is limited to the MgO single crystal.

In view of this, various methods have been developed for forming a (001)- or (100)-oriented film of a perovskite piezoelectric material such as PZT on an inexpensive substrate such as a silicon substrate. For example, Japanese Patent Publication No. 3021930 discloses that a PZT film that is preferentially oriented along the (100) plane can be produced by applying a precursor solution of PZT or lanthanum-containing PZT on a (111)-oriented Pt electrode, performing a thermal decomposition process at 450 to 550° C. before the precursor solution is crystallized and then heating and crystallizing the precursor solution at 550 to 800° C. (a sol-gel method).

Moreover, Japanese Unexamined Patent Publication No. 2001-88294 discloses that by forming a very thin titanium layer on an iridium lower electrode, it is possible to control the crystal orientation of a PZT film to be formed thereon. This manufacturing method includes: forming a base layer whose main component is zirconium oxide on a substrate made of silicon, or the like; forming a lower electrode containing iridium on the base layer; depositing a very thin titanium layer on the lower electrode; forming an amorphous piezoelectric precursor thin film containing metal element and oxygen element, which forms a ferroelectric having piezoelectric characteristics, on the titanium layer; and heating and crystallizing the amorphous thin film at a high temperature (a sol-gel method), thereby turning the amorphous thin film into a perovskite piezoelectric thin film. With this manufacturing method, the crystal orientation of the piezoelectric thin film such as PZT can be controlled by the thickness of the titanium layer, and a (100)-oriented film is obtained when the thickness of the titanium layer is set to be 2 to 10 nm, while a (111)-oriented film is obtained when the thickness of the titanium layer is set to be 10 to 20 nm Also, Japanese Unexamined Patent Publication No. 11-191646 discloses that where a piezoelectric thin film is formed by using a sol-gel method, a (100)-oriented PZT film can be obtained by forming a titanium layer having a thickness of 4 to 6 nm on a (111)-oriented Pt electrode and using titanium oxide, which is formed through oxidization of titanium in the titanium layer, as a nucleus.

Furthermore, attempts have also been made to form on a silicon substrate a piezoelectric thin film having higher piezoelectric characteristics than a PZT thin film by adding an additive to PZT. For example, Japanese Unexamined Patent Publication No. 10-81016 discloses a piezoelectric element that uses a PZT thin film to which lead magnesium niobate has been added, while disclosing that the lead-magnesium-niobate-added PZT thin film can be formed on a Pt electrode by a sol-gel method so as to be preferentially oriented along the (100) plane in a rhombohedral system. Also, the piezoelectric characteristics of a PZT thin film (0.9PZT–0.1PMN thin film) to which $Pb(Mg_{1/3}Nb_{2/3})O_3$ has been added are evaluated in pp. 886-889 in Japanese Journal of Applied Physics vol. 38 No. 2A published in February in 1999 by the Japan Society of Applied Physics. This PZT thin film is tetragonal and oriented along two directions, that is, the (100) plane and the (111) plane. It has been reported that the PZT thin film exhibits a very high piezoelectric constant $d_{31}$ of 190 pm/V at an electric field strength of 170 kV/cm.

However, while the methods described above are desirable methods that do not use an expensive MgO single-crystal substrate, it is difficult to obtain a well-oriented film having a desirable crystallinity in the film formation process, as in the case of forming a piezoelectric thin film on an MgO single-crystal substrate, because the piezoelectric thin film is formed by a sol-gel method. In view of this, an amorphous piezoelectric thin film is first formed, and then the layered structure including the substrate and the piezoelectric thin film is subjected to a heat treatment, so that the crystallographic axes are preferentially oriented in a desirable direction.

Moreover, when piezoelectric elements are mass-produced with a sol-gel method, the amorphous piezoelectric precursor thin film is likely to be cracked due to changes in the volume during the degreasing step of removing organic substances. Furthermore, in the step of heating and crystallizing the amorphous piezoelectric precursor thin film at a high temperature, the film is likely to be cracked or peeled off from the lower electrode due to crystal changes.

As a solution to these problems with a sol-gel method, Japanese Unexamined Patent Publication Nos. 10-81016 and 2000-252544 disclose that it is effective to add titanium or titanium oxide in the lower electrode. Particularly, Japanese Unexamined Patent Publication No. 10-81016 shows that a (100)-oriented PZT film can be obtained even with a sputtering method. Note however that a perovskite PZT film is not obtained directly on the lower electrode. First, a PZT film having an amorphous or pyrochlore crystalline structure is formed at a low temperature of 200° C. or less, which is then crystallized through a heat treatment at a high temperature of 500 to 700° C. in an oxygen atmosphere. Therefore, as with a sol-gel method, the film is likely to be cracked or peeled off from the lower electrode due to crystal changes in the step of heating and crystallizing the film at a high temperature. Moreover, the degree of (001) orientation or the degree of (100) orientation of the PZT film formed by a sol-gel method or a sputtering method as described above is 85% or less with either method.

Furthermore, with a sol-gel method, the maximum thickness of the PZT film to be formed in a single iteration of the step (including the application of the precursor solution and the following heat treatment) is about 100 nm at maximum. Therefore, in order to obtain a thickness of 1 μm or more, which is required for a piezoelectric element, it is necessary to repeat this step ten times or more, whereby the production yield may be reduced.

On the other hand, according to Japanese Unexamined Patent Publication No. 2001-88294, supra, states that attempts were made to control the orientation of PZT on an Ir base electrode with a very thin titanium layer formed thereon by using a method other than a sol-gel method (including an MOD method) (in which an amorphous thin film is once formed and then the thin film is turned into a crystalline thin film through an aftertreatment such as a heat treatment), i.e., by using a method in which a crystalline thin film is directly formed without the crystallization step using a heat treatment, e.g., a sputtering method, a laser ablation method or a CVD method, and that a well-oriented film was not obtained with any method other than a sol-gel method. The reason is stated to be as follows. The crystallization of the PZT film proceeds gradually from the lower electrode side to the upper electrode side with a sol-gel method, whereas with a CVD method or a sputtering method, the crystallization of the PZT film proceeds randomly, resulting in irregular crystallization, and thus making the orientation control difficult.

Moreover, when a titanium oxide film whose thickness is 12 nm or less is formed on a (111)-oriented Pt electrode layer, and a lead titanate film or a PZT film having a perovskite crystalline structure is formed directly by a sputtering method, either film exhibits a (111) orientation property, and a (100)- or (001)-oriented film is not obtained (see Journal of Applied Physics vol. 83 No. 7 (published on 1 Apr. 1998 from the American Physical Society) pp. 3835-3841).

Furthermore, even if a (100)- or (001)-oriented film is obtained, there is a problem in that such a film cracks when driven continuously as a piezoelectric element. And even the (111)-oriented film cracks as in the case of the (100)- or (001)-oriented film. Such cracks were often observed in a piezoelectric thin film having a crystalline structure in which the crystal grains of the piezoelectric thin film grew in the direction vertical to the thickness direction of the piezoelectric thin film (i.e., the direction along the film surface), and were hardly seen in a piezoelectric thin film having a crystalline structure in which the crystal grains of the piezoelectric thin film were columnar grains that grew appropriately in the thickness direction of the piezoelectric thin film. This is presumably because a stress produced when the piezoelectric thin film is driven is relaxed at the grain boundaries, while the adhesion strength of the thin film is high.

SUMMARY OF THE INVENTION

The present invention has been made in view of the above, and has an object to provide a reliable piezoelectric element with desirable piezoelectric characteristics at low cost.

In order to achieve the object set forth above, according to the present invention, an orientation control layer made of a cubic or tetragonal perovskite oxide is formed on an electrode layer, and formed on the orientation control layer is a piezoelectric layer having a rhombohedral or tetragonal crystalline structure and made of lead zirconate titanate to which a Pb-containing complex perovskite compound expressed by the chemical formula $Pb(A_aB_b)O_3$ has been added in an amount that is from 1 mol % to 50 mol %. And the piezoelectric layer is formed so that the crystal grains thereof become columnar grains which extend thicknesswise in the piezoelectric layer and in which the ratio of the average cross-sectional diameter to the length (average cross-sectional diameter/length) is from 1/50 to 1/14.

Specifically, the 1st invention is directed to a piezoelectric element including: a first electrode layer; an orientation control layer provided on the first electrode layer; a piezoelectric layer provided on the orientation control layer; and a second electrode layer provided on the piezoelectric layer.

The orientation control layer is made of a cubic or tetragonal perovskite oxide; the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from $1/50$ to $1/14$.

In the above structure, the crystal grains of the piezoelectric layer are columnar grains which extend thickness-wise in the piezoelectric layer and in which the ratio of the average cross-sectional diameter of the grains to the grain length is from $1/50$ to $1/14$, whereby even if the piezoelectric element is driven continuously, stress in the piezoelectric layer is relaxed appropriately, thereby suppressing the occurrence of cracks in the piezoelectric layer. As a result, the reliability is increased. Also, the piezoelectric layer is made of PZT to which a Pb-containing complex perovskite compound has been added in an amount that is from 1 mol % to 50 mol %, whereby desirable piezoelectric characteristics are obtained.

According to the 2nd invention, in the 1st invention, the orientation control layer is preferentially oriented along a (100) or (001) plane, and the piezoelectric layer is preferentially oriented along a (001) plane.

Specifically, in the case where the first electrode layer is made of a noble metal or the like that contains an easily oxidized substance such as titanium, and the orientation control layer is formed on the first electrode layer by a sputtering method or the like, the orientation control layer is likely to be oriented along the (100) or (001) plane (the (100) plane and the (001) plane are the same in a cubic system) even if the first electrode layer is oriented along the (111) plane. More specifically, the contained substance exists in a dotted pattern on one surface of the first electrode layer and the contained substance, which is titanium or the like, is easily oxidized, such that even if the substance is not contained in the form of oxide, the substance existing in a dotted pattern on the surface becomes an oxide, if oxygen exists in the process step of forming the orientation control layer or other steps. The contained substance (oxide) exiting in a dotted pattern is used as a nucleus to grow the orientation control layer over the contained substance. Thus, the orientation control layer is likely to be oriented along the (100) or (001) plane over the contained substance. Furthermore, since the substance is contained in the first electrode layer, the substance hardly protrudes above the surface of the first electrode layer (even if it protrudes, the amount of protrusion is smaller than 2 nm). Also for such a reason, the orientation control layer is likely to be oriented along the (100) or (001) plane. On the other hand, the first electrode layer is normally oriented along the (111) plane when formed on a silicon substrate or the like. Therefore, a region of the orientation control layer above a portion of the surface of the first electrode layer where the contained substance does not exist may be oriented in a direction other than along the (100) or (001) plane (e.g., along the (111) plane) or may be amorphous. However, such a region that is not oriented along the (100) or (001) plane extends only in the vicinity of the surface of the orientation control layer that is closer to the first electrode layer (i.e., within a distance of about 20 nm at maximum from the surface). Therefore, the (100)- or (001)-oriented region which extends over the contained substance expands as the crystal growth process proceeds, and the cross-sectional area of the (100)- or (001)-oriented region in the direction perpendicular to the thickness direction gradually increases in the direction away from the first electrode layer toward the opposite side (the piezoelectric layer), whereby the region that is not oriented along the (100) or (001) plane gradually shrinks. When the thickness of the orientation control layer is about 20 nm, the (100)- or (001)-oriented region extends substantially across the entire surface. In the case where the piezoelectric layer is formed on the thus-formed orientation control layer, the piezoelectric layer is oriented by the orientation control layer along the (001) plane (including the (100) plane in a rhombohedral system because the (100) plane and the (001) plane are the same in a rhombohedral system). As a result, the degree of (001) orientation of the piezoelectric layer can be set to 90% or more. It should be noted that, in the orientation control layer, the region that is not oriented along the (100) or (001) plane may exist not only in the vicinity of the surface of the orientation control layer that is closer to the first electrode layer but also on a surface of the orientation control layer that is closer to the piezoelectric layer. Even in such a case, the (100)- or (001)-oriented region extends substantially across the entire surface of the orientation control layer that is close to the piezoelectric layer so long as the thickness of the orientation control layer is 0.01 μm or more, and as a result, the degree of (001) orientation of the piezoelectric layer is 90% or higher. This, in addition to the fact that the piezoelectric layer is made of PZT to which a Pb-containing complex perovskite compound has been added in an amount that is from 1 mol % to 50 mol %, allows the piezoelectric characteristics to be improved significantly.

Therefore, even with a deposition method, other than a sol-gel method, in which a crystalline thin film is directly formed on an inexpensive substrate such as a silicon substrate without the crystallization step using a heat treatment (e.g., a sputtering method or a CVD method), it is possible to obtain a piezoelectric layer with a desirable orientation, whereby it is possible to suppress deviation in the piezoelectric characteristics of the piezoelectric element and to improve the reliability thereof. As the piezoelectric element is used while applying an electric field in the direction vertical to the surface of the piezoelectric layer thereof, the (001) orientation is advantageous, particularly with a tetragonal crystalline structure, because the direction of the electric field is then parallel to the <001> polarization axis direction, thus resulting in an increased piezoelectric effect. Moreover, since the polarization rotation due to the application of an electric field does not occur, it is possible to suppress deviation in the piezoelectric characteristics of the piezoelectric element and to improve the reliability thereof. On the other hand, with a rhombohedral crystalline structure, since the polarization axis extends in the <111> direction, the (100) orientation results in an angle of about 54° between the direction of the electric field and the direction of the polarization axis. Nevertheless, by improving the (100) orientation property, the polarization can keep a constant angle with respect to the electric field application. Therefore, also in this case, the polarization rotation due to the electric field application does not occur, whereby it is possible to suppress deviation in the piezoelectric characteristics of the piezoelectric element and to improve the reliability thereof (for example, in a non-oriented PZT film, the polarization axes are oriented in various directions, and application of an electric field urges the polarization axes to be aligned parallel to the electric field, whereby the piezoelectric characteristics may become voltage dependent and vary significantly, or a sufficient reliability may not be maintained due to aging).

This, in addition to the fact that the crystal grains of the piezoelectric layer are columnar grains which extend in the thickness direction of the piezoelectric layer and in which the ratio of the average cross-sectional diameter to the length is from 1/50 to 1/14, enables the reliability of the piezoelectric element to be increased further.

Moreover, a piezoelectric layer having a desirable orientation is easily obtained without using an expensive MgO single-crystal substrate. Therefore, it is possible to reduce the manufacturing cost by using an inexpensive substrate, such as a glass substrate, a metal substrate, a ceramic substrate or an Si substrate.

Furthermore, even if the thickness of the piezoelectric layer is 1 µm or more, it is not necessary to repeat the same step a number of times, as with a sol-gel method, and the piezoelectric layer can be formed easily by a sputtering method, or the like. Thus, it is possible to suppress a decrease in the production yield.

According to the 3rd invention, in the 1st invention, the orientation control layer and the piezoelectric layer are both preferentially oriented along a (111) plane.

Specifically, when formed on a substrate made of silicon or the like, the first electrode layer is normally oriented along the (111) plane, such that the orientation control layer is also oriented along the (111) plane. However, as in the 2nd invention, if a substance, such as titanium or titanium oxide, is contained in the first electrode layer (titanium or the like may be contained in the first electrode layer, because, if so, the adhesion between the substrate and the first electrode layer can be increased without providing an adhesion layer between the substrate and the first electrode layer), the orientation control layer grows over the contained substance (oxide) existing in a dotted pattern on one surface of the first electrode layer by using the contained substance as a nucleus. As a result, regions of the orientation control layer located over portions of the surface of the first electrode layer where the contained substance does not exist are oriented along the (111) plane. On the other hand, regions of the orientation control layer located over portions of the surface of the first electrode layer where the contained substance exists are not oriented along the (111) plane but is oriented along the (100) or (001) plane as in the 2nd invention. Nevertheless, even if such regions that are not oriented along the (111) plane exist, those regions cause no problem, as long as the thickness of the orientation control layer is 8 nm or less. In the orientation control layer, as the crystal growth process proceeds (as the thickness of the orientation control layer increases), those regions that are not oriented along the (111) plane gradually expand, while the (111)-oriented region gradually shrinks. Therefore, if the thickness of the orientation control layer is set to a size (specifically, 8 nm or less) that prevents the regions that are not oriented along the (111) plane from expanding too much, the degree of (111) orientation will be 50% or more. If the piezoelectric layer is formed on the orientation control layer thus formed, the piezoelectric layer is preferentially oriented along the (111) plane by the orientation control layer. By providing the orientation control layer thus formed, a piezoelectric material having desirable piezoelectric characteristics can be used for the piezoelectric layer, while a material for further improving the crystallinity and the orientation can be used for the orientation control layer. As a result, it is possible to set the degree of (111) orientation of the piezoelectric layer to 80% or more.

Therefore, even with a deposition method, other than a sol-gel method, in which a crystalline thin film is directly formed on an inexpensive substrate such as a silicon substrate without the crystallization step using a heat treatment (e.g., a sputtering method or a CVD method), it is possible to obtain a piezoelectric layer with a desirable orientation, whereby it is possible to suppress deviation in the piezoelectric characteristics of the piezoelectric element and to improve the reliability thereof. As the piezoelectric element is used while applying an electric field in the direction vertical to the surface of the piezoelectric layer thereof, the (111) orientation is advantageous, particularly with a rhombohedral crystalline structure, because the direction of the electric field is then parallel to the <111> polarization axis direction, thus resulting in an increased piezoelectric effect. Moreover, since the polarization rotation due to the application of an electric field does not occur, it is possible to suppress deviation in the piezoelectric characteristics of the piezoelectric element and to improve the reliability thereof. On the other hand, with a tetragonal crystalline structure, since the polarization axis extends in the <001> direction, the (111) orientation results in an angle of about 54.7° between the direction of the electric field and the direction of the polarization axis. Nevertheless, by improving the (111) orientation property, the polarization can keep a constant angle with respect to the electric field application. Therefore, also in this case, the polarization rotation due to the electric field application does not occur, whereby it is possible to suppress deviation in the piezoelectric characteristics of the piezoelectric element and to improve the reliability thereof. Accordingly, effects similar to those of the 2nd invention are achieved.

According to the 4th invention, in the 1st invention, in the chemical formula of the Pb-containing complex perovskite compound, the element A is at least one element selected from the group consisting of Mg, Mn, Ni, Co, Zn, and Cd, and the element B is Nb; and in the chemical formula, the value of a is 1/3 and the value of b is 2/3.

According to the 5th invention, in the 1st invention, in the chemical formula of the Pb-containing complex perovskite compound, the element A is at least one element selected from the group consisting of Mg, Mn, and Ni, and the element B is Ta or Sb; and in the chemical formula, the value of a is 1/3 and the value of b is 2/3.

According to the 6th invention, in the 1st invention, in the chemical formula of the Pb-containing complex perovskite compound, the element A is at least one element selected from the group consisting of Fe, Cr, In, Y, Sb, and Mn, and the element B is Nb; and in the chemical formula, the value of a is 1/2 and the value of b is 1/2.

According to the 7th invention, in the 1st invention, in the chemical formula of the Pb-containing complex perovskite compound, the element A is at least one element selected from the group consisting of Fe, Cr, and Mn, and the element B is Ta; and in the chemical formula, the value of a is 1/2 and the value of b is 1/2.

According to the 8th invention, in the 1st invention, in the chemical formula of the Pb-containing complex perovskite compound, the element A is at least one element selected from the group consisting of Mn, Ni, Co, Mg, and Zn, and the element B is Te or W; and in the chemical formula, the value of a is 1/2 and the value of b is 1/2.

With the 4th through 8th inventions, the Pb-containing complex perovskite compound that favorably improves the piezoelectric characteristics of the piezoelectric element is obtained easily.

According to the 9th invention, in the 1st invention, the orientation control layer is made of lead lanthanum zirconate titanate whose zirconium content is equal to or greater than zero and less than or equal to 20 mol % and whose lead content is in excess of the stoichiometric composition by an amount greater than zero and less than or equal to 30 mol %, or made of the lead lanthanum zirconate titanate to which at least one of magnesium and manganese is added.

By using such a lead lanthanum zirconate titanate material (PLZT; including the composition where the zirconium content is zero, i.e., lead lanthanum titanate (PLT)) for the orientation control layer, it is possible to improve the orientation of the orientation control layer and hence the orientation of the piezoelectric layer. In addition, by setting the zirconium content to be less than or equal to 20 mol %, it is less likely that a layer of a low crystallinity made of a Zr oxide is formed early in the crystal growth process. Furthermore, by setting the lead content to be in excess of the stoichiometric composition by an amount greater than zero and less than or equal to 30 mol %, a decrease in the crystallinity of the orientation control layer is reliably suppressed, whereby the breakdown voltage is increased. Therefore, it is possible to reliably improve the crystallinity or the orientation of the piezoelectric layer, and to further improve the piezoelectric characteristics of the piezoelectric element.

According to the 10th invention, in the 9th invention, the lanthanum content of the lead lanthanum zirconate titanate in the orientation control layer is greater than zero and less than or equal to 25 mol %.

According to the 11th invention, in the 9th invention, when at least one of magnesium and manganese is added to the lead lanthanum zirconate titanate in the orientation control layer, the total amount thereof to be added is greater than zero and less than or equal to 10 mol %.

With the 10th and 11th inventions, a decrease in the crystallinity of the orientation control layer is more efficiently suppressed.

According to the 12th invention, in the 2nd invention, the first electrode layer is made of a noble metal containing titanium or titanium oxide.

Then, it is possible to preferentially orient the orientation control layer along the (100) or (001) plane easily and reliably, whereby the degree of (001) orientation of the piezoelectric layer is improved.

According to the 13th invention, in the 12th invention, the noble metal of the first electrode layer is at least one element selected from the group consisting of platinum, iridium, palladium and ruthenium, and the content of the titanium or titanium oxide which is contained in the noble metal is greater than zero and less than or equal to 30 mol %.

With such features, the first electrode layer sufficiently endures the temperatures selected for forming the respective films of the piezoelectric element by a sputtering method, or the like, and such a material of the first electrode layer is appropriate for use in the electrode. Further, the content of titanium or titanium oxide is preferably set to 30 mol % or less because, if it is higher than 30 mol %, the crystallinity and orientation property of the orientation control layer (and hence the crystallinity and orientation property of the piezoelectric layer) deteriorate.

According to the 14th invention, in the 12th invention, titanium or titanium oxide existing at a surface of the first electrode layer that is closer to the orientation control layer protrudes less than 2 nm from the surface.

The titanium or titanium oxide is intended to be contained in the first electrode layer, but is not intended to be provided above the surface of the first electrode layer. Thus, the titanium or titanium oxide hardly protrudes above the surface of the first electrode layer that is closer to the orientation control layer. Even if it protrudes, the amount of protrusion is smaller than 2 nm. Therefore, as described above, the orientation control layer is likely to be oriented along the (100) or (001) plane.

According to the 15th invention, in the 2nd invention, the first electrode is made of a noble metal containing at least one substance selected from the group consisting of Mn, Fe, Co, Ni, Mg, Ca, Sr, Ba, Al, and oxides of these elements.

Specifically, the substance, such as Mn, contained in the noble metal functions in the same manner as titanium or titanium oxide, whereby it is possible to preferentially orient the orientation control layer along the (100) or (001) plane easily and reliably.

According to the 16th invention, in the 15th invention, the noble metal of the first electrode layer is at least one element selected from the group consisting of platinum, iridium, palladium and ruthenium, and the content of the substance which is contained in the noble metal is greater than zero and less than or equal to 30 mol %.

Then, effects similar to those of the 13th invention are attained.

According to the 17th invention, in the 15th invention, the substance contained in the noble metal of the first electrode layer and existing at a surface of the first electrode layer that is closer to the orientation control layer protrudes less than 2 nm from the surface.

Then, effects similar to those of the 14th invention are attained.

According to the 18th invention, in the 3rd invention, the degree of (111) orientation of the orientation control layer is 50% or more.

Then, the degree of (111) orientation of the piezoelectric layer is easily and reliably set to 80% or more, whereby the piezoelectric characteristics are improved while high stability is provided. On the other hand, as described above, if the orientation control layer has a thickness of 8 nm or smaller, the degree of (111) orientation is easily set to 50% or more, even if the first electrode layer contains a substance such as titanium.

According to the 19th invention, in the 1st invention, the first electrode layer is formed on a substrate, and an adhesive layer for improving adhesion between the substrate and the first electrode layer is provided between the substrate and the first electrode layer.

With such a feature, the adhesion between the substrate and the first electrode layer is further improved, and accordingly, peeling off during the manufacture of the piezoelectric element is surely prevented.

The 20th invention is directed to an ink jet head including: a piezoelectric element in which a first electrode layer, an orientation control layer, a piezoelectric layer and a second electrode layer are layered in this order; a vibration layer provided on one surface of the piezoelectric element that is closer to the second electrode layer; and a pressure chamber member bonded to one surface of the vibration layer that is away from the piezoelectric element and including a pressure chamber for storing ink therein, in which the vibration layer is displaced in a thickness direction by a piezoelectric effect of the piezoelectric layer of the piezoelectric element so as to discharge the ink out of the pressure chamber.

In this invention, the orientation control layer of the piezoelectric element is made of a cubic or tetragonal perovskite oxide; the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from 1/50 to 1/14.

According to this invention, the first electrode layer, the orientation control layer, the piezoelectric layer, the second electrode layer, and the vibration layer are formed in this order on a substrate by a sputtering method, or the like. The pressure chamber member is then bonded to the vibration layer, and thereafter, the substrate is removed. As a result, an ink jet head including a piezoelectric element which has a similar structure to that of the 1st invention is obtained easily. Even if this ink jet head is driven continuously for a long time, the occurrence of cracks in the piezoelectric layer of the piezoelectric element is suppressed. Thus, an ink jet head having a desirable durability with a small deviation in the ink-discharge performance is obtained.

The 21st invention is directed to an ink jet head including: a piezoelectric element in which a first electrode layer, an orientation control layer, a piezoelectric layer and a second electrode layer are layered in this order; a vibration layer provided on one surface of the piezoelectric element that is closer to the first electrode layer; and a pressure chamber member bonded to one surface of the vibration layer that is away from the piezoelectric element and including a pressure chamber for storing ink therein, in which the vibration layer is displaced in a thickness direction by a piezoelectric effect of the piezoelectric layer of the piezoelectric element so as to discharge the ink out of the pressure chamber.

The orientation control layer of the piezoelectric element is made of a cubic or tetragonal perovskite oxide; the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from 1/50 to 1/14.

According to this invention, the pressure chamber member is used as a substrate, and the vibration layer, the first electrode layer, the orientation control layer, the piezoelectric layer and the second electrode layer are formed on the pressure chamber member in this order by a sputtering method, or the like, whereby an ink jet head having effects similar to those of the 20th invention is obtained.

The 22nd invention is directed to an angular velocity sensor including a substrate including a fixed portion and at least a pair of vibrating portions extending from the fixed portion in a predetermined direction, in which a first electrode layer, an orientation control layer, a piezoelectric layer and a second electrode layer are layered in this order at least on each of the vibrating portions of the substrate, and the second electrode layer on each of the vibrating portions is patterned into at least one driving electrode for vibrating the vibrating portion in a width direction thereof and at least one detection electrode for detecting a displacement of the vibrating portion in a thickness direction thereof.

According to the invention, the orientation control layer is made of a cubic or tetragonal perovskite oxide; the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from 1/50 to 1/14.

According to this invention, each vibrating portion of the substrate is vibrated in the width direction thereof by applying a voltage between the driving electrode of the second electrode layer and the first electrode layer. When the vibrating portion deforms in the thickness direction due to the Coriolis force while it is being vibrated, a voltage is generated between the detection electrode of the second electrode layer and the first electrode layer, whereby the angular velocity can be calculated based on the magnitude of the voltage (the Coriolis force). The portion for detecting the angular velocity (the vibrating portion) is a piezoelectric element having a structure similar to that of the 1st invention. Therefore, the piezoelectric constant can be increased to be about 40 times as large as that of a conventional angular velocity sensor using quartz, and thus the size thereof can be reduced significantly. Moreover, even if the angular velocity sensors are mass-produced industrially, it is possible to obtain angular velocity sensors with a high characteristics reproducibility and a small characteristics deviation, and with a high breakdown voltage and a high reliability.

The 23rd invention is directed to an ink jet recording apparatus including an ink jet head including: a piezoelectric element in which a first electrode layer, an orientation control layer, a piezoelectric layer and a second electrode layer are layered in this order; a vibration layer provided on one surface of the piezoelectric element that is closer to the second electrode layer; and a pressure chamber member bonded to one surface of the vibration layer that is away from the piezoelectric element and including a pressure chamber for storing ink therein, the ink jet head being capable of being relatively moved with respect to a recording medium, in which while the ink jet head is moved with respect to the recording medium, the vibration layer is displaced in a thickness direction by a piezoelectric effect of the piezoelectric layer of the piezoelectric element in the ink jet head so as to discharge the ink out of the pressure chamber through a nozzle hole communicated to the pressure chamber onto the recording medium, thereby recording information.

In this invention, the orientation control layer of the piezoelectric element of the ink jet head is made of a cubic or tetragonal perovskite oxide; the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from 1/50 to 1/14.

The 24th invention is directed to an ink jet recording apparatus including an ink jet head including: a piezoelectric element in which a first electrode layer, an orientation control layer, a piezoelectric layer and a second electrode layer are layered in this order; a vibration layer provided on one surface of the piezoelectric element that is closer to the first electrode layer; and a pressure chamber member bonded to one surface of the vibration layer that is away from the piezoelectric element and including a pressure chamber for storing ink therein, the ink jet head being capable of being relatively moved with respect to a recording medium, in which while the ink jet head is moved with respect to the recording medium, the vibration layer is displaced in a thickness direction by a piezoelectric effect of the piezoelectric layer of the piezoelectric element in the ink jet head so as to discharge the ink out of the pressure chamber through a nozzle hole communicated to the pressure chamber onto the recording medium, thereby recording information.

The orientation control layer of the piezoelectric element of the ink jet head is made of a cubic or tetragonal perovskite oxide; the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from $\frac{1}{50}$ to $\frac{1}{14}$.

With the 23rd and 24th inventions, it is possible to easily obtain a recording apparatus that provides a quite desirable printing performance and durability.

BRIEF DESCRIPTION OF THE DRAWINGS

FIGS. 12A through 12C illustrate a deposition step, a step of forming pressure chamber cavities, and an adhesive application step, respectively, in a method for manufacturing the ink jet head of FIG. 9.

FIGS. 13A and 13B illustrate a step of bonding a substrate after the deposition process and the pressure chamber member to each other, and a step of forming vertical walls, respectively, in the method for manufacturing the ink jet head of FIG. 9.

FIGS. 15A and 15B illustrate a step of dividing an orientation control layer and a piezoelectric layer, and a step of cutting off a substrate (for forming the pressure chamber member), respectively, in the method for manufacturing the ink jet head of FIG. 9.

DESCRIPTION OF THE PREFERRED EMBODIMENTS

Hereinafter, embodiments of the present invention will be described with reference to the accompanying drawings.

Embodiment 1

Figure 1:
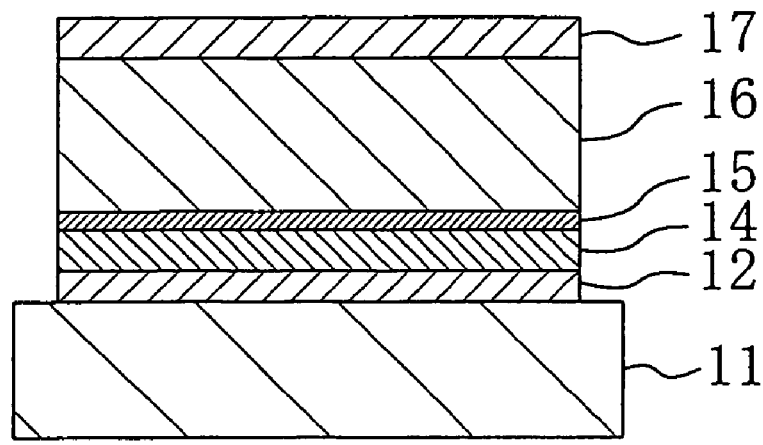
FIG. 1 is a cross-sectional view illustrating a piezoelectric element according to an embodiment of the present invention.

FIG. 1 illustrates a piezoelectric element according to an embodiment of the present invention. In the figure, the reference numeral 11 denotes a substrate made of a 4-inch silicon (Si) wafer having a thickness of 0.3 mm, and an adhesive layer 12 made of titanium (Ti) and having a thickness of 0.02 μm is formed on the substrate 11. Note that the substrate 11 is not limited to an Si substrate, but may alternatively be a glass substrate, a metal substrate, a ceramic substrate, or the like.

A first electrode layer 14 having a thickness of 0.22 μm and made of platinum (Pt) containing 2.1 mol % of Ti is formed on the adhesive layer 12. The first electrode layer 14 is oriented along the (111) plane.

An orientation control layer 15 made of PLT having a cubic or tetragonal perovskite crystalline structure whose lanthanum (La) content is 12 mol % and whose lead content is 8 mol % in excess of the stoichiometric composition is formed on the first electrode layer 14. The orientation control layer 15 is preferentially oriented along the (100) or (001) plane, and has a thickness of 0.03 μm.

Formed on the orientation control layer 15 is a piezoelectric layer 16 made of lead zirconate titanate to which a Pb-containing complex perovskite compound expressed by the chemical formula $Pb(A_aB_b)O_3 (0<a<1, 0<b<1, a+b=1)$ has been added in an amount that is from 1 mol % to 50 mol %. The piezoelectric layer 16 has a rhombohedral or tetragonal crystalline structure preferentially oriented along the (001) plane. By setting the Pb-containing complex perovskite compound content from 1 mol % to 50 mol %, a high piezoelectric constant is obtained. If the content is set from 10 mol % to 25 mol %, in particular, a quite high piezoelectric constant is achieved, leading to very excellent piezoelectric characteristics.

In this embodiment, in the chemical formula of the Pb-containing complex perovskite compound, the element A is Mg, the element B is Nb, the value of a is ⅓, and the value of b is 2/3. That is, the piezoelectric layer 16 is made of $0.8PZT-0.2Pb(Mg_{1/3}Nb_{2/3})O_3$, which is obtained by adding $Pb(Mg_{1/3}Nb_{2/3})O_3$ (PMN) to PZT. The composition of the PZT material is a composition (Zr/Ti 55/45) which is near the boundary between being tetragonal and being rhombohedral (i.e., the morphotropic phase boundary), and the piezoelectric layer 16 has a thickness of 3 μm.

The Pb-containing complex perovskite compound is not limited to $Pb(Mg_{1/3}Nb_{2/3})O_3$, but the elements A and B and the values of a and b in the chemical formula may be as follows. The element A may be at least one element selected from the group consisting of Mg, Mn, Ni, Co, Zn, and Cd and the element B may be Nb, while a=⅓ and b=⅔.

Alternatively, the element A may be at least one element selected from the group consisting of Mg, Mn, and Ni and the element B may be Ta or Sb, while a=⅓ and b=⅔.

Alternatively, the element A may be at least one element selected from the group consisting of Fe, Cr, In, Y, Sb and Mn, and the element B may be Nb, while a=½ and b=½.

Alternatively, the element A may be at least one element selected from the group consisting of Fe, Cr, and Mn, and the element B may be Ta, while a=½ and b=½.

Alternatively, the element A may be at least one element selected from the group consisting of Mn, Ni, Co, Mg and Zn and the element B may be Te or W, while a=½ and b=½.

The composition of the PZT is not limited to Zr/Ti=55/45, but may be any other suitable composition so long as it is in the range of 30/70 to 70/30, and also may be those obtained by further adding an additive such as Sr, Nb, or Al to PZT to which a Pb-containing complex perovskite compound has been added. Furthermore, the piezoelectric layer 16 may have any thickness so long as it is in the range of 0.5 to 5.0 μm.

A second electrode layer 17 having a thickness of 0.2 μm and made of Pt is formed on the piezoelectric layer 16. Note that the material of the second electrode layer 17 is not limited to Pt as long as it is a conductive material, and the thickness thereof is not limited to any particular thickness as long as it is in the range of 0.1 to 0.4 μm.

The piezoelectric element is obtained by depositing the adhesive layer 12, the first electrode layer 14, the orientation control layer 15, the piezoelectric layer 16 and the second electrode layer 17 in this order on the substrate 11 by a sputtering method. Note that the deposition method is not limited to a sputtering method, but may alternatively be any other suitable deposition method as long as a crystalline thin film is directly formed without the crystallization step using a heat treatment (e.g., a CVD method). Moreover, the deposition method for the adhesive layer 12 and the second electrode layer 17 may be a sol-gel method, or the like.

The adhesive layer 12 is provided for improving the adhesion between the substrate 11 and the first electrode layer 14. The material of the adhesive layer 12 is not limited to Ti, but may alternatively be tantalum, iron, cobalt, nickel, chromium, or a compound thereof (including Ti). Moreover, the thickness thereof is not limited to any particular thickness as long as it is in the range of 0.005 to 1 μm. The adhesive layer 12 is not always necessary. Even if the first electrode layer 14 is formed directly on the substrate 11, the adhesion between the substrate 11 and the first electrode layer 14 is quite desirable because Ti is contained in the first electrode layer 14.

The first electrode layer 14 not only functions as an electrode, but also functions to preferentially orient the orientation control layer 15 along the (100) or (001) plane because the first electrode layer 14 contains Ti. Titanium oxide may be contained in place of Ti. The amount of titanium or titanium oxide to be contained is preferably greater than zero and less than or equal to 30 mol %. Moreover, the material of the first electrode layer 14 may be at least one noble metal selected from the group consisting of Pt, iridium, palladium and ruthenium, and the thickness thereof is not limited to any particular thickness as long as it is in the range of 0.05 to 2 μm. Titanium or titanium oxide existing at a surface of the first electrode layer 14 that is closer to the orientation control layer 15 is intended to be contained in the first electrode layer 14, but is not intended to be provided above the surface of the first electrode layer 14. Thus, the titanium or titanium oxide hardly protrudes above the surface of the first electrode layer 14 that is closer to the orientation control layer 15. Even if it protrudes, the amount of protrusion is smaller than 2 nm.

As described above, it is preferable that the first electrode layer 14 contain titanium or titanium oxide, but the first electrode layer 14 may alternatively contain at least one substance selected from the group consisting of titanium, aluminum, iron, cobalt, nickel, manganese, copper, magnesium, calcium, strontium, barium, and oxides of these elements, and the amount of the substance to be contained is preferably greater than zero and not more than 30 mol %.

The orientation control layer 15 is provided for improving the crystallinity and the (001) orientation property of the piezoelectric layer 16. For this purpose, the orientation control layer 15 is made of PLT, which contains La and contains no Zr and whose lead content is in excess of the stoichiometric composition. Note that in order to improve the crystallinity and the orientation of the piezoelectric layer 16, the La content thereof may be greater than zero and less than or equal to 25 mol %, and the lead content thereof may be in excess of the stoichiometric composition by an amount greater than zero and less than or equal to 30 mol %. Moreover, the material of the orientation control layer 15 is not limited to PLT as described above, but may alternatively be PLZT obtained by adding zirconium to PLT, or may be a material obtained by adding at least one of magnesium and manganese to PLT or PLZT. The zirconium content is preferably less than or equal to 20 mol %, and when at least one of magnesium and manganese is added, the total amount thereof to be added is preferably greater than zero and less than or equal to 10 mol % (the amount of one of magnesium and manganese may be zero). The thickness of the orientation control layer 15 is not limited to any particular thickness as long as it is in the range of 0.01 to 0.2 µm.

Figure 2:
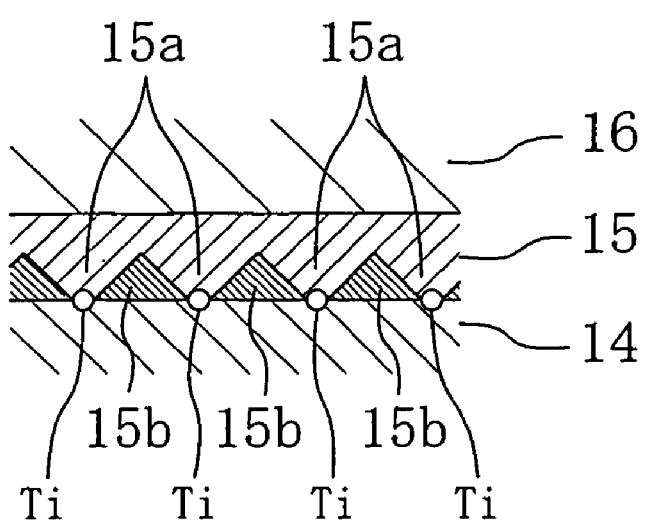
FIG. 2 is an enlarged cross-sectional view schematically illustrating the structure of an orientation control layer.

In the vicinity of one surface of the orientation control layer 15 that is closer to the first electrode layer 14, a (100)- or (001)-oriented region 15a extends over titanium (exactly speaking, this is titanium oxide in the case where titanium oxide is contained in the first electrode layer 14, but even in the case where titanium is contained in the first electrode layer 14, this may sometimes be titanium oxide because of oxidation) located on one surface of the first electrode layer 14 that is closer to the orientation control layer 15, as illustrated in FIG. 2, so that the cross-sectional area of the region 15a in the direction perpendicular to the thickness direction gradually increases in the direction away from the first electrode layer 14 toward the piezoelectric layer 16. On the other hand, since the first electrode layer 14 is oriented along the (111) plane, each region 15b of the orientation control layer 15, which is located over a portion of the surface of the first electrode layer 14 where none of titanium and titanium oxide exist, is not oriented along the (100) or (001) plane, but is oriented along the (111) plane in the present embodiment (the region 15b may be oriented in a direction other than along the (111) plane or may be amorphous depending on the material of the first electrode layer 14). Such a region 15b that is not oriented along the (100) or (001) plane extends only within a distance of about 20 nm at maximum from the surface of the orientation control layer 15 that is closer to the first electrode layer 14. If the thickness of the orientation control layer 15 is 0.02 µm or more, the (100)- or (001)-oriented region 15a extends substantially across the entire surface of the orientation control layer 15 that is closer to the piezoelectric layer 16.

The piezoelectric layer 16 is preferentially oriented along the (001) plane by the orientation control layer 15, and the degree of (001) orientation, α, of the piezoelectric layer 16 is 90% or more. The crystal grains of the piezoelectric layer 16 are columnar grains which extend in the thickness direction of the piezoelectric layer 16 and in which the ratio of the average cross-sectional diameter to the length (average cross-sectional diameter/length) is from 1/50 to 1/14.

Note that it is not necessary that the region 15a extends substantially across the entire surface of the orientation control layer 15 that is closer to the piezoelectric layer 16. The region 15b that is not oriented along the (100) or (001) plane may partially exist on that surface due to the fairly small thickness of the orientation control layer 15. However, even in such a case, if the thickness of the orientation control layer 15 is 0.01 µm or more, a (100)- or (001)-oriented region extends across a major portion of the surface of the orientation control layer 15 that is closer to the piezoelectric layer 16, with the degree of (001) orientation of the piezoelectric layer 16 being as high as 90% or more.

Next, a method for manufacturing a piezoelectric element as described above will be described.

The adhesive layer 12, the first electrode layer 14, the orientation control layer 15, the piezoelectric layer 16 and the second electrode layer 17 are deposited in this order on the Si substrate 11 by a sputtering method.

The adhesive layer 12 is obtained by using a Ti target and applying a high-frequency power of 100 W thereto for 1 minute while heating the substrate 11 to 400° C. in an argon gas at 1 Pa.

The first electrode layer 14 is obtained by using a Ti target and a Pt target and applying high-frequency powers of 85 W and 200 W thereto for 12 minutes while heating the substrate 11 to 400° C. in an argon gas at 1 Pa, using a multi-target sputtering apparatus. Titanium exists in a dotted pattern on one surface of the obtained first electrode layer 14 that is away from the adhesive layer 12.

The gas used for forming the first electrode layer 14 by the sputtering method may be only an argon gas as described above, or may be a mixed gas of argon and oxygen. In the case where the argon gas is solely used, titanium on the surfaces of the first electrode layer 14 is not oxidized. In the case where the mixed gas of argon and oxygen is used, the titanium is oxidized to become titanium oxide. In the case where the mixed gas of argon and oxygen is used, the temperature of the substrate 11 is desirably set to 650° C. or lower. This is because, if the temperature of the substrate 11 is higher than 650° C., not only titanium but also the surface of a noble metal is slightly oxidized, and accordingly, the crystallinity and the orientation of the orientation control layer 15 formed above the substrate 11 may be adversely influenced.

The orientation control layer 15 is obtained by using a sinter target prepared by adding a 12 mol % excess of lead oxide (PbO) to PLT containing 14 mol % of lanthanum and applying a high-frequency power of 300 W thereto for 12 minutes while heating the substrate 11 to 600° C. in a mixed atmosphere of argon and oxygen (gas volume ratio: $Ar:O_2=19:1$) at a degree of vacuum of 0.8 Pa.

The oxygen partial pressure in the mixed gas of argon and oxygen which is used for forming the orientation control layer 15 by the sputtering method is preferably greater than 0% and less than or equal to 10%. This is because the crystallinity of the orientation control layer 15 deteriorates in an environment where no oxygen exists. If the oxygen partial pressure is higher than 10%, the orientation of the (100) or (001) plane deteriorates. Further, the degree of vacuum is preferably 0.05 Pa or higher and 5 Pa or lower. This is because, if the degree of vacuum is lower than 0.05 Pa, the crystallinity of the orientation control layer 15 becomes non-uniform. If the degree of vacuum is higher than 5 Pa, the orientation of the (100) or (001) plane deteriorates.

When forming the orientation control layer 15 by the sputtering method, the temperature of the substrate 11 is desirably set to 450° C. or higher and 750° C. or lower. This is because, if the temperature of the substrate 11 is lower than 450° C., the crystallinity of the orientation control layer 15 deteriorates, and pyrochlore is more likely to be generated. If the temperature of the substrate 11 is 750° C. or higher, Pb contained in the film of the orientation control layer 15 evaporates during the formation of the film, so that the orientation control layer 15 lacks Pb. As a result, the crystallinity of the orientation control layer 15 deteriorates.

More preferably, the oxygen partial pressure is set to 0.5% or higher and 10% or lower, the degree of vacuum is set to 0.1 Pa or higher and 2 Pa or lower, and the temperature of the substrate 11 is 500° C. or higher and 650° C. or lower.

In the case of forming the orientation control layer 15 according to the above conditions, the orientation control layer 15 grows using titanium, which exists in a dotted pattern on one surface of the first electrode layer 14 that is closer to the orientation control layer 15, as a nucleus, whereby the orientation control layer 15 is likely to be oriented along the (100) or (001) plane over the titanium. Since, as described above, the titanium hardly protrudes above the surface of the first electrode layer 14 (even if it protrudes, the amount of protrusion is smaller than 2 nm), the orientation control layer 15 is more likely to be oriented along the (100) or (001) plane. On the other hand, since the first electrode layer 14 is oriented along the (111) plane, regions of the orientation control layer 15 located over portions of the surface of the first electrode layer 14 where titanium does not exist are not oriented along the (100) or (001) plane (but is oriented along the (111) plane in the present embodiment). As the crystal growth process proceeds, these regions gradually shrink, while the (100)- or (001)-oriented region gradually expands. As a result, in the vicinity of the first electrode layer 14, the orientation control layer 15 has the (100)- or (001)-oriented region 15a (over titanium located on one surface of the first electrode layer 14 that is closer to the orientation control layer 15) and the region 15b that is not oriented along the (100) or (001) plane (over portions of the surface of the first electrode layer 14 where titanium does not exist), as described above. The cross-sectional area of the (100)- or (001)-oriented region 15a increases in the direction away from the first electrode layer 14 toward the other side (i.e., toward the piezoelectric layer 16). At the surface of the orientation control layer 15 that is closer to the piezoelectric layer 16, the (100)- or (001)-oriented region 15a extends substantially across the entire surface of the orientation control layer 15. In the case where the zirconium content is set to 20 mol % or less, and the lanthanum content is set to greater than 0 and less than or equal to 25 mol %, the crystallinity and the orientation of the orientation control layer 15 are significantly improved. Especially as the zirconium content decreases, a layer of a low crystallinity made of a Zr oxide is less likely to be formed in the initial period of the crystal growth process. As a result, deterioration in the crystallinity is surely suppressed.

The piezoelectric layer 16 is obtained by using a sinter target of $0.8PZT(Zr/Ti=55/45)-0.2Pb(Mg_{1/3}Nb_{2/3})O^3$ to which a 15 mol % excess of PbO has been added, and applying a high-frequency power of 250 W thereto for 3 hours while heating the substrate 11 to 610° C. in a mixed atmosphere of argon and oxygen (gas volume ratio: $Ar:O_2=19:1$) at a degree of vacuum of 0.3 Pa.

The oxygen partial pressure in the mixed gas of argon and oxygen which is set for forming the piezoelectric layer 16 by the sputtering method is preferably greater than 0% and less than or equal to 30%. This is because the crystallinity of the piezoelectric layer 16 deteriorates in an environment where no oxygen exists. If the oxygen partial pressure is higher than 30%, the orientation of the (001) plane deteriorates. Further, the degree of vacuum is preferably 0.1 Pa or higher and 1 Pa or lower. This is because, if the degree of vacuum is lower than 0.1 Pa, the crystallinity and the piezoelectric characteristics of the piezoelectric layer 16 become non-uniform. If the degree of vacuum is higher than 1 Pa, the orientation of the (001) plane deteriorates.

As described above, if the oxygen partial pressure is greater than 0% and less than or equal to 30% and the degree of vacuum is 0.1 Pa or higher and 1 Pa or lower, the crystal grains of the piezoelectric layer 16 easily become columnar grains which extend in the thickness direction of the piezoelectric layer 16 and in which the ratio of the average cross-sectional diameter to the length is from 1/50 to 1/14. In an environment where no oxygen exists, the ratio of the average cross-sectional diameter to the length is likely to exceed 1/14. On the other hand, if the oxygen partial pressure exceeds 30%, the ratio of the average cross-sectional diameter to the length is likely to be smaller than 1/50, because crystal grains having multiple crystal orientations are mixed, making it difficult for each crystal grain to sufficiently grow in the thickness direction of the piezoelectric layer 16. Furthermore, if the degree of vacuum is lower than 0.1 Pa, the ratio of the average cross-sectional diameter to the length is likely to be greater than 1/14, and if the degree of vacuum exceeds 1 Pa, the ratio of the average cross-sectional diameter to the length is likely to be smaller than 1/50, as in the case where the oxygen partial pressure exceeds 30%.

The temperature of the substrate 11 which is selected for forming the piezoelectric layer 16 by the sputtering method is preferably 450° C. or higher and 750° C. or lower. This is because, if the temperature of the substrate 11 is lower than 450° C., the crystallinity of the piezoelectric layer 16 deteriorates, and pyrochlore is more likely to be generated. If the temperature of the substrate 11 is higher than 750° C., Pb contained in the film of the piezoelectric layer 16 evaporates during the formation of the film, so that the piezoelectric layer 16 lacks Pb. As a result, the crystallinity of the piezoelectric layer 16 deteriorates.

More preferably, the oxygen partial pressure is set to 1% or higher and 10% or lower, the degree of vacuum is set to 0.15 Pa or higher and 0.8 Pa or lower, and the temperature of the substrate 11 is 525° C. or higher and 625° C. or lower.

In the case of forming the piezoelectric layer 16 according to the above conditions, since the surface of the orientation control layer 15 that is closer to the piezoelectric layer 16 is oriented along the (100) or (001) plane, the piezoelectric layer 16 is oriented along the (001) plane (herein Zr/Ti=55/45, and thus the crystal is rhombohedral; since the (100) plane and the (001) plane are the same in a rhombohedral system, the rhombohedral (100) orientation is included herein), whereby the degree of (001) orientation thereof (the degree of (100) orientation of the rhombohedral system) is 90% or more. Moreover, since the orientation control layer 15 has a desirable crystallinity, the piezoelectric layer 16 also has a desirable crystallinity. Furthermore, the crystal grains of the piezoelectric layer 16 become columnar grains which extend in the thickness direction of the piezoelectric layer 16 and in which the ratio of the average cross-sectional diameter to the length is from 1/50 and to 1/14. Then, even if the piezoelectric element is driven continuously, stress in the piezoelectric layer 16 is relaxed appropriately, whereby cracks are less likely to occur in the piezoelectric layer 16.

The second electrode layer 17 is obtained by using a Pt target and applying a high-frequency power of 200 W thereto for 10 minutes at a room temperature in an argon gas at 1 Pa.

Thus, in the piezoelectric element of the present embodiment, the piezoelectric layer 16 having a desirable crystallinity and a desirable orientation can be obtained by depositing it by a sputtering method on the inexpensive silicon substrate 11, without using an expensive MgO single-crystal substrate. Therefore, it is possible to suppress the deviation in the piezoelectric characteristics of the piezoelectric element while reducing the manufacturing cost. Moreover, a layer of a low crystallinity made of a Zr oxide is less likely to be formed, whereby it is possible to increase the breakdown voltage of the piezoelectric element. In addition, the crystal grains of the piezoelectric layer 16 are columnar grains which extend in the thickness direction of the piezoelectric layer 16 and in which the ratio of the average cross-sectional diameter to the length is from 1/50 to 1/14. Therefore, even if the piezoelectric element is driven continuously, stress in the piezoelectric layer 16 is relaxed appropriately, whereby it is possible to suppress occurrence of cracks in the piezoelectric layer 16.

Next, specific examples of the present invention will be described. In each of the following examples, a structure in which an adhesive layer, a first electrode layer, an orientation control layer, a piezoelectric layer, and a second electrode layer are formed on a substrate in this order (except that an adhesive layer is not formed in Example 5) is the same as that described in Embodiment 1.

EXAMPLE 1

A piezoelectric element of Example 1 was produced by using the same material, thickness and manufacturing method for each film as those of Embodiment 1 described above. No crack or peeling off was observed for any of the films of the piezoelectric element of Example 1 immediately after its production.

The crystal orientation and the film composition of the piezoelectric layer before the formation of the second electrode layer were examined. Specifically, an analysis by an X-ray diffraction method showed that the piezoelectric layer had a (100)-oriented rhombohedral perovskite crystalline structure (degree of (100) orientation: α=97%). Moreover, an analysis of the composition of the piezoelectric layer with an X-ray microanalyzer showed that the Zr/Ti ratio was 55/45 as in the target composition and the Mg/Nb ratio was 33/67.

Figure 3:
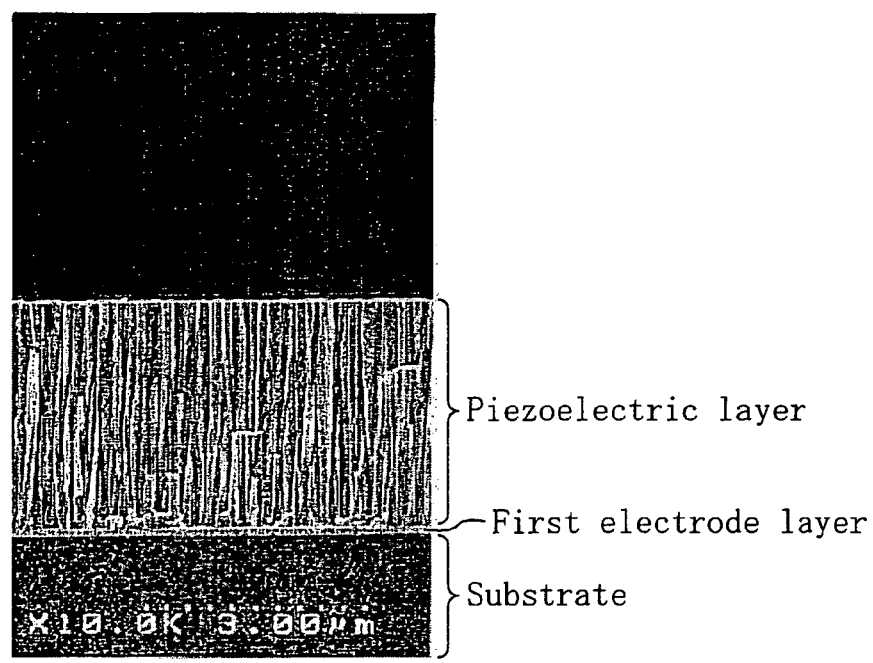
FIG. 3 is a photograph, taken using a scanning electron microscope, which shows a cross-sectional view of a piezoelectric element according to Example 1 of the present invention.

Furthermore, the crystalline structure of the piezoelectric layer was analyzed using a scanning electron microscope (SEM). The analysis results are shown in FIG. 3. In FIG. 3 (photograph), it is not possible to distinguish the adhesive layer and the orientation control layer, because their thicknesses are very small. The analysis results showed the features of the piezoelectric layer; the crystalline structure of the piezoelectric layer was a well developed columnar structure and the crystal grains thereof were columnar grains that extended in the thickness direction of the piezoelectric layer, with the length of the crystal grains being considerably greater than the average cross-sectional diameter thereof (that is, the value of the ratio of the average cross-sectional diameter to the length was quite small). In the SEM cross-sectional photograph shown in FIG. 3, the value of the ratio of the average cross-sectional diameter of the crystal grains to the length thereof is about 1/30.

From a durability test described below, it became clear that the value of the ratio of the average cross-sectional diameter of the crystal grains extending in the thickness direction of the piezoelectric layer to the length thereof significantly affected the reliability of the piezoelectric element. Specifically, film deposition conditions (mainly, oxygen partial pressure and the degree of vacuum) for forming piezoelectric layers were changed, whereby the above-mentioned ratio value was varied in the range of 1/100 to 1/2, thereby fabricating piezoelectric elements including the piezoelectric layers having those different ratio values. Ink jet heads (with the same structure as the ink jet head of Embodiment 3, which will be described later) that include those piezoelectric elements were subjected to a durability test (driving frequency=20 kHz, driving voltage=20 V) to examine crack occurrence rates (i.e., the number of pressure chambers having ink-discharge defects against the total number of pressure chambers) in the piezoelectric layers. The results were as shown in Table 1.

TABLE 1

| Average cross-sectional diameter of piezoelectric-layer crystal grains/length | Crack occurrence rate (%) |
|---|---|
| 1/100 | 5.1 |
| 1/70 | 4.0 |
| 1/50 | 0 |
| 1/30 | 0 |
| 1/14 | 0 |
| 1/10 | 2.8 |
| 1/5 | 4.5 |
| 1/2 | 6.1 |

The results of the durability test showed that when the value of the ratio of the average cross-sectional diameter of the crystal grains extending in the thickness direction of the piezoelectric layer to the length thereof was from 1/50 to 1/14, no cracks occurred in the piezoelectric layers, and that when the value of the ratio was not in the range of 1/50 to 1/14, cracks occurred in the piezoelectric layers. This is presumably because when the value of the ratio of the average cross-sectional diameter of the crystal grains to the length thereof is from 1/50 to 1/14, a stress in the piezoelectric layer produced when the piezoelectric element is driven is relaxed appropriately at the grain boundaries, while the strength of the adhesion to the orientation control layer and the second electrode layer increases.

Then, the crystal orientation and the film composition of the first electrode layer before the formation of the orientation control layer were examined. Specifically, an analysis by an X-ray diffraction method showed that the Pt film was oriented along the (111) plane. Moreover, an analysis of the composition at a depth of 5 nm from the surface with X-ray photoelectron spectroscopy (XPS) showed that the Ti content was 2.1 mol %.

Then, the crystal orientation and the film composition of the orientation control layer before the formation of the piezoelectric layer were examined. The PLT film of the orientation control layer had a (100)-oriented perovskite crystalline structure. Note that a (111)-oriented region was observed on one side of the orientation control layer that is closer to the first electrode layer. It is believed that the (111)-oriented region exists over a portion of the surface of the first electrode layer where titanium does not exist. Moreover, a composition analysis with an X-ray microanalyzer showed that 12 mol % of lanthanum was contained, and an 8 mol % excess of Pb was contained.

Next, before the formation of the second electrode layer, 100 cantilevers having a size of 15 mm×2 mm were cut out by dicing. Then, the second electrode layer having a thickness of 0.2 μm was formed thereon by a sputtering method, and the piezoelectric constant $d_{31}$ was measured (see, for example, Japanese Unexamined Patent Publication No. 2002-225285 for the method for measuring the piezoelectric constant $d_{31}$). The average piezoelectric constant of the 100 cantilevers was −218 pC/N (deviation: σ=4.0%).

Then, the second electrode layer of the piezoelectric element was formed as 65 pieces of Pt film each having a size of 1 mm×1 mm and a thickness of 0.2 μm and arranged at an interval of 10 mm by a sputtering method using a metal mask. The breakdown voltage was measured by applying a voltage between each second electrode layer and the first electrode layer. Note that the breakdown voltage value was defined to be the value of the applied voltage for which the current value was 1 μA. As a result, the average breakdown voltage value was 108 V (deviation: σ=4.2%).

Next, the elements A and B in 0.8PZT(Zr/Ti=55/45)–0.2Pb(A$_{1/3}$B$_{2/3}$)O$_3$ were changed as shown in Table 2 to examine the degree of (100) orientation, the piezoelectric constant d$_{31}$, and the breakdown voltage. The results were as shown in Table 2.

TABLE 2

| A | B | Degree of (100) orientation (%) | d$_{31}$(pC/N) | Breakdown voltage (V) |
|---|---|---|---|---|
| Mg | Nb | 97 | −218 | 108 |
| Mn | Nb | 96 | −205 | 106 |
| Ni | Nb | 98 | −212 | 107 |
| Co | Nb | 92 | −185 | 101 |
| Cd | Nb | 91 | −183 | 100 |
| Mn | Sb | 90 | −178 | 102 |
| Mn | Ta | 92 | −180 | 103 |
| Mg | Ta | 94 | −193 | 100 |
| Ni | Ta | 93 | −192 | 101 |

From the results, it can be said that the degree of (100) orientation is greater than or equal to 90% and the piezoelectric constant d$_{31}$ and the breakdown voltage are quite favorable in all of the cases.

Figure 4:
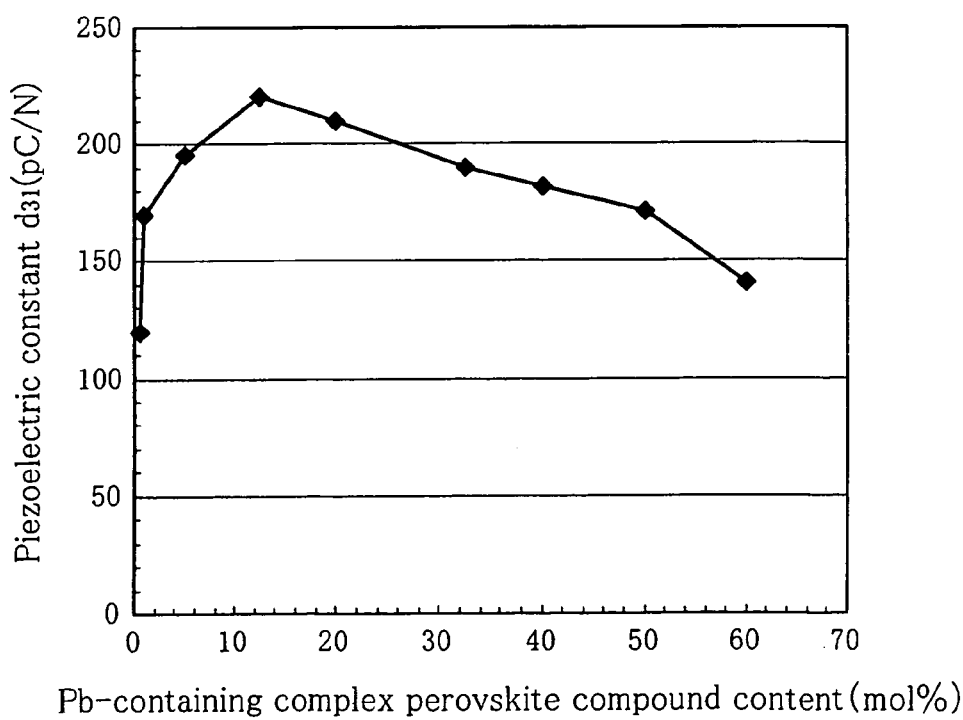
FIG. 4 is a graph indicating the relation between Pb-containing complex perovskite compound content and piezoelectric constant $d_{31}$ in a piezoelectric layer in Example 1.

FIG. 4 indicates the relation between the Pb-containing complex perovskite compound content and the piezoelectric constant d$_{31}$ in the piezoelectric layer in Example 1. From FIG. 4, it is found that in the case of the piezoelectric material in which Pb(Mg$_{1/3}$Nb$_{2/3}$)O$_3$ has been added to PZT (Zr/Ti=55/45), the piezoelectric constant d$_{31}$ exhibits a value as high as or higher than 170 pc/N when the Pb-containing complex perovskite compound content is from 1 mol % to 50 mol %. In this piezoelectric material, particularly when the Pb-containing complex perovskite compound content is from 10 mol % to 25 mol %, the piezoelectric constant d$_{31}$ is 200 pc/N or higher, meaning that quite favorable piezoelectric characteristics are obtained.

EXAMPLE 2

In Example 2, a 4-inch stainless steel (SUS304) having a thickness of 0.25 mm was used as the substrate, a tantalum (Ta) film having a thickness of 0.01 μm was used as the adhesive layer, a Pt film having a thickness of 0.25 μm and containing 8 mol % of titanium oxide was used as the first electrode layer, a PLT film (to which 3 mol % of magnesium was added) having a thickness of 0.03 μm and containing 17 mol % of lanthanum in which the lead content was 6 mol % in excess of the stoichiometric composition was used as the orientation control layer, a 0.8PZT (Zr/Ti=40/60)–0.2Pb (Mg$_{1/3}$Nb$_{2/3}$)O$_3$ film having a thickness of 2.7 μm was used as the piezoelectric layer, and a Pt film having a thickness of 0.1 μm was used as the second electrode layer.

The adhesive layer was obtained by using a Ta target and applying a high-frequency power of 100 W thereto for 1 minute while heating the substrate to 500° C. in an argon gas at 1 Pa.

The first electrode layer was obtained by using a Ti target and a Pt target and applying high-frequency powers of 120 W and 200 W thereto, respectively, for 12 minutes while heating the substrate to 400° C. in a mixed atmosphere of argon and oxygen at 1 Pa (gas volume ratio: Ar:O$_2$=15:1), using a multi-target sputtering apparatus.

The orientation control layer was obtained by using a sinter target, which was prepared by adding 3 mol % of magnesium and a 10 mol % excess of lead oxide (PbO) to PLT containing 20 mol % of lanthanum, and applying a high-frequency power of 300 W thereto for 15 minutes at a substrate temperature of 600° C. in a mixed atmosphere of argon and oxygen (gas volume ratio: Ar:O$_2$=19:1) at a degree of vacuum of 0.8 Pa.

The piezoelectric layer was obtained by using a sinter target of 0.8PZT(Zr/Ti=40/60)–0.2Pb(Mg$_{1/3}$Nb$_{2/3}$)O$^3$ to which a 15 mol % excess of PbO was added, and applying a high-frequency power of 250 W thereto for 3 hours at a substrate temperature of 610° C. in a mixed atmosphere of argon and oxygen (gas volume ratio: Ar:O$_2$=19:1) at a degree of vacuum of 0.3 Pa.

The second electrode layer was obtained by using a Pt target and applying a high-frequency power of 200 W thereto at a room temperature in an argon gas at 1 Pa.

In Example 2 also, no crack or peeling off was observed for any of the films of the piezoelectric element immediately after its manufacture.

Then, the crystal orientation and the film composition of the piezoelectric layer before the formation of the second electrode layer were examined as in Example 1, indicating that the piezoelectric layer had a (001)-oriented tetragonal perovskite crystalline structure (degree of (001) orientation: α=96%). Moreover, an examination of the composition of the piezoelectric layer showed that the Zr/Ti ratio was 40/60 and the Mg/Nb ratio was 33/67 as in the target composition. Furthermore, an observation of the crystalline structure by a SEM showed that the value of the ratio of the average cross-sectional diameter of the crystal grains extending in the thickness direction of the piezoelectric layer to the length thereof was about ⅕.

Then, the crystal orientation and the film composition of the first electrode layer before the formation of the orientation control layer were examined, indicating that the Pt film was oriented along the (111) plane. Moreover, the titanium oxide content was 8 mol %.

Then, the crystal orientation and the film composition of the orientation control layer before the formation of the piezoelectric layer were examined, indicating that the PLT film had a (001)-oriented perovskite crystalline structure. Note that a (111)-oriented region was observed on one side of the orientation control layer that is closer to the first electrode layer. It is believed that the (111)-oriented region exists over a portion of the surface of the first electrode layer where titanium oxide does not exist. Moreover, 3 mol % of magnesium and 17 mol % of lanthanum were contained, and a 6 mol % excess of Pb was contained.

Next, as in Example 1, before the formation of the second electrode layer, 100 cantilevers having a size of 15 mm×2 mm were cut out by dicing. Then, the second electrode layer having a thickness of 0.1 μm was formed thereon by a sputtering method, and the piezoelectric constant d$_{31}$ was measured. The average piezoelectric constant of the 100 cantilevers was −230 pC/N (deviation: σ=3.6%).

Then, the second electrode layer of the piezoelectric element was formed as 65 pieces of Pt film each having a size of 1 mm×1 mm and a thickness of 0.1 μm and arranged at an interval of 10 mm by a sputtering method using a metal mask. The breakdown voltage was measured by applying a voltage between each second electrode layer and the first electrode layer. As a result, the average breakdown voltage value was 105 V (deviation: σ=3.8%).

Next, the elements A and B in 0.8PZT(Zr/Ti=40/60)–0.2Pb(A$_{1/3}$B$_{2/3}$)O$_3$ were changed as shown in Table 3 to examine the degree of (001) orientation, the piezoelectric constant d$_{31}$, and the breakdown voltage. The results were as shown in Table 3.

TABLE 3

| A | B | Degree of (001) orientation (%) | $d_{31}$(pC/N) | Breakdown voltage (V) |
|---|---|---|---|---|
| Mg | Nb | 96 | −230 | 105 |
| Mn | Nb | 95 | −212 | 103 |
| Ni | Nb | 93 | −220 | 104 |
| Co | Nb | 90 | −194 | 99 |
| Cd | Nb | 90 | −190 | 102 |

From the results, it can be said that the degree of (001) orientation is greater than or equal to 90% and the piezoelectric constant $d_{31}$ and the breakdown voltage are quite favorable in all of the cases.

EXAMPLE 3

In Example 3, a barium borosilicate glass having a thickness of 0.5 mm (size: 100 mm×100 mm) was used as the substrate, a nickel (Ni) film having a thickness of 0.005 μm was used as the adhesive layer, an iridium (Ir) film having a thickness of 0.15 μm and containing 18 mol % of titanium was used as the first electrode layer, a PLT film (to which 1 mol % of manganese was added) having a thickness of 0.02 μm and containing 8 mol % of lanthanum in which the lead content was 16 mol % in excess of the stoichiometric composition was used as the orientation control layer, a 0.9PZT (Zr/Ti=40/60)–0.1Pb(Ni$_{1/3}$Nb$_{2/3}$)O$_3$ film having a thickness of 2.6 μm was used as the piezoelectric layer, and a Pt film having a thickness of 0.01 μm was used as the second electrode layer.

The adhesive layer was obtained by using a Ni target and applying a high-frequency power of 200 W thereto for 1 minute while heating the substrate to 300° C. in an argon gas at 1 Pa.

The first electrode layer was obtained by using a Ti target and an Ir target and applying high-frequency powers of 160 W and 200 W thereto, respectively, for 10 minutes while heating the substrate to 600° C. in an argon gas at 1 Pa, using a multi-target sputtering apparatus.

The orientation control layer was obtained by using a sinter target, which was prepared by adding 2 mol % of manganese and a 22 mol % excess of lead oxide (PbO) to PLT containing 12 mol % of lanthanum, and applying a high-frequency power of 300 W thereto for 15 minutes at a substrate temperature of 580° C. in a mixed atmosphere of argon and oxygen (gas volume ratio: Ar:O$_2$=19:1) at a degree of vacuum of 0.8 Pa.

The piezoelectric layer was obtained by using a sinter target of 0.9PZT(Zr/Ti=40/60)–0.1Pb(Ni$_{1/3}$Nb$_{2/3}$)O$^3$ to which a 15 mol % excess of PbO was added, and applying a high-frequency power of 260 W thereto for 3 hours at a substrate temperature of 580° C. in a mixed atmosphere of argon and oxygen (gas volume ratio: Ar:O$_2$=19:1) at a degree of vacuum of 0.3 Pa.

The second electrode layer was obtained by using a Pt target and applying a high-frequency power of 200 W thereto at a room temperature in an argon gas at 1 Pa.

In Example 3 also, no crack or peeling off was observed for any of the films of the piezoelectric element immediately after its manufacture.

Then, the crystal orientation and the film composition of the piezoelectric layer before the formation of the second electrode layer were examined, indicating that the piezoelectric layer had a (001)-oriented tetragonal perovskite crystalline structure (degree of (001) orientation: α=95%). Moreover, an examination of the composition of the piezoelectric layer showed that the Zr/Ti ratio was 40/60 and the Ni/Nb ratio was 33/67 as in the target composition. Furthermore, the value of the ratio of the average cross-sectional diameter of the crystal grains extending in the thickness direction of the piezoelectric layer to the length thereof was about 1/35.

Then, the crystal orientation and the film composition of the first electrode layer before the formation of the orientation control layer were examined, indicating that the Ir film was oriented along the (111) plane. Moreover, the Ti content was 18 mol %.

Then, the crystal orientation and the film composition of the orientation control layer before the formation of the piezoelectric layer were examined, indicating that the PLT film had a (100)-oriented perovskite crystalline structure. Note that an amorphous region was observed on one side of the orientation control layer that is closer to the first electrode layer. It is believed that the amorphous region exists over a portion of the surface of the first electrode layer where titanium does not exist. Moreover, 1 mol % of manganese and 8 mol % of lanthanum were contained, and a 16 mol % excess of Pb was contained.

Next, before the formation of the second electrode layer, 100 cantilevers having a size of 15 mm×2 mm were cut out by dicing. Then, the second electrode layer having a thickness of 0.01 μm was formed thereon by a sputtering method, and the piezoelectric constant $d_{31}$ was measured. The average piezoelectric constant of the 100 cantilevers was −202 pC/N (deviation: σ=3.2%).

Then, the second electrode layer of the piezoelectric element was formed as 65 pieces of Pt film each having a size of 1 mm×1 mm and a thickness of 0.01 μm and arranged at an interval of 10 mm by a sputtering method using a metal mask. The breakdown voltage was measured by applying a voltage between each second electrode layer and the first electrode layer. As a result, the average breakdown voltage value was 100 V (deviation: σ=4.2%).

Next, the elements A and B in 0.9PZT(Zr/Ti=40/60)–0.1Pb(A$_{1/3}$B$_{2/3}$)O$_3$ were changed as shown in Table 4 to examine the degree of (001) orientation, the piezoelectric constant $d_{31}$, and the breakdown voltage. The results were as shown in Table 4.

TABLE 4

| A | B | Degree of (001) orientation (%) | $d_{31}$(pC/N) | Breakdown voltage (V) |
|---|---|---|---|---|
| Mg | Nb | 98 | −222 | 104 |
| Mn | Nb | 96 | −208 | 102 |
| Ni | Nb | 95 | −202 | 100 |
| Co | Nb | 94 | −197 | 98 |
| Cd | Nb | 93 | −193 | 97 |

From the results, it can be said that the degree of (001) orientation is greater than or equal to 90% and the piezoelectric constant $d_{31}$ and the breakdown voltage are quite favorable in all of the cases.

EXAMPLE 4

In Example 4, a 4-inch silicon wafer having a thickness of 0.5 mm was used as the substrate, a titanium film having a thickness of 0.01 μm was used as the adhesive layer, an Ir film having a thickness of 0.25 μm and containing 5 mol % of titanium oxide was used as the first electrode layer, a PLT film having a thickness of 0.05 μm and containing 10 mol % of lanthanum in which the lead content was 10 mol % in excess of the stoichiometric composition was used as the orientation control layer, a 0.95PZT(Zr/Ti=60/40)–0.05Pb(Fe$_{1/2}$Nb$_{1/2}$)O$_3$ film having a thickness of 3.2 µm was used as the piezoelectric layer, and a Pt film having a thickness of 0.01 µm was used as the second electrode layer.

The adhesive layer was obtained by using a Ti target and applying a high-frequency power of 100 W thereto for 1 minute while heating the substrate to 500° C. in an argon gas at 1 Pa.

The first electrode layer was obtained by using a Ti target and an Ir target and applying high-frequency powers of 90 W and 200 W thereto, respectively, for 12 minutes while heating the substrate to 400° C. in a mixed atmosphere of argon and oxygen (gas volume ratio: Ar:O$_2$=10:1) at 1 Pa, using a multi-target sputtering apparatus.

The orientation control layer was obtained by using a sinter target prepared by adding a 14 mol % excess of lead oxide (PbO) to PLT containing 10 mol % of lanthanum and applying a high-frequency power of 300 W thereto for 20 minutes at a substrate temperature of 600° C. in a mixed atmosphere of argon and oxygen (gas volume ratio: Ar:O$_2$=15:11) at a degree of vacuum of 0.84 Pa.

The piezoelectric layer was obtained by using a sinter target of 0.95PZT(Zr/Ti=60/40)–0.05Pb(Fe$_{1/2}$Nb$_{1/2}$)O$_3$ to which a 15 mol % excess of PbO was added, and applying a high-frequency power of 270 W thereto for 3 hours at a substrate temperature of 620° C. in a mixed atmosphere of argon and oxygen (gas volume ratio: Ar:O$_2$=19:1) at a degree of vacuum of 0.4 Pa.

The second electrode layer was obtained by using a Pt target and applying a high-frequency power of 200 W thereto at a room temperature in an argon gas at 1 Pa.

In Example 4 also, no crack or peeling off was observed for any of the films of the piezoelectric element immediately after its manufacture.

Then, the crystal orientation and the film composition of the piezoelectric layer before the formation of the second electrode layer were examined, indicating that the piezoelectric layer had a (100)-oriented rhombohedral perovskite crystalline structure (degree of (100) orientation: α=99%). Moreover, an examination of the composition of the piezoelectric layer showed that the Zr/Ti ratio was 60/40 and the Ni/Nb ratio was 50/50 as in the target composition. Furthermore, the value of the ratio of the average cross-sectional diameter of the crystal grains extending in the thickness direction of the piezoelectric layer to the length thereof was about 1/20.

Then, the crystal orientation and the film composition of the first electrode layer before the formation of the orientation control layer were examined, indicating that the Ir film was oriented along the (111) plane. Moreover, the titanium oxide content was 5 mol %.

Then, the crystal orientation and the film composition of the orientation control layer before the formation of the piezoelectric layer were examined, indicating that the PLT film had a (100)-oriented perovskite crystalline structure. Note that an amorphous region was observed on one side of the orientation control layer that is closer to the first electrode layer. It is believed that the amorphous region exists over a portion of the surface of the first electrode layer where titanium oxide does not exist. Moreover, 10 mol % of lanthanum was contained, and a 10 mol % excess of Pb was contained.

Next, before the formation of the second electrode layer, 100 cantilevers having a size of 15 mm×2 mm were cut out by dicing. Then, the second electrode layer having a thickness of 0.01 µm was formed thereon by a sputtering method, and the piezoelectric constant d$_{31}$ was measured. The average piezoelectric constant of the 100 cantilevers was –185 pC/N (deviation: σ=3.4%).

Then, the second electrode layer of the piezoelectric element was formed as 65 pieces of Pt film each having a size of 1 mm×1 mm and a thickness of 0.01 µm and arranged at an interval of 10 mm by a sputtering method using a metal mask. The breakdown voltage was measured by applying a voltage between each second electrode layer and the first electrode layer. As a result, the average breakdown voltage value was 101 V (deviation: σ=3.6%).

Next, the elements A and B in 0.95PZT(Zr/Ti=60/40)–0.05Pb(A$_{1/2}$B$_{1/2}$)O$_3$ were changed as shown in Table 5 to examine the degree of (100) orientation, the piezoelectric constant d$_{31}$, and the breakdown voltage. The results were as shown in Table 5.

TABLE 5

| A | B | Degree of (100) orientation (%) | d$_{31}$(pC/N) | Breakdown voltage (V) |
|---|---|---|---|---|
| Fe | Nb | 99 | –185 | 101 |
| Cr | Nb | 93 | –175 | 98 |
| In | Nb | 91 | –171 | 97 |
| Y | Nb | 92 | –172 | 98 |
| Sb | Nb | 90 | –170 | 98 |
| Fe | Ta | 97 | –181 | 100 |
| Cr | Ta | 92 | –171 | 101 |

From the results, it can be said that the degree of (100) orientation is greater than or equal to 90% and the piezoelectric constant d$_{31}$ and the breakdown voltage are quite favorable in all of the cases.

EXAMPLE 5

In Example 5, a 4-inch silicon wafer having a thickness of 0.3 mm was used as the substrate, the first electrode layer was formed directly on the substrate without providing the adhesive layer therebetween, a Pt film having a thickness of 0.22 µm and containing 2.1 mol % of cobalt was used as the first electrode layer, a PLZT film (to which 3 mol % of magnesium was added) having a thickness of 0.03 µm and containing 12 mol % of lanthanum and 15 mol % of zirconium in which the lead content was 18 mol % in excess of the stoichiometric composition was used as the orientation control layer, a 0.85PZT (Zr/Ti=45/55)–0.15Pb(Zn$_{1/2}$Te$_{1/2}$)O$_3$ film having a thickness of 3 µm was used as the piezoelectric layer, and a Pt film having a thickness of 0.2 µm was used as the second electrode layer.

The first electrode layer was obtained by using a Co target and a Pt target and applying high-frequency powers of 85 W and 200 W thereto, respectively, for 12 minutes while heating the substrate to 400° C. in an argon gas at 1 Pa, using a multi-target sputtering apparatus.

The orientation control layer was obtained by using a sinter target, which was prepared by adding 3 mol % of magnesium and a 24 mol % excess of lead oxide (PbO) to PLZT containing 14 mol % of lanthanum and 15 mol % of zirconium, and applying a high-frequency power of 300 W thereto for 12 minutes at a substrate temperature of 600° C. in a mixed atmosphere of argon and oxygen (gas volume ratio: Ar:O$_2$=19:1) at a degree of vacuum of 0.8 Pa.

The piezoelectric layer was obtained by using a sinter target of 0.85PZT(Zr/Ti=45/55)–0.15Pb(Zn$_{1/2}$Te$_{1/2}$)O$_3$ to which a 15 mol % excess of PbO was added, and applying a high-frequency power of 250 W thereto for 3 hours at a substrate temperature of 610° C. in a mixed atmosphere of argon and oxygen (gas volume ratio: Ar:$O_2$=19:1) at a degree of vacuum of 0.3 Pa.

The second electrode layer was obtained by using a Pt target and applying a high-frequency power of 200 W thereto at a room temperature in an argon gas at 1 Pa.

In Example 5 also, no crack or peeling off was observed for any of the films of the piezoelectric element immediately after its manufacture.

Then, the crystal orientation and the film composition of the piezoelectric layer before the formation of the second electrode layer were examined, indicating that the piezoelectric layer had a (001)-oriented tetragonal perovskite crystalline structure (degree of (001) orientation: α=90%). Moreover, an examination of the composition of the piezoelectric layer showed that the Zr/Ti ratio was 45/55 and the Mg/Nb ratio was 50/50 as in the target composition. Furthermore, an observation of the crystalline structure by a SEM showed that the value of the ratio of the average cross-sectional diameter of the crystal grains extending in the thickness direction of the piezoelectric layer to the length thereof was about 1/30.

Then, the crystal orientation and the film composition of the first electrode layer before the formation of the orientation control layer were examined, indicating that the Pt film was oriented along the (111) plane. Moreover, the titanium content was 2.1 mol %.

Then, the crystal orientation and the film composition of the orientation control layer before the formation of the piezoelectric layer were examined, indicating that the PLT film had a (100)-oriented perovskite crystalline structure. Note that a (111)-oriented region was observed on one side of the orientation control layer that is closer to the first electrode layer. It is believed that the (111)-oriented region exists over a portion of the surface of the first electrode layer where titanium does not exist. Moreover, 3 mol % of magnesium and 12 mol % of lanthanum were contained, and a 18 mol % excess of Pb was contained.

Next, before the formation of the second electrode layer, 100 cantilevers having a size of 15 mm×2 mm were cut out by dicing. Then, the second electrode layer having a thickness of 0.2 μm was formed thereon by a sputtering method, and the piezoelectric constant $d_{31}$ was measured. The average piezoelectric constant of the 100 cantilevers was −190 pC/N (deviation: σ=4.1%).

Then, the second electrode layer of the piezoelectric element was formed as 65 pieces of Pt film each having a size of 1 mm×1 mm and a thickness of 0.2 μm and arranged at an interval of 10 mm by a sputtering method using a metal mask. The breakdown voltage was measured by applying a voltage between each second electrode layer and the first electrode layer. As a result, the average breakdown voltage value was 100 V (deviation: σ=4.0%).

Next, the elements A and B in 0.85PZT(Zr/Ti=45/55)–0.15Pb($A_{1/2}B_{1/2}$)$O_3$ were changed as shown in Table 6 to examine the degree of (001) orientation, the piezoelectric constant $d_{31}$, and the breakdown voltage. The results were as shown in Table 6.

TABLE 6

| A | B | Degree of (001) orientation (%) | $d_{31}$(pC/N) | Breakdown voltage (V) |
|---|---|---|---|---|
| Mn | Te | 94 | −182 | 101 |
| Ni | Te | 90 | −171 | 102 |

TABLE 6-continued

| A | B | Degree of (001) orientation (%) | $d_{31}$(pC/N) | Breakdown voltage (V) |
|---|---|---|---|---|
| Co | Te | 90 | −172 | 100 |
| Mg | Te | 92 | −173 | 103 |
| Zn | Te | 90 | −190 | 100 |
| Mn | W | 93 | −180 | 100 |
| Ni | W | 91 | −170 | 100 |
| Co | W | 90 | −170 | 101 |
| Mg | W | 91 | −171 | 103 |
| Zn | W | 91 | −182 | 102 |

From the results, it can be said that the degree of (001) orientation is greater than or equal to 90% and the piezoelectric constant $d_{31}$ and the breakdown voltage are quite favorable in all of the cases.

COMPARATIVE EXAMPLE 1

A piezoelectric element of Comparative Example 1 is different from that of Example 1 only in that an orientation control layer is not provided. In the piezoelectric element of Comparative Example 1, an adhesive layer, a first electrode layer, a piezoelectric layer, and a second electrode layer are formed on a substrate in this order.

The piezoelectric layer of the piezoelectric element of Comparative Example 1 had a (100)-oriented rhombohedral perovskite crystalline structure (degree of (100) orientation: α=28%).

Moreover, the piezoelectric constant $d_{31}$ was measured as in Example 1, indicating that the average piezoelectric constant was −82 pC/N (deviation: σ=12.5%).

Furthermore, the breakdown voltage was measured as in Example 1, indicating that the average breakdown voltage value was 65 V (deviation: σ=15.2%).

It is thus understood that, only by providing the orientation control layer as in Example 1, it is possible to improve the crystallinity and the orientation of the piezoelectric layer, and to improve the piezoelectric characteristics and the breakdown voltage of the piezoelectric element.

EXAMPLE 6

A piezoelectric element of Example 6 is different from that of Example 1 only in the material of the orientation control layer. (Note that the sputtering conditions for the orientation control layer of Example 6 are the same as those employed in Example 1). Specifically, the orientation control layer of Example 6 is made of lead titanate (PT) not containing La. The lead content of the orientation control layer is not in excess of the stoichiometric composition.

The piezoelectric layer of the piezoelectric element of Example 6 had a (100)-oriented rhombohedral perovskite crystalline structure (degree of (100) orientation: α=45%). Moreover, the average piezoelectric constant was −142 pC/N (deviation: σ=7.2%). Furthermore, the average breakdown voltage value was 90 V (deviation: σ=10.1%).

It is thus understood that, even with such an orientation control layer of Example 6, it is possible to improve the orientation of the piezoelectric layer and to improve the piezoelectric constant and the breakdown voltage as compared with the piezoelectric element of Comparative Example 1.

Furthermore, as seen from the comparison with Example 1, by adding lanthanum to the orientation control layer and excessively providing Pb, the orientation of the piezoelectric layer is significantly improved.

Embodiment 2

Figure 5:
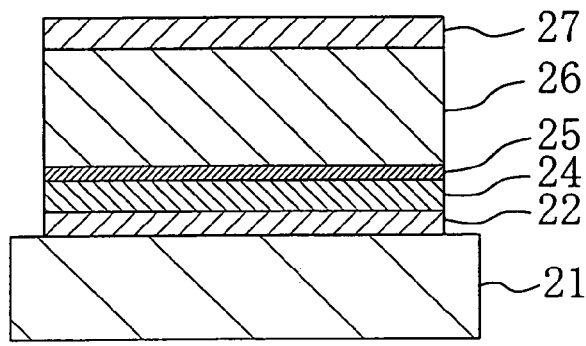
FIG. 5 is a cross-sectional view illustrating a piezoelectric element according to another embodiment of the present invention.

FIG. 5 illustrates another piezoelectric element according to an embodiment of the present invention. The piezoelectric element of this embodiment differs from that of Embodiment 1 in the structure of the first electrode layer and the orientation directions of the orientation control layer and piezoelectric layer.

In FIG. 5, the reference numeral 21 denotes a substrate made of a 4-inch silicon (Si) wafer having a thickness of 0.3 mm, and an adhesive layer 22 made of titanium (Ti) and having a thickness of 0.02 μm is formed on the substrate 21. Note that the substrate 21 is not limited to an Si substrate, but may alternatively be a glass substrate, a metal substrate, a ceramic substrate, or the like.

A first electrode layer 24 having a thickness of 0.22 μm and made of platinum (Pt) to which 2.1 mol % of Ti has been added is formed on the adhesive layer 22. The first electrode layer 24 is oriented along the (111) plane.

An orientation control layer 25 made of PLT having a cubic or tetragonal perovskite crystalline structure whose lanthanum (La) content is 12 mol % and whose lead content is 8 mol % in excess of the stoichiometric composition is formed on the first electrode layer 24. The orientation control layer 25 is preferentially oriented along the (111) plane, and has a thickness of 0.008 μm.

Formed on the orientation control layer 25 is a piezoelectric layer 26 made of lead zirconate titanate to which a Pb-containing complex perovskite compound expressed by the chemical formula $Pb(A_aB_b)O_3$ ($0<a<1$, $0<b<1$, $a+b=1$) has been added in an amount that is from 1 mol % to 50 mol %. The piezoelectric layer 26 has a rhombohedral or tetragonal crystalline structure preferentially oriented along the (111) plane. In this embodiment also, by setting the Pb-containing complex perovskite compound content from 1 mol % to 50 mol %, a high piezoelectric constant is obtained. If the content is set from 10 mol % to 25 mol %, in particular, a quite high piezoelectric constant is achieved, leading to very excellent piezoelectric characteristics.

In this embodiment also, in the chemical formula of the Pb-containing complex perovskite compound, the element A is Mg, the element B is Nb, the value of a is 1/3, and the value of b is 2/3. That is, the piezoelectric layer 26 is made of $0.8PZT-0.2Pb(Mg_{1/3}Nb_{2/3})O_3$. The composition of the PZT material is a composition (Zr/Ti=55/45) which is near the boundary between being tetragonal and being rhombohedral (i.e., the morphotropic phase boundary), and the piezoelectric layer 26 has a thickness of 3 μm. The piezoelectric layer 26 has a rhombohedral crystalline structure, because Zr/Ti=55/45.

In this embodiment also, the Pb-containing complex perovskite compound is not limited to $Pb(Mg_{1/3}Nb_{2/3})O_3$, but the elements A and B and the values of a and b in the chemical formula may be those described in Embodiment 1.

The composition of the PZT is not limited to Zr/Ti=55/45, but may be any other suitable composition so long as it is in the range of 30/70 to 70/30, and may be those obtained by further adding an additive, such as Sr, Nb, or Al, to PZT to which a Pb-containing complex perovskite compound has been added. Furthermore, the piezoelectric layer 26 may have any thickness so long as it is in the range of 0.5 to 5.0 μm.

A second electrode layer 27 having a thickness of 0.2 μm and made of Pt is formed on the piezoelectric layer 26. Note that the material of the second electrode layer 27 is not limited to Pt as long as it is a conductive material, and the thickness thereof is not limited to any particular thickness as long as it is in the range of 0.1 to 0.4 μm.

The piezoelectric element is obtained by depositing the adhesive layer 22, the first electrode layer 24, the orientation control layer 25, the piezoelectric layer 26 and the second electrode layer 27 in this order on the substrate 21 by a sputtering method. Note that the deposition method is not limited to a sputtering method, but may alternatively be any other suitable deposition method as long as a crystalline thin film is directly formed without the crystallization step using a heat treatment (e.g., a CVD method). Moreover, the deposition method for the adhesive layer 22 and the second electrode layer 27 may be a sol-gel method, or the like.

The adhesive layer 22 is provided for improving the adhesion between the substrate 21 and the first electrode layer 24. The material of the adhesive layer 22 is not limited to Ti, but may alternatively be tantalum, iron, cobalt, nickel, chromium, or a compound thereof (including Ti). Moreover, the thickness thereof is not limited to any particular thickness as long as it is in the range of 0.005 to 1 μm. The adhesive layer 22 is not always necessary. Even if the first electrode layer 24 is formed directly on the substrate 21, the adhesion between the substrate 21 and the first electrode layer 24 is quite desirable because Ti is contained in the first electrode layer 24.

As described above, the fact that the first electrode layer 24 contains Ti permits the adhesion between the substrate 21 and the first electrode layer 24 to be enhanced. Titanium oxide may be contained in place of Ti. The amount of titanium or titanium oxide to be contained is preferably greater than zero and less than or equal to 30 mol %. Moreover, the material of the first electrode layer 24 may be at least one noble metal selected from the group consisting of Pt, iridium, palladium and ruthenium, and the thickness thereof is not limited to any particular thickness as long as it is in the range of 0.05 to 2 μm. Titanium or titanium oxide existing at a surface of the first electrode layer 24 that is closer to the orientation control layer 25 is intended to be contained in the first electrode layer 24, but is not intended to be provided above the surface of the first electrode layer 24. Thus, the titanium or titanium oxide hardly protrudes above the surface of the first electrode layer 24 that is closer to the orientation control layer 25. Even if it protrudes, the amount of protrusion is smaller than 2 nm.

The orientation control layer 25 is provided for improving the crystallinity and the (111) orientation property of the piezoelectric layer 26. For this purpose, the orientation control layer 25 is made of PLT, which contains La and contains no Zr and whose lead content is in excess of the stoichiometric composition. Note that in order to improve the crystallinity and the orientation of the piezoelectric layer 26, the La content thereof may be greater than zero and less than or equal to 25 mol %, and the lead content thereof may be in excess of the stoichiometric composition by an amount greater than zero and less than or equal to 30 mol %. Moreover, the material of the orientation control layer 25 is not limited to PLT as described above, but may alternatively be PLZT obtained by adding zirconium to PLT, or may be a material obtained by adding at least one of magnesium and manganese to PLT or PLZT. The zirconium content is preferably less than or equal to 20 mol %, and when at least one of magnesium and manganese is added, the total amount thereof to be added is preferably greater than zero and less than or equal to 10 mol % (the amount of one of magnesium and manganese may be zero).

Figure 6:
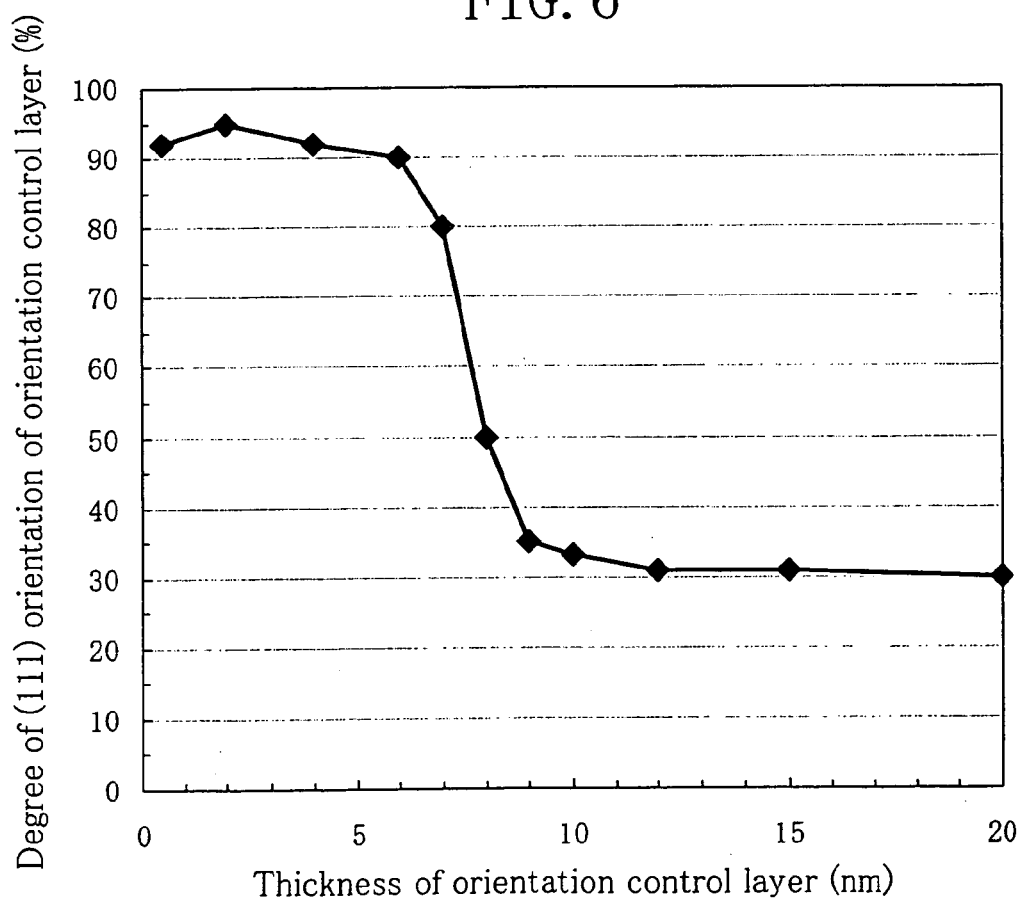
FIG. 6 is a graph indicating the relation between the thickness of an orientation control layer and the degree of (111) orientation of the orientation control layer.
Figure 7:
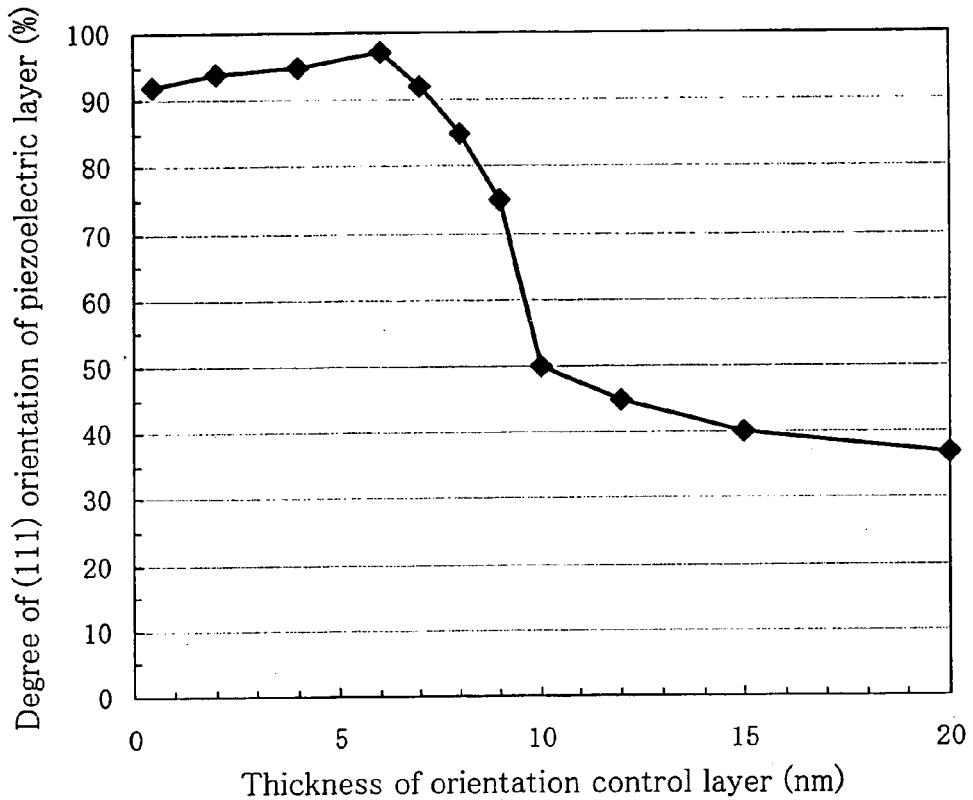
FIG. 7 is a graph indicating the relation between the thickness of an orientation control layer and the degree of (111) orientation of a piezoelectric layer.

Hereinafter, the thickness of the orientation control layer 25 will be discussed. The thickness of the orientation control layer 25 is related to the degree of (111) orientation of the orientation control layer 25. More specifically, as described in Embodiment 1, the orientation control layer 25 grows over a contained substance (i.e., an oxide) which exists in a dotted pattern on one surface of the first electrode layer 24 by using the substance as a nucleus. Thus, regions of the orientation control layer 25 located over portions of the surface of the first electrode layer 24 where the contained substance does not exist are oriented along the (111) plane. On the other hand, regions of the orientation control layer 25 located over portions of the surface of the first electrode layer 24 where the contained substance exists are oriented in a direction other than along the (111) plane (those regions are more likely to be oriented particularly along the (100) or (001) plane). As the crystal growth process proceeds (as the thickness of the orientation control layer 25 increases), those regions located over the contained substance, which are not oriented along the (111) plane, gradually expand, while the (111)-oriented regions gradually shrink. Therefore, as shown in FIG. 6, as the thickness of the orientation control layer 25 increases, the degree of (111) orientation of the orientation control layer 25 decreases. As a result, the degree of (111) orientation of the piezoelectric layer 26 also decreases, as shown in FIG. 7. In view of this, if the thickness of the orientation control layer 25 is set to a value which prevents the regions that are not oriented along the (111) plane from expanding too much, that is, if the thickness is set to 0.008 μm or smaller, the degree of (111) orientation of the orientation control layer 25 will be 50% or higher (see FIG. 6), while the degree of (111) orientation of the piezoelectric layer 26 will be 80% or higher (see FIG. 7). In other words, if the degree of (111) orientation of the orientation control layer 25 is 50% or more, it is possible to make the degree of (111) orientation of the piezoelectric layer 26 80% or more. In order to form the orientation control layer 25 stably, it is desirable for the orientation control layer 25 to have a thickness of 0.0005 μm or more. More preferably, the thickness is 0.007 μm or less, because in that case the degree of (111) orientation of the orientation control layer 25 will be 70% or more, allowing the degree of (111) orientation of the piezoelectric layer 26 to be 90% or more. It should be noted that the first electrode layer 24 does not have to contain the above-mentioned substance, which is titanium or the like. In that case, it is possible to easily make the degree of (111) orientation of the orientation control layer 25 be almost 100% irrespective of the thickness thereof.

Next, a method for manufacturing the piezoelectric element will be described.

The adhesive layer 22, the first electrode layer 24, the orientation control layer 25, the piezoelectric layer 26 and the second electrode layer 27 are deposited in this order on the Si substrate 21 by a sputtering method.

The adhesive layer 22 and the first electrode layer 24 are formed in the same manners as the adhesive layer 12 and the first electrode layer 14 of Embodiment 1.

The orientation control layer 25 is obtained by using a sinter target prepared by adding a 12 mol % excess of lead oxide (PbO) to PLT containing 14 mol % of lanthanum and applying a high-frequency power of 300 W thereto for 3 minutes while heating the substrate 21 to 600° C. in a mixed atmosphere of argon and oxygen (gas volume ratio: $Ar:O_2=19:1$) at a degree of vacuum of 0.8 Pa.

The oxygen partial pressure in the mixed gas of argon and oxygen which is used for forming the orientation control layer 25 by the sputtering method is preferably greater than 0% and less than or equal to 20%. This is because the crystallinity of the orientation control layer 25 deteriorates in an environment where no oxygen exists. If the oxygen partial pressure is higher than 20%, the orientation of the (111) plane deteriorates. Further, the degree of vacuum is preferably 0.05 Pa or higher and 5 Pa or lower. This is because, if the degree of vacuum is lower than 0.05 Pa, the crystallinity of the orientation control layer 25 becomes non-uniform. If the degree of vacuum is higher than 5 Pa, the orientation of the (111) plane deteriorates.

When forming the orientation control layer 25 by the sputtering method, the temperature of the substrate 21 is desirably set to 450° C. or higher and 750° C. or lower. This is because, if the temperature of the substrate 21 is lower than 450° C., the crystallinity of the orientation control layer 25 deteriorates, and pyrochlore is more likely to be generated. If the temperature of the substrate 21 is 750° C. or higher, Pb contained in the film of the orientation control layer 25 evaporates during the formation of the film, so that the orientation control layer 25 lacks Pb. As a result, the crystallinity of the orientation control layer 25 deteriorates.

More preferably, the oxygen partial pressure is set to 0.5% or higher and 10% or lower, the degree of vacuum is set to 0.1 Pa or higher and 2 Pa or lower, and the temperature of the substrate 21 is 500° C. or higher and 650° C. or lower.

If the orientation control layer 25 is formed under the above conditions, the orientation control layer 25 is preferentially oriented along the (111) plane, as described above, and the degree of (111) orientation is 50% or more. It should be noted that even in the case where the degree of (111) orientation is 50%, if the orientation degree other than the (111) plane is extremely small as compared with the degree of (111) orientation, it can be said that the orientation control layer 25 is preferentially oriented along the (111) plane. Also, in the case where the zirconium content is set to 20 mol % or less, and the lanthanum content is set to greater than 0 and less than or equal to 25 mol %, the crystallinity and the orientation of the orientation control layer 25 are significantly improved. Especially as the zirconium content decreases, a layer of a low crystallinity made of a Zr oxide is less likely to be formed in the initial period of the crystal growth process. As a result, deterioration in the crystallinity is surely suppressed.

The piezoelectric layer 26 is obtained by using a sinter target of $0.8PZT(Zr/Ti=55/45)-0.2Pb(Mg_{1/3}Nb_{2/3})O^3$ to which a 15 mol % excess of PbO has been added, and applying a high-frequency power of 250 W thereto for 3 hours while heating the substrate 21 to 610° C., in a mixed atmosphere of argon and oxygen (gas volume ratio: $Ar:O_2=19:1$) at a degree of vacuum of 0.3 Pa.

The oxygen partial pressure in the mixed gas of argon and oxygen which is set for forming the piezoelectric layer 26 by the sputtering method is preferably greater than 0% and less than or equal to 30%. This is because the crystallinity of the piezoelectric layer 26 deteriorates in an environment where no oxygen exists. If the oxygen partial pressure is higher than 30%, the orientation of the (111) plane deteriorates. Further, the degree of vacuum is preferably 0.1 Pa or higher and 1 Pa or lower. This is because, if the degree of vacuum is lower than 0.1 Pa, the crystallinity and the piezoelectric characteristics of the piezoelectric layer 26 become non-uniform. If the degree of vacuum is higher than 1 Pa, the orientation of the (111) plane deteriorates.

As described in Embodiment 1, if the oxygen partial pressure is greater than 0% and less than or equal to 30% and the degree of vacuum is 0.1 Pa or higher and 1 Pa or lower, the crystal grains of the piezoelectric layer 26 easily become columnar grains which extend in the thickness direction of the piezoelectric layer 26 and in which the ratio of the average cross-sectional diameter to the length is from 1/50 to 1/14.

Also, as described in Embodiment 1, the temperature of the substrate 21 which is selected for forming the piezoelectric layer 26 by the sputtering method is preferably 450° C. or higher and 750° C. or lower.

More preferably, the oxygen partial pressure is set to 1% or higher and 10% or lower, the degree of vacuum is set to 0.15 Pa or higher and 0.9 Pa or lower, and the temperature of the substrate 21 is 525° C. or higher and 625° C. or lower.

The piezoelectric layer 26 formed according to the above conditions is preferentially oriented along the (111) plane and the degree of (111) orientation is 80% or more, if the degree of (111) orientation of the orientation control layer 25 is 50% or more. Moreover, since the orientation control layer 25 has a desirable crystallinity, the piezoelectric layer 26 also has a desirable crystallinity. Furthermore, the crystal grains of the piezoelectric layer 26 become columnar grains which extend in the thickness direction of the piezoelectric layer 26 and in which the ratio of the average cross-sectional diameter to the length is from 1/50 to 1/14. Then, even if the piezoelectric element is driven continuously, stress in the piezoelectric layer 26 is relaxed appropriately, whereby cracks are less likely to occur in the piezoelectric layer 26. Accordingly, effects similar to those of Embodiment 1 are also achieved in this embodiment.

Next, specific examples of the present invention will be described. In each of the following examples, a structure in which an adhesive layer, a first electrode layer, an orientation control layer, a piezoelectric layer, and a second electrode layer are formed on a substrate in this order (except that an adhesive layer is not formed in Example 11) is the same as that described in Embodiment 2.

EXAMPLE 7

A piezoelectric element of Example 7 was manufactured by using the same material, thickness and manufacturing method for each film as those of Embodiment 2. No crack or peeling off was observed for any of the films of the piezoelectric element of Example 7 immediately after its manufacture.

As in Example 1, the crystal orientation and the film composition of the piezoelectric layer before the formation of the second electrode layer were examined, which showed that the piezoelectric layer had a (111)-oriented rhombohedral perovskite crystalline structure (degree of (111) orientation: $\alpha$=96%). Moreover, an analysis of the composition of the piezoelectric layer with an X-ray microanalyzer showed that the Zr/Ti ratio was 55/45 and the Mg/Nb ratio was 33/67 as in the target composition.

Furthermore, the crystalline structure of the piezoelectric layer was analyzed using a scanning electron microscope (SEM). The analysis results showed the features of the piezoelectric layer; the crystalline structure of the piezoelectric layer was a well developed columnar structure and the crystal grains thereof were columnar grains that extended in the thickness direction of the piezoelectric layer, with the length of the crystal grains being considerably greater than the average cross-sectional diameter thereof (that is, the value of the ratio of the average cross-sectional diameter to the length was quite small). The value of the ratio of the average cross-sectional diameter of the crystal grains to the length thereof is about 1/20 in this example.

In fabricating piezoelectric elements, the value of the ratio of the average cross-sectional diameter of the crystal grains extending in the thickness direction of the piezoelectric layer to the length thereof was varied in the range of 1/100 to 1/2. The ink jet heads (which have the same structure as the ink jet head of Embodiment 3, which will be described later) including those piezoelectric elements were subjected to a durability test (driving frequency=20 kHz, driving voltage=20 V) to examine crack occurrence rates (i.e., the number of pressure chambers with ink-discharge defects against the total number of pressure chambers) in the piezoelectric layers. The results were as shown in Table 7.

TABLE 7

| Average cross-sectional diameter of piezoelectric-layer crystal grains/length | Crack occurrence rate (%) |
|---|---|
| 1/100 | 4.8 |
| 1/70 | 3.9 |
| 1/50 | 0 |
| 1/30 | 0 |
| 1/14 | 0 |
| 1/10 | 2.7 |
| 1/5 | 4.5 |
| 1/2 | 6 |

The results of the durability test showed that when the value of the ratio of the average cross-sectional diameter of the crystal grains extending in the thickness direction of the piezoelectric layer to the length thereof was from 1/50 to 1/14, no cracks occurred in the piezoelectric layers, and that when the ratio value was not in the range of 1/50 to 1/14, cracks occurred in the piezoelectric layers. This is presumably because when the value of the ratio of the average cross-sectional diameter of the crystal grains to the length thereof is from 1/50 to 1/14, a stress in the piezoelectric layer produced when the piezoelectric element is driven is relaxed appropriately at the grain boundaries, while the strength of the adhesion to the orientation control layer and the second electrode layer increases.

Then, as in Example 1, the crystal orientation and the film composition of the first electrode layer before the formation of the orientation control layer were examined, indicating that the Pt film was oriented along the (111) plane. Moreover, an analysis of the composition at a depth of 5 nm from the surface with X-ray photoelectron spectroscopy (XPS) showed that the Ti content was 2.1 mol %.

Then, as in Example 1, the crystal orientation and the film composition of the orientation control layer before the formation of the piezoelectric layer were examined. The PLT film of the orientation control layer had a (111)-oriented perovskite crystalline structure and the degree of (111) orientation was 70%. Note that a region oriented in a direction other than along the (111) plane was observed on one side of the orientation control layer that is closer to the first electrode layer. It is believed that the region oriented in a direction other than along the (111) plane exists over a portion of the surface of the first electrode layer where titanium exists. Moreover, a composition analysis with an X-ray microanalyzer showed that 12 mol % of lanthanum was contained, and an 8 mol % excess of Pb was contained.

Next, before the formation of the second electrode layer, 100 cantilevers having a size of 15 mm×2 mm were cut out by dicing. Then, the second electrode layer having a thickness of 0.2 μm was formed thereon by a sputtering method, and the piezoelectric constant $d_{31}$ was measured. The average piezoelectric constant of the 100 cantilevers was −220 pC/N (deviation: $\alpha$=3.8%).

Then, the second electrode layer of the piezoelectric element was formed as 65 pieces of Pt film each having a size of 1 mm×1 mm and a thickness of 0.2 μm and arranged at an interval of 10 mm by a sputtering method using a metal mask. The breakdown voltage was measured by applying a voltage between each second electrode layer and the first electrode layer. Note that the breakdown voltage value was defined to be the value of the applied voltage for which the current value was 1 μA. As a result, the average breakdown voltage value was 121V (deviation: σ=4.0%).

Next, the elements A and B in $0.8PZT(Zr/Ti=55/45)-0.2Pb(A_{1/3}B_{2/3})O_3$ were changed as shown in Table 8 to examine the degree of (111) orientation, the piezoelectric constant $d_{31}$, and the breakdown voltage in the piezoelectric layers. The results were as shown in Table 8.

TABLE 8

| A | B | Degree of (111) orientation (%) | $d_{31}$(pC/N) | Breakdown voltage (V) |
|---|---|---|---|---|
| Mg | Nb | 96 | −220 | 121 |
| Mn | Nb | 94 | −211 | 116 |
| Ni | Nb | 97 | −219 | 119 |
| Co | Nb | 90 | −193 | 113 |
| Cd | Nb | 91 | −190 | 110 |
| Mn | Sb | 88 | −186 | 115 |
| Mn | Ta | 90 | −189 | 118 |
| Mg | Ta | 95 | −206 | 111 |
| Ni | Ta | 93 | −204 | 114 |

From the results, it can be said that in all of the cases the degree of (111) orientation is greater than or equal to 80% (greater than or equal to 90% in most cases) and the piezoelectric constant $d_{31}$ and the breakdown voltage are quite favorable.

EXAMPLE 8

In Example 8, a 4-inch stainless steel (SUS304) having a thickness of 0.25 mm was used as the substrate, a tantalum (Ta) film having a thickness of 0.01 μm was used as the adhesive layer, a Pt film (with no additive contained) having a thickness of 0.25 μm was used as the first electrode layer, a PLT film (to which 3 mol % of magnesium was added) having a thickness of 0.007 μm and containing 17 mol % of lanthanum in which the lead content was 6 mol % in excess of the stoichiometric composition was used as the orientation control layer, a $0.8PZT(Zr/Ti=40/60)-0.2Pb(Mg_{1/3}Nb_{2/3})O_3$ film having a thickness of 2.7 μm was used as the piezoelectric layer, and a Pt film having a thickness of 0.1 μm was used as the second electrode layer.

The adhesive layer was obtained by using a Ta target and applying a high-frequency power of 100 W thereto for 1 minute while heating the substrate to 500° C. in an argon gas at 1 Pa.

The first electrode layer was obtained by using a Pt target and applying a high-frequency power of 200 W thereto for 25 minutes while heating the substrate to 400° C. in a mixed atmosphere of argon and oxygen at 1 Pa (gas volume ratio: Ar:O$_2$=25:1), using a sputtering apparatus.

The orientation control layer was obtained by using a sinter target, which was prepared by adding 3 mol % of magnesium and a 10 mol % excess of lead oxide (PbO) to PLT containing 20 mol % of lanthanum, and applying a high-frequency power of 300 W thereto for 3 minutes at a substrate temperature of 600° C. in a mixed atmosphere of argon and oxygen (gas volume ratio: Ar:O$_2$=19:1) at a degree of vacuum of 0.8 Pa.

The piezoelectric layer was obtained by using a sinter target of $0.8PZT(Zr/Ti=40/60)-0.2Pb(Mg_{1/3}Nb_{2/3})O^3$ to which a 15 mol % excess of PbO was added, and applying a high-frequency power of 250 W thereto for 3 hours at a substrate temperature of 610° C. in a mixed atmosphere of argon and oxygen (gas volume ratio: Ar:O$_2$=19:1) at a degree of vacuum of 0.3 Pa.

The second electrode layer was obtained by using a Pt target and applying a high-frequency power of 200 W thereto at a room temperature in an argon gas at 1 Pa.

In Example 8 also, no crack or peeling off was observed for any of the films of the piezoelectric element immediately after its manufacture.

Then, the crystal orientation and the film composition of the piezoelectric layer before the formation of the second electrode layer were examined as in Example 1, indicating that the piezoelectric layer had a (111)-oriented tetragonal perovskite crystalline structure (degree of (111) orientation: α=96%). Moreover, an examination of the composition of the piezoelectric layer showed that the Zr/Ti ratio was 40/60 and the Mg/Nb ratio was 33/67 as in the target composition. Furthermore, an observation of the crystalline structure by a SEM showed that the value of the ratio of the average cross-sectional diameter of the crystal grains extending in the thickness direction of the piezoelectric layer to the length thereof was about ⅕.

Then, the crystal orientation and the film composition of the first electrode layer before the formation of the orientation control layer were examined, indicating that the Pt film was oriented along the (111) plane.

Then, the crystal orientation and the film composition of the orientation control layer before the formation of the piezoelectric layer were examined, indicating that the PLT film had a (111)-oriented perovskite crystalline structure with the degree of (111) orientation being 75%. Note that a region oriented in a direction other than along the (111) plane was observed on one side of the orientation control layer that is closer to the first electrode layer. Moreover, 3 mol % of magnesium and 17 mol % of lanthanum were contained, and a 6 mol % excess of Pb was contained.

Next, as in Example 1, before the formation of the second electrode layer, 100 cantilevers having a size of 15 mm×2 mm were cut out by dicing. Then, the second electrode layer having a thickness of 0.1 μm was formed thereon by a sputtering method, and the piezoelectric constant $d_{31}$ was measured. The average piezoelectric constant of the 100 cantilevers was −208 pC/N (deviation: σ=3.6%).

Then, the second electrode layer of the piezoelectric element was formed as 65 pieces of Pt film each having a size of 1 mm×1 mm and a thickness of 0.1 μm and arranged at an interval of 10 mm by a sputtering method using a metal mask. The breakdown voltage was measured by applying a voltage between each second electrode layer and the first electrode layer. As a result, the average breakdown voltage value was 105 V (deviation: σ=3.8%).

Next, the elements A and B in $0.8PZT(Zr/Ti=40/60)-0.2Pb(A_{1/3}B_{2/3})O_3$ were changed as shown in Table 9 to examine the degree of (111) orientation, the piezoelectric constant $d_{31}$, and the breakdown voltage of the piezoelectric layers. The results were as shown in Table 9.

TABLE 9

| A | B | Degree of (111) orientation (%) | $d_{31}$(pC/N) | Breakdown voltage (V) |
|---|---|---|---|---|
| Mg | Nb | 96 | −208 | 100 |
| Mn | Nb | 94 | −190 | 99 |
| Ni | Nb | 91 | −200 | 99 |
| Co | Nb | 90 | −175 | 92 |
| Cd | Nb | 90 | −171 | 97 |

From the results, it can be said that the degree of (111) orientation is greater than or equal to 90% and the piezoelectric constant $d_{31}$ and the breakdown voltage are quite favorable in all of the cases.

EXAMPLE 9

In Example 9, a barium borosilicate glass having a thickness of 0.5 mm (size: 100 mm×100 mm) was used as the substrate, a nickel (Ni) film having a thickness of 0.005 μm was used as the adhesive layer, an iridium (Ir) film (with no additive contained) having a thickness of 0.15 μm was used as the first electrode layer, a PLT film (to which 1 mol % of manganese was added) having a thickness of 0.006 μm and containing 8 mol % of lanthanum in which the lead content was 16 mol % in excess of the stoichiometric composition was used as the orientation control layer, a 0.9PZT(Zr/Ti=40/60)–0.1Pb(N$_{1/3}$Nb$_{2/3}$)O$_3$ film having a thickness of 2.6 μm was used as the piezoelectric layer, and a Pt film having a thickness of 0.01 μm was used as the second electrode layer.

The adhesive layer was obtained by using a Ni target and applying a high-frequency power of 200 W thereto for 1 minute while heating the substrate to 300° C. in an argon gas at 1 Pa.

The first electrode layer was obtained by using an Ir target and applying a high-frequency power of 200 W thereto for 10 minutes while heating the substrate to 600° C. in an argon gas at 1 Pa, using a sputtering apparatus.

The orientation control layer was obtained by using a sinter target, which was prepared by adding 2 mol % of manganese and a 22 mol % excess of lead oxide (PbO) to PLT containing 12 mol % of lanthanum, and applying a high-frequency power of 300 W thereto for 3 minutes at a substrate temperature of 580° C. in a mixed atmosphere of argon and oxygen (gas volume ratio: Ar:O$_2$=19:1) at a degree of vacuum of 0.8 Pa.

The piezoelectric layer was obtained by using a sinter target of 0.9PZT(Zr/Ti=40/60)–0.1Pb(Ni$_{1/3}$Nb$_{2/3}$)O$^3$ to which a 15 mol % excess of PbO was added, and applying a high-frequency power of 260 W thereto for 3 hours at a substrate temperature of 580° C. in a mixed atmosphere of argon and oxygen (gas volume ratio: Ar:O$_2$=19:1) at a degree of vacuum of 0.3 Pa.

The second electrode layer was obtained by using a Pt target and applying a high-frequency power of 200 W thereto at a room temperature in an argon gas at 1 Pa.

In Example 9 also, no crack or peeling off was observed for any of the films of the piezoelectric element immediately after its manufacture.

Then, the crystal orientation and the film composition of the piezoelectric layer before the formation of the second electrode layer were examined, indicating that the piezoelectric layer had a (111)-oriented tetragonal perovskite crystalline structure (degree of (111) orientation: α=95%). Moreover, an examination of the composition of the piezoelectric layer showed that the Zr/Ti ratio was 40/60 and the Ni/Nb ratio was 33/67 as in the target composition. Furthermore, the value of the ratio of the average cross-sectional diameter of the crystal grains extending in the thickness direction of the piezoelectric layer to the length thereof was about 1/35.

Then, the crystal orientation and the film composition of the first electrode layer before the formation of the orientation control layer were examined, indicating that the Ir film was oriented along the (111) plane.

Then, the crystal orientation and the film composition of the orientation control layer before the formation of the piezoelectric layer were examined, indicating that the PLT film had a (111)-oriented perovskite crystalline structure. Note that a region oriented in a direction other than along the (111) plane was observed on one side of the orientation control layer that is closer to the first electrode layer. Moreover, 1 mol % of manganese and 8 mol % of lanthanum were contained, and a 16 mol % excess of Pb was contained.

Next, before the formation of the second electrode layer, 100 cantilevers having a size of 15 mm×2 mm were cut out by dicing. Then, the second electrode layer having a thickness of 0.01 μm was formed thereon by a sputtering method, and the piezoelectric constant $d_{31}$ was measured. The average piezoelectric constant of the 100 cantilevers was –198 pC/N (deviation: σ=3.5%).

Then, the second electrode layer of the piezoelectric element was formed as 65 pieces of Pt film each having a size of 1 mm×1 mm and a thickness of 0.01 μm and arranged at an interval of 10 mm by a sputtering method using a metal mask. The breakdown voltage was measured by applying a voltage between each second electrode layer and the first electrode layer. As a result, the average breakdown voltage value was 96 V (deviation: σ=4.2%).

Next, the elements A and B in 0.9PZT(Zr/Ti=40/60)–0.1Pb(A$_{1/3}$B$_{2/3}$)O$_3$ were changed as shown in Table 10 to examine the degree of (111) orientation, the piezoelectric constant $d_{31}$, and the breakdown voltage of the piezoelectric layers. The results were as shown in Table 10.

TABLE 10

| A | B | Degree of (111) orientation (%) | $d_{31}$(pC/N) | Breakdown voltage (V) |
| --- | --- | --- | --- | --- |
| Mg | Nb | 97 | –213 | 100 |
| Mn | Nb | 95 | –201 | 99 |
| Ni | Nb | 95 | –198 | 96 |
| Co | Nb | 94 | –192 | 94 |
| Cd | Nb | 93 | –193 | 94 |

From the results, it can be said that the degree of (111) orientation is greater than or equal to 90% and the piezoelectric constant $d_{31}$ and the breakdown voltage are quite favorable in all of the cases.

Figure 8:
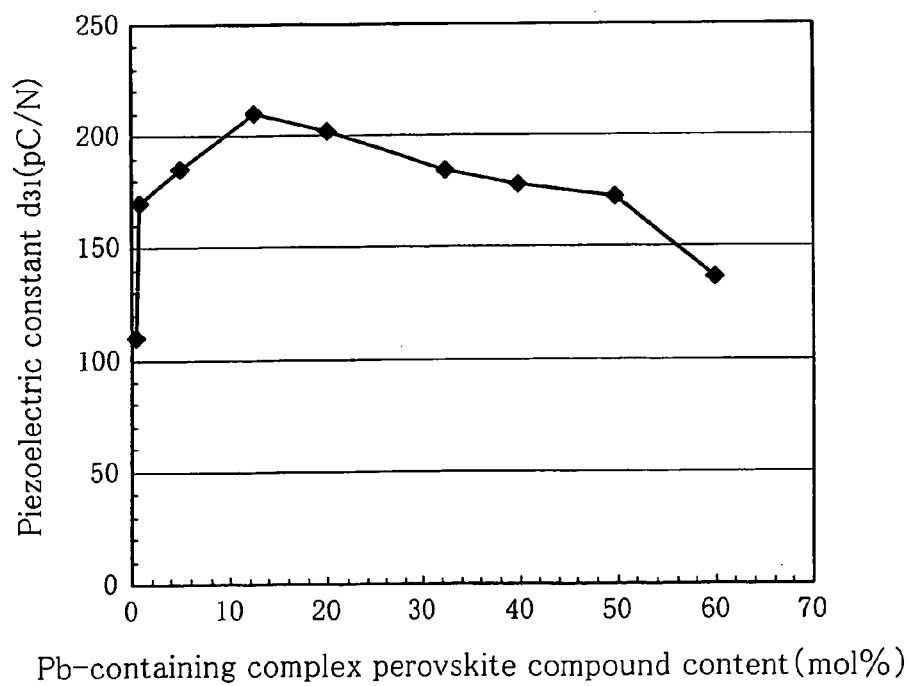
FIG. 8 is a graph indicating the relation between Pb-containing complex perovskite compound content and piezoelectric constant $d_{31}$ in a piezoelectric layer in Example 9.

FIG. 8 indicates the relation between the Pb-containing complex perovskite compound content and the piezoelectric constant $d_{31}$ in the piezoelectric layer in Example 9. From FIG. 8, it is found that in the case of the piezoelectric material in which Pb(Ni$_{1/3}$Nb$_{2/3}$)O$_3$ has been added to PZT (Zr/Ti=40/60), the piezoelectric constant $d_{31}$ exhibits a value as high as or higher than 170 pc/N when the Pb-containing complex perovskite compound content is from 1 mol % to 50 mol %. In this piezoelectric material, particularly when the Pb-containing complex perovskite compound content is from 10 mol % to 25 mol %, the piezoelectric constant $d_3$ is 200 pc/N or higher, meaning that quite favorable piezoelectric characteristics are obtained.

EXAMPLE 10

In Example 10, a 4-inch silicon wafer having a thickness of 0.5 mm was used as the substrate, a titanium film having a thickness of 0.01 μm was used as the adhesive layer, an Ir film having a thickness of 0.25 μm and containing 5 mol % of cobalt oxide was used as the first electrode layer, a PLT film having a thickness of 0.007 μm and containing 10 mol % of lanthanum in which the lead content was 10 mol % in excess of the stoichiometric composition was used as the orientation control layer, a 0.95PZT(Zr/Ti=60/40)–0.05Pb(Fe$_{1/2}$Nb$_{1/2}$)O$_3$ film having a thickness of 3.2 μm was used as the piezoelectric layer, and a Pt film having a thickness of 0.01 μm was used as the second electrode layer.

The adhesive layer was obtained by using a Ti target and applying a high-frequency power of 100 W thereto for 1 minute while heating the substrate to 500° C. in an argon gas at 1 Pa.

The first electrode layer was obtained by using a Co target and an Ir target and applying high-frequency powers of 90 W and 200 W thereto, respectively, for 12 minutes while heating the substrate to 400° C. in a mixed atmosphere of argon and oxygen (gas volume ratio: Ar:O$_2$=10:1) at 1 Pa, using a multi-target sputtering apparatus.

The orientation control layer was obtained by using a sinter target prepared by adding a 14 mol % excess of lead oxide (PbO) to PLT containing 10 mol % of lanthanum and applying a high-frequency power of 300 W thereto for 3 minutes at a substrate temperature of 600° C. in a mixed atmosphere of argon and oxygen (gas volume ratio: Ar:O$_2$=15:1) at a degree of vacuum of 0.84 Pa.

The piezoelectric layer was obtained by using a sinter target of 0.95PZT(Zr/Ti=60/40)–0.05Pb(Fe$_{1/2}$Nb$_{1/2}$)O$_3$ to which a 15 mol % excess of PbO was added, and applying a high-frequency power of 270 W thereto for 3 hours at a substrate temperature of 620° C. in a mixed atmosphere of argon and oxygen (gas volume ratio: Ar:O$_2$=19:1) at a degree of vacuum of 0.4 Pa.

The second electrode layer was obtained by using a Pt target and applying a high-frequency power of 200 W thereto at a room temperature in an argon gas at 1 Pa.

In Example 10 also, no crack or peeling off was observed for any of the films of the piezoelectric element immediately after its manufacture.

Then, the crystal orientation and the film composition of the piezoelectric layer before the formation of the second electrode layer were examined, indicating that the piezoelectric layer had a (111)-oriented rhombohedral perovskite crystalline structure (degree of (111) orientation: α=96%). Moreover, an examination of the composition of the piezoelectric layer showed that the Zr/Ti ratio was 60/40 and the Ni/Nb ratio was 50/50 as in the target composition. Furthermore, the value of the ratio of the average cross-sectional diameter of the crystal grains extending in the thickness direction of the piezoelectric layer to the length thereof was about 1/20.

Then, the crystal orientation and the film composition of the first electrode layer before the formation of the orientation control layer were examined, indicating that the Ir film was oriented along the (111) plane. Moreover, the cobalt oxide content was 5 mol %.

Then, the crystal orientation and the film composition of the orientation control layer before the formation of the piezoelectric layer were examined, indicating that the PLT film had a (111)-oriented perovskite crystalline structure. Note that a region oriented in a direction other than along the (111) plane was observed on one side of the orientation control layer that is closer to the first electrode layer. It is believed that the region oriented in a direction other than along the (111) plane exists over a portion of the surface of the first electrode layer where cobalt oxide exists. Moreover, 10 mol % of lanthanum was contained, and a 10 mol % excess of Pb was contained.

Next, before the formation of the second electrode layer, 100 cantilevers having a size of 15 mm×2 mm were cut out by dicing. Then, the second electrode layer having a thickness of 0.01 μm was formed thereon by a sputtering method, and the piezoelectric constant d$_{31}$ was measured. The average piezoelectric constant of the 100 cantilevers was −180 pC/N (deviation: σ=3.4%).

Then, the second electrode layer of the piezoelectric element was formed as 65 pieces of Pt film each having a size of 1 mm×1 mm and a thickness of 0.01 μm and arranged at an interval of 10 mm by a sputtering method using a metal mask. The breakdown voltage was measured by applying a voltage between each second electrode layer and the first electrode layer. As a result, the average breakdown voltage value was 106 V (deviation: σ=3.7%).

Next, the elements A and B in 0.95PZT(Zr/Ti=60/40)–0.05Pb(A$_{1/2}$B$_{1/2}$)O$_3$ were changed as shown in Table 11 to examine the degree of (111) orientation, the piezoelectric constant d$_{31}$, and the breakdown voltage of the piezoelectric layers. The results were as shown in Table 11.

TABLE 11

| A  | B  | Degree of (111) orientation (%) | d$_{31}$(pC/N) | Breakdown voltage (V) |
|----|----|---|------|-----|
| Fe | Nb | 96 | −180 | 106 |
| Cr | Nb | 92 | −171 | 102 |
| In | Nb | 89 | −168 | 102 |
| Y  | Nb | 90 | −170 | 104 |
| Sb | Nb | 90 | −173 | 105 |
| Fe | Ta | 95 | −175 | 109 |
| Cr | Ta | 92 | −167 | 107 |

From the results, it can be said that in all of the cases the degree of (111) orientation is greater than or equal to 80% (greater than or equal to 90% in most cases) and the piezoelectric constant d$_{31}$ and the breakdown voltage are quite favorable.

EXAMPLE 11

In Example 11, a 4-inch silicon wafer having a thickness of 0.3 mm was used as the substrate, the first electrode layer was formed directly on the substrate without providing the adhesive layer therebetween, a Pt film having a thickness of 0.22 μm and containing 2.1 mol % of Mn was used as the first electrode layer, a PLZT film (to which 3 mol % of magnesium was added) having a thickness of 0.008 μm and containing 12 mol % of lanthanum and 15 mol % of zirconium in which the lead content was 18 mol % in excess of the stoichiometric composition was used as the orientation control layer, a 0.85PZT (Zr/Ti=45/55)–0.15Pb(Zn$_{1/2}$Te$_{1/2}$)O$_3$ film having a thickness of 3 μm was used as the piezoelectric layer, and a Pt film having a thickness of 0.2 μm was used as the second electrode layer.

The first electrode layer was obtained by using a Mn target and a Pt target and applying high-frequency powers of 85 W and 200 W thereto, respectively, for 12 minutes while heating the substrate to 400° C. in an argon gas at 1 Pa, using a multi-target sputtering apparatus.

The orientation control layer was obtained by using a sinter target, which was prepared by adding 3 mol % of magnesium and a 24 mol % excess of lead oxide (PbO) to PLZT containing 14 mol % of lanthanum and 15 mol % of zirconium, and applying a high-frequency power of 300 W thereto for 3 minutes at a substrate temperature of 600° C. in a mixed atmosphere of argon and oxygen (gas volume ratio: Ar:O$_2$=19:1) at a degree of vacuum of 0.8 Pa.

The piezoelectric layer was obtained by using a sinter target of 0.85PZT(Zr/Ti=45/55)–0.15Pb(Zn$_{1/2}$Te$_{1/2}$)O$_3$ to which a 15 mol % excess of PbO was added, and applying a high-frequency power of 250 W thereto for 3 hours at a substrate temperature of 610° C. in a mixed atmosphere of argon and oxygen (gas volume ratio: $Ar:O_2$=19:1) at a degree of vacuum of 0.3 Pa.

The second electrode layer was obtained by using a Pt target and applying a high-frequency power of 200 W thereto at a room temperature in an argon gas at 1 Pa.

In Example 11 also, no crack or peeling off was observed for any of the films of the piezoelectric element immediately after its manufacture.

Then, the crystal orientation and the film composition of the piezoelectric layer before the formation of the second electrode layer were examined, indicating that the piezoelectric layer had a (111)-oriented tetragonal perovskite crystalline structure (degree of (111) orientation: α=91%). Moreover, an examination of the composition of the piezoelectric layer showed that the Zr/Ti ratio was 45/55 and the Mg/Nb ratio was 50/50 as in the target composition. Furthermore, an observation of the crystalline structure by a SEM showed that the value of the ratio of the average cross-sectional diameter of the crystal grains extending in the thickness direction of the piezoelectric layer to the length thereof was about 1/30.

Then, the crystal orientation and the film composition of the first electrode layer before the formation of the orientation control layer were examined, indicating that the Pt film was oriented along the (111) plane. Moreover, the Mn content was 2.1 mol %.

Then, the crystal orientation and the film composition of the orientation control layer before the formation of the piezoelectric layer were examined, indicating that the PLZT film had a (111)-oriented perovskite crystalline structure. Note that a region oriented in a direction other than along the (111) plane was observed on one side of the orientation control layer that is closer to the first electrode layer. It is believed that the region oriented in a direction other than along the (111) plane exists over a portion of the surface of the first electrode layer where manganese exists. Moreover, 3 mol % of magnesium and 12 mol % of lanthanum were contained, and a 18 mol % excess of Pb was contained.

Next, before the formation of the second electrode layer, 100 cantilevers having a size of 15 mm×2 mm were cut out by dicing. Then, the second electrode layer having a thickness of 0.2 μm was formed thereon by a sputtering method, and the piezoelectric constant $d_{31}$ was measured. The average piezoelectric constant of the 100 cantilevers was −185 pC/N (deviation: σ=4.1%).

Then, the second electrode layer of the piezoelectric element was formed as 65 pieces of Pt film each having a size of 1 mm×1 mm and a thickness of 0.2 μm and arranged at an interval of 10 mm by a sputtering method using a metal mask. The breakdown voltage was measured by applying a voltage between each second electrode layer and the first electrode layer. As a result, the average breakdown voltage value was 98 V (deviation: σ=4.1%).

Next, the elements A and B in 0.85PZT(Zr/Ti=45/55)−0.15Pb($A_{1/2}B_{1/2}$)$O_3$ were changed as shown in Table 12 to examine the degree of (111) orientation, the piezoelectric constant $d_{31}$, and the breakdown voltage of the piezoelectric layers. The results were as shown in Table 12.

TABLE 12

| A | B | Degree of (111) orientation (%) | $d_{31}$(pC/N) | Breakdown voltage (V) |
|---|---|---|---|---|
| Mn | Te | 94 | −170 | 105 |
| Ni | Te | 91 | −165 | 105 |
| Co | Te | 89 | −168 | 102 |
| Mg | Te | 91 | −167 | 107 |
| Zn | Te | 91 | −185 | 98 |
| Mn | W | 92 | −172 | 100 |
| Ni | W | 90 | −166 | 102 |
| Co | W | 90 | −165 | 103 |
| Mg | W | 93 | −166 | 105 |
| Zn | W | 90 | −173 | 104 |

From the results, it can be said that in all of the cases the degree of (111) orientation is greater than or equal to 80% (greater than or equal to 90% in most cases) and the piezoelectric constant $d_{31}$ and the breakdown voltage are quite favorable.

COMPARATIVE EXAMPLE 2

A piezoelectric element of Comparative Example 2 is different from that of Example 7 only in that an orientation control layer is not provided. In the piezoelectric element of Comparative Example 2, an adhesive layer, a first electrode layer, a piezoelectric layer, and a second electrode layer are formed on a substrate in this order.

The piezoelectric layer of the piezoelectric element of Comparative Example 2 had a (111)-oriented rhombohedral perovskite crystalline structure (degree of (111) orientation: α=73%).

Moreover, the piezoelectric constant $d_{31}$ was measured as in Example 1, indicating that the average piezoelectric constant was −138 pC/N (deviation: σ=7.8%).

Furthermore, the breakdown voltage was measured as in Example 1, indicating that the average breakdown voltage value was 80 V (deviation: σ=8.1%).

It is thus understood that, just by providing the orientation control layer as in Example 7, it is possible to improve the crystallinity and the orientation of the piezoelectric layer, and to stably improve the piezoelectric characteristics and the breakdown voltage of the piezoelectric element.

EXAMPLE 12

A piezoelectric element of Example 12 is different from that of Example 7 only in the material of the orientation control layer. (Note that the sputtering conditions for the orientation control layer of Example 12 are the same as those of Example 7). Specifically, the orientation control layer of Example 12 is made of lead titanate (PT) not containing La. The lead content of the orientation control layer is not in excess of the stoichiometric composition.

The piezoelectric layer of the piezoelectric element of Example 12 had a (111)-oriented rhombohedral perovskite crystalline structure (degree of (111) orientation: α=80%). Moreover, the average piezoelectric constant was −149 pC/N (deviation: σ=5.5%). Furthermore, the average breakdown voltage value was 90 V (deviation: σ=7.9%).

It is thus understood that, even with such an orientation control layer of Example 12, it is possible to improve the orientation of the piezoelectric layer and to improve the piezoelectric constant and the breakdown voltage as compared with the piezoelectric element of Comparative Example 2.

Furthermore, as seen from the comparison with Example 7, by adding lanthanum to the orientation control layer and excessively providing Pb, the orientation of the piezoelectric layer is significantly improved.

Embodiment 3

Figure 9:
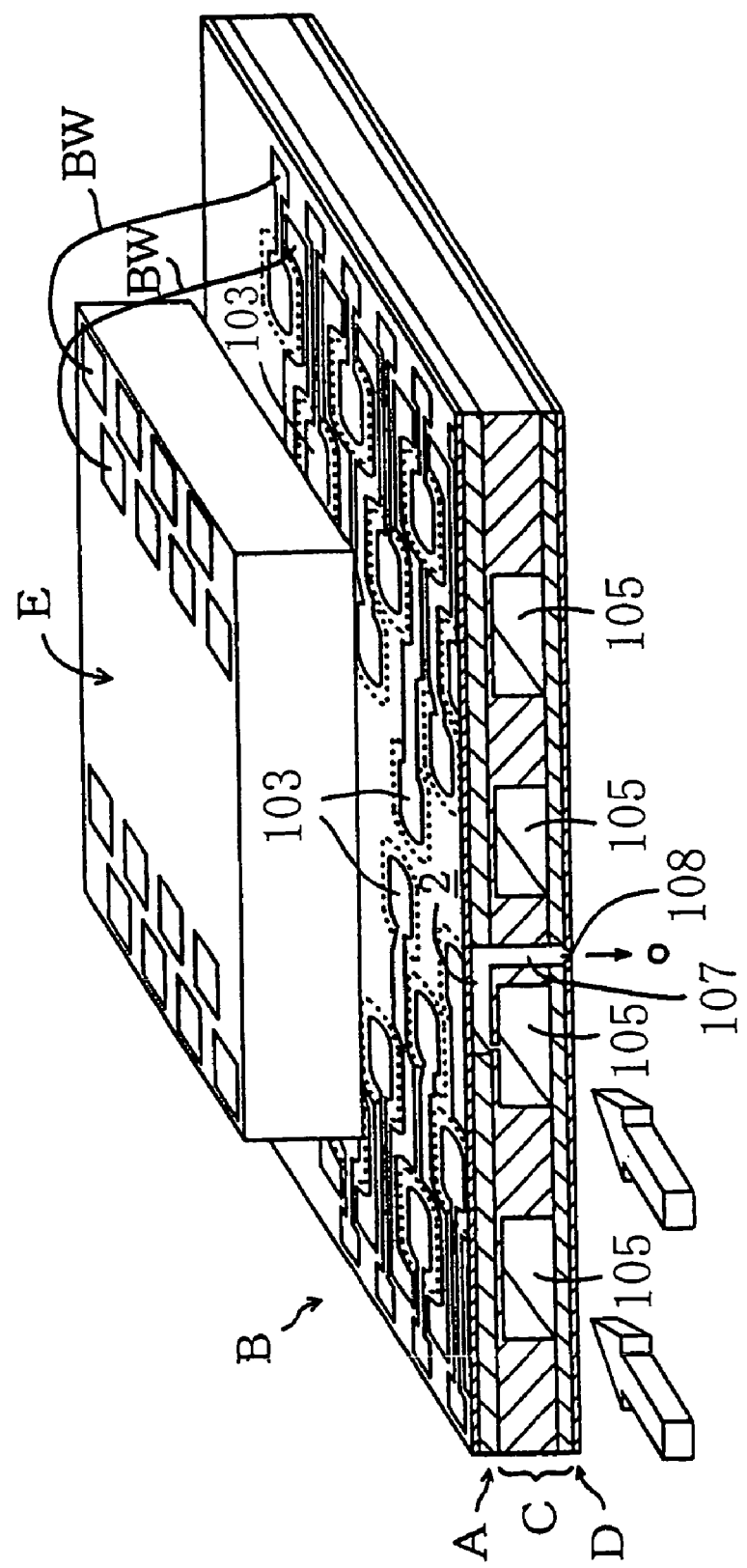
FIG. 9 is a perspective view illustrating the general structure of an ink jet head according to an embodiment of the present invention.
Figure 10:
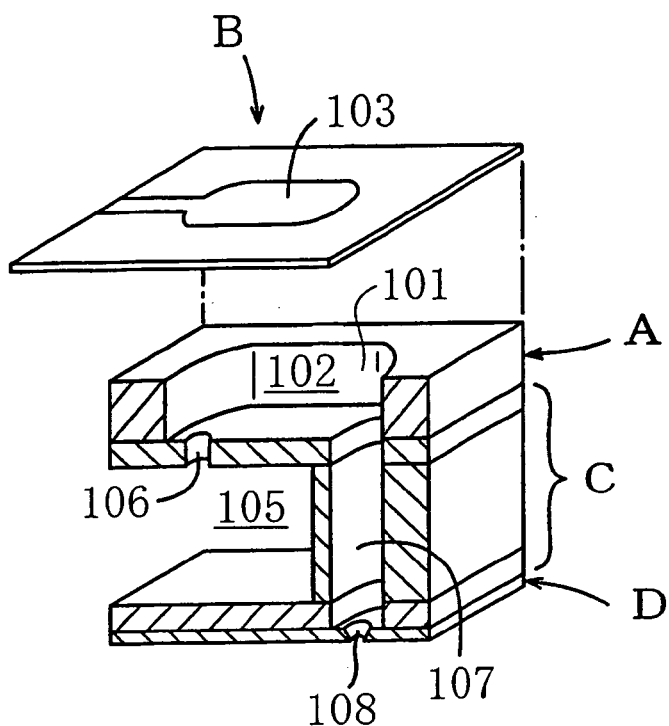
FIG. 10 is an exploded perspective view illustrating an important part of a pressure chamber member and an actuator section of the ink jet head of FIG. 9.

FIG. 9 illustrates the general structure of an ink jet head according to an embodiment of the present invention, and FIG. 10 illustrates the structure of an important part thereof. In FIG. 9 and FIG. 10, the reference character A denotes a pressure chamber member. A pressure chamber cavity 101 is formed running through the pressure chamber member A in the thickness direction (vertical direction) thereof. The reference character B denotes an actuator section placed so as to cover the upper opening of the pressure chamber cavity 101, and the reference character C denotes an ink channel member placed so as to cover the lower opening of the pressure chamber cavity 101. Each pressure chamber cavity 101 of the pressure chamber member A is closed by the actuator section B and the ink channel member C, placed on and under the pressure chamber member A, respectively, thereby forming a pressure chamber 102.

The actuator section B includes a first electrode layer 103 (separate electrode) above each pressure chamber 102. The position of the first electrode layer 103 generally corresponds to that of the pressure chamber 102. As can be seen from FIG. 9, a large number of pressure chambers 102 and first electrode layers 103 are arranged in a staggered pattern.

The ink channel member C includes a common ink chamber 105 shared by a number of pressure chambers 102 arranged in the ink supply direction, a supply port 106 through which ink in the common ink chamber 105 is supplied into the pressure chamber 102, and an ink channel 107 through which ink in the pressure chamber 102 is discharged.

The reference character D denotes a nozzle plate. The nozzle plate D includes nozzle holes 108 each of which is communicated to the ink channel 107. Moreover, the reference character E denotes an IC chip. A voltage is supplied from the IC chip E to each separate electrode 103 via a bonding wire BW.

Figure 11:
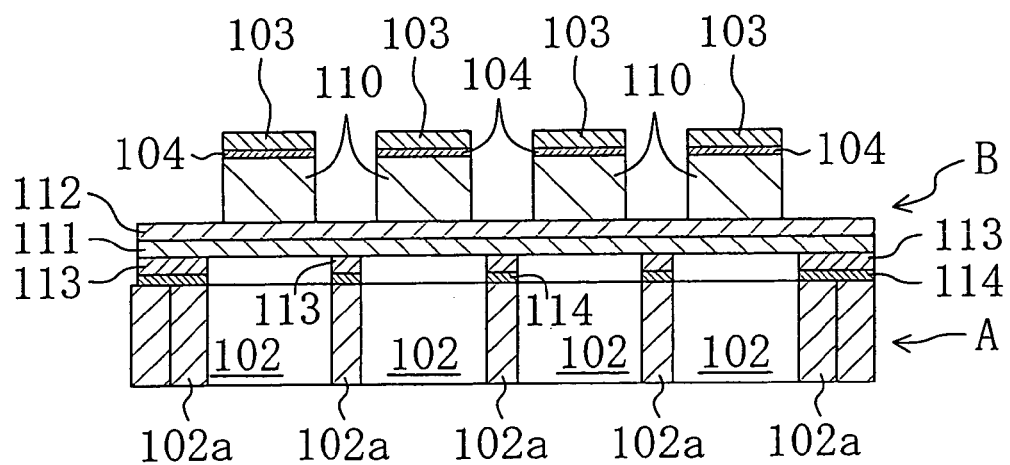
FIG. 11 is a cross-sectional view illustrating an important part of a pressure chamber member and an actuator section of the ink jet head of FIG. 9.

Next, the structure of the actuator section B will be described with reference to FIG. 11. FIG. 11 is a cross-sectional view taken along the direction perpendicular to the ink supply direction shown in FIG. 9. For the purpose of illustration, FIG. 11 shows the pressure chamber member A including four pressure chambers 102 arranged in the direction perpendicular to the ink supply direction. The actuator section B includes: the first electrode layers 103 each located above one pressure chamber 102 so that the position of the first electrode layer 103 generally corresponds to that of the pressure chamber 102, an orientation control layer 104 provided on (under, as shown in the figure) each first electrode layer 103, a piezoelectric layer 110 provided on (under) the orientation control layer 104, a second electrode layer 112 (common electrode) provided on (under) the piezoelectric layers 110 and shared by all the piezoelectric layers 110, a vibration layer 111 provided on (under) the second electrode layer 112, which is displaced and vibrates in the thickness direction by the piezoelectric effect of the piezoelectric layer 110, and an intermediate layer 113 (vertical wall) provided on (under) the vibration layer 111 and located above a partition wall 102a for partitioning the pressure chambers 102 from one another. The first electrode layer 103, the orientation control layer 104, the piezoelectric layer 110 and the second electrode layer 112 are arranged in this order to form a piezoelectric element. Moreover, the vibration layer 111 is provided on one surface of the piezoelectric element that is closer to the second electrode layer 112.

Note that in FIG. 11, the reference numeral 114 denotes an adhesive for bonding the pressure chamber member A and the actuator section B to each other. Therefore, even if a portion of the adhesive 114 runs out of the partition wall 102a in the adhesion process using the adhesive 114, the intermediate layer 113 functions to increase the distance between the upper surface of the pressure chamber 102 and the lower surface of the vibration layer 111 so that such a portion of the adhesive 114 does not attach to the vibration layer 111 and that the vibration layer 111 will be displaced and vibrate as intended. Thus, it is preferred that the pressure chamber member A is bonded to one surface of the vibration layer 111 of the actuator section B that is away from the second electrode layer 112 via the intermediate layer 113 therebetween. However, the pressure chamber member A may alternatively be bonded directly to one surface of the vibration layer 111 that is away from the second electrode layer 112.

The materials of the first electrode layer 103, the orientation control layer 104, the piezoelectric layer 110 and the second electrode layer 112 are similar to those of the first electrode layer 14, the orientation control layer 15, the piezoelectric layer 16 and the second electrode layer 17, respectively, of Embodiment 1, (although the contents of constituent elements may differ). Moreover, the structures of the orientation control layer 104 and the piezoelectric layer 110 are similar to those of the orientation control layer 15 and the piezoelectric layer 16, respectively. In the vicinity of one surface of the orientation control layer 104 that is closer to the first electrode layer 103, a (100)- or (001)-oriented region extends over titanium located on one surface of the first electrode layer 103 that is closer to the orientation control layer 104 so that the cross-sectional area of such a region in the direction perpendicular to the thickness direction gradually increases in the direction away from the first electrode layer 103 toward the piezoelectric layer 110. The crystal grains of the piezoelectric layer 110 are columnar grains which extend in the thickness direction of the piezoelectric layer 110 and in which the ratio of the average cross-sectional diameter to the length is from $\frac{1}{50}$ to $\frac{1}{14}$. It should be noted that the first electrode layer 103, the orientation control layer 104, the piezoelectric layer 110 and the second electrode layer 112 may have structures similar to those of the first electrode layer 24, the orientation control layer 25, the piezoelectric layer 26 and the second electrode layer 27, respectively, of Embodiment 2.

Next, a method for manufacturing the ink jet head excluding the IC chip E of FIG. 9, i.e., the ink jet head including the pressure chamber member A, the actuator section B, the ink channel member C and the nozzle plate D illustrated in FIG. 10, will be described.

As illustrated in FIG. 12A, an adhesive layer 121, the first electrode layer 103, the orientation control layer 104, the piezoelectric layer 110, the second electrode layer 112, the vibration layer 111 and the intermediate layer 113 are deposited in this order on a substrate 120 by a sputtering method. Note that the adhesive layer 121 is similar to the adhesive layer 12 of Embodiment 1, and is formed between the substrate 120 and the first electrode layer 103 in order to improve the adhesion therebetween (it may not always be necessary to form the adhesive layer 121). As will be described later, the adhesive layer 121 is subsequently removed as is the substrate 120. Moreover, Cr is used as the material of the vibration layer 111, and Ti is used as the material of the intermediate layer 113.

A cut-out Si substrate having a size of 18 mm×18 mm is used as the substrate 120. The substrate 120 is not limited to an Si substrate, but may alternatively be a glass substrate, a metal substrate, or a ceramic substrate. Moreover, the substrate size is not limited to 18 mm×18 mm, and a wafer having a diameter of 2 to 10 inches may be used as long as it is an Si substrate.

The adhesive layer 121 is obtained by using a Ti target and applying a high-frequency power of 100 W thereto for 1 minute while heating the substrate 120 to 400° C. in an argon gas at 1 Pa. The thickness of the adhesive layer 121 is 0.02 µm. Note that the material of the adhesive layer 121 is not limited to Ti, but may alternatively be tantalum, iron, cobalt, nickel, chromium, or a compound thereof (including Ti). Moreover, the thickness is not limited to any particular thickness as long as it is in the range of 0.005 to 0.2 µm.

The first electrode layer 103 is obtained by using a Ti target and a Pt target and applying high-frequency powers of 85 W and 200 W thereto, respectively, for 12 minutes while heating the substrate 120 to 600° C. in an argon gas at 1 Pa, using a multi-target sputtering apparatus. The first electrode layer 103 has a thickness of 0.2 µm, and is oriented along the (111) plane. Moreover, the Ti content is 2.5 mol %. As is the first electrode layer 14 of Embodiment 1, the first electrode layer 103 may be made of at least one noble metal selected from the group consisting of Pt, iridium, palladium and ruthenium to which a substance such as titanium is added (the amount of the substance to be added is preferably greater than zero and less than or equal to 30 mol %), and the thickness thereof is not limited to any particular thickness as long as it is in the range of 0.05 to 2 µm.

The orientation control layer 104 is obtained by using a sinter target prepared by adding a 15 mol % excess of lead oxide (PbO) to PLT containing 10 mol % of lanthanum and applying a high-frequency power of 300 W thereto for 12 minutes while heating the substrate 120 to 600° C. in a mixed atmosphere of argon and oxygen (gas volume ratio: $Ar:O_2=19:1$) at a degree of vacuum of 0.8 Pa. The obtained lead lanthanum titanate film has a perovskite crystalline structure containing 10 mol % of lanthanum and containing lead 10% in excess of the stoichiometric composition, and is oriented along the (100) or (001) plane over titanium located on one surface of the first electrode layer 103 that is closer to the orientation control layer 104 so that the cross-sectional area of the (100)- or (001)-oriented region gradually increases in the direction away from the first electrode layer 103 toward the other side (i.e., toward the piezoelectric layer 110). On the other hand, each region of the orientation control layer 104, which is located over a portion of the surface of the first electrode layer 103 where none of titanium and titanium oxide exist, is not oriented along the (100) or (001) plane, but such a region gradually shrinks toward the piezoelectric layer 110. In the present embodiment, the thickness of the orientation control layer 104 is 0.02 µm, whereby the (100)- or (001)-oriented region extends substantially across the entire surface of the orientation control layer 104 that is closer to the piezoelectric layer 110.

Note that as with the orientation control layer 15 of Embodiment 1, the La content of the orientation control layer 104 may be greater than zero and less than or equal to 25 mol %, and the lead content thereof may be in excess of the stoichiometric composition by an amount greater than zero and less than or equal to 30 mol %. Moreover, the material of the orientation control layer 104 may be PLZT obtained by adding zirconium to PLT (the zirconium content is preferably 20 mol % or less), or may be a material obtained by adding at least one of magnesium and manganese to PLT or PLZT (the amount of magnesium and manganese to be added is preferably greater than zero and less than or equal to 10 mol %). Moreover, the thickness of the orientation control layer 104 is not limited to any particular thickness as long as it is in the range of 0.01 to 0.2 µm.

The piezoelectric layer 110 is obtained by using a sinter target of $0.92PZT(Zr/Ti=55/45)–0.08Pb(Mg_{1/3}Nb_{2/3})O^3$ and applying a high-frequency power of 260 W thereto for 3 hours while heating the substrate 120 to 600° C. in a mixed atmosphere of argon and oxygen (gas volume ratio: $Ar:O_2=15:1$) at a degree of vacuum of 0.3 Pa. The obtained PMN-added PZT film has a rhombohedral perovskite crystalline structure, and is oriented along the (100) plane. Moreover, the thickness of the piezoelectric layer 110 is 3.1 µm. The PZT/PMN ratio in the piezoelectric layer 110 may be any ratio so long as it is in the range of 99/1 to 50/50. That is, the amount of PMN to be added to PZT may be greater than or equal to 1 mol % and less than or equal to 50 mol %. Note that the Zr/Ti composition of the PZT is not limited to any particular composition as long as it is in the range of 30/70 to 70/30, and the thickness thereof is not limited to any particular thickness as long as it is in the range of 1 to 5 µm. Moreover, the piezoelectric layer 110 may be made of a material obtained by adding the Pb-containing complex perovskite compound described in Embodiment 1 to PZT, or may be made of a material obtained by further adding an additive, such as Sr, Nb or Al, to the PZT that contains the Pb-containing complex perovskite compound.

The second electrode layer 112 is obtained by using a Pt target and applying a high-frequency power of 200 W thereto for 10 minutes at a room temperature in an argon gas at 1 Pa. The thickness of the second electrode layer 112 is 0.2 µm. Note that the material of the second electrode layer 112 is not limited to Pt as long as it is a conductive material, and the thickness thereof is not limited to any particular thickness as long as it is in the range of 0.1 to 0.4 µm.

The vibration layer 111 is obtained by using a Cr target and applying a high-frequency power of 200 W thereto for 6 hours at a room temperature in an argon gas at 1 Pa. The thickness of the vibration layer 111 is 3 µm. The material of the vibration layer 111 is not limited to Cr, but may alternatively be nickel, aluminum, tantalum, tungsten, silicon, or an oxide or nitride thereof (e.g., silicon dioxide, aluminum oxide, silicon nitride), etc. Moreover, the thickness of the vibration layer 111 is not limited to any particular thickness as long as it is in the range of 2 to 5 µm.

The intermediate layer 113 is obtained by using a Ti target and applying a high-frequency power of 200 W thereto for 5 hours at a room temperature in an argon gas at 1 Pa. The thickness of the intermediate layer 113 is 5 µm. The material of the intermediate layer 113 is not limited to Ti, but may alternatively be any suitable conductive metal material such as Cr. Moreover, the thickness of the intermediate layer 113 is not limited to any particular thickness as long as it is in the range of 3 to 10 µm.

On the other hand, the pressure chamber member A is formed as illustrated in FIG. 12B. The pressure chamber member A is formed by using a substrate of a larger size than the Si substrate 120, e.g., a 4-inch wafer silicon substrate 130 (see FIG. 17). Specifically, a plurality of pressure chamber cavities 101 are first formed by patterning in the silicon substrate 130 (for forming the pressure chamber member). As can be seen from FIG. 12B, in the patterning process, the width of a partition wall 102b for partitioning pairs of four pressure chamber cavities 101 from one another is set to be about twice as large as that of the partition wall 102a for partitioning the pressure chamber cavities 101 from one another in each pair. Then, the patterned silicon substrate 130 is subjected to chemical etching, dry etching, or the like, to form four pressure chamber cavities 101 for each pair, thereby obtaining the pressure chamber member A.

Thereafter, the silicon substrate 120 (for depositing films thereon) after the deposition process and the pressure chamber member A are bonded to each other with an adhesive. The application of the adhesive is done by electrodeposition. Specifically, the adhesive 114 is first applied onto the bonding surface of the pressure chamber member A, i.e., the upper surface of the pressure chamber partition walls 102a and 102b, by electrodeposition, as illustrated in FIG. 12C. Specifically, although not shown, an Ni thin film having a thickness on the order of 100 Å such that light can pass therethrough is formed as a base electrode film on the upper surface of the partition walls 102a and 102b by a sputtering method, and then a patterned layer of the adhesive resin agent 114 is formed on the Ni thin film. In this process, the electrodeposition solution may be a solution obtained by adding 0 to 50% by weight of pure water to an acrylic resin aqueous dispersion, followed by thorough stirring and mixing. The Ni thin film is so thin that light can pass therethrough, so that it can easily be visually observed that the adhesive resin has completely attached to the silicon substrate 130 (for forming the pressure chamber member). Experimentally, preferred electrodeposition conditions include a solution temperature of about 25° C., a DC voltage of 30 V, and a voltage application time of 60 seconds, and an acrylic resin layer having a thickness of about 3 to 10 μm is electrodeposited under these conditions on the Ni thin film of the silicon substrate 130 (for forming the pressure chamber member).

Figure 17:
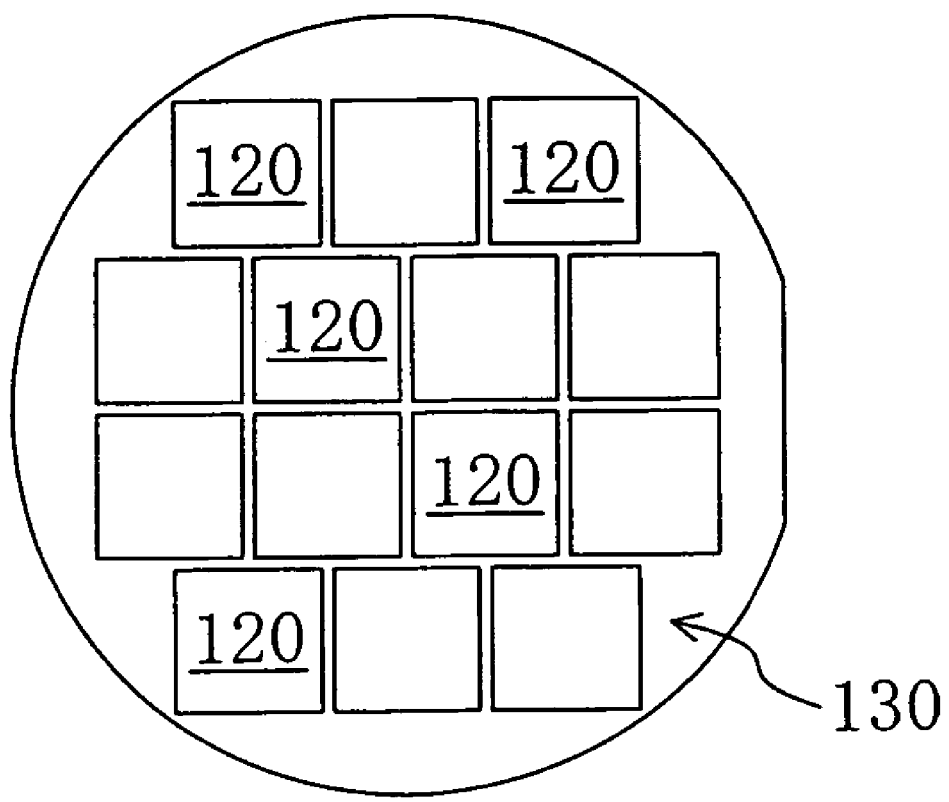
FIG. 17 is a plan view illustrating how Si substrates on which films have been deposited are bonded to an Si substrate for forming the pressure chamber member in the method for manufacturing the ink jet head of FIG. 9.

Then, as illustrated in FIG. 13A, the Si substrate 120 (for depositing films thereon) after the deposition process and the pressure chamber member A are bonded to each other with the electrodeposited adhesive 114. In the bonding process, the intermediate layer 113 deposited on the substrate 120 (for depositing films thereon) is used as the substrate-side bonding surface. Moreover, the Si substrate 120 (for depositing films thereon) has a size of 18 mm, whereas the Si substrate 130 for forming the pressure chamber member A is as large as 4 inches. Therefore, a plurality (14 in the example illustrated in FIG. 17) of Si substrates 120 (for depositing films thereon) are attached to a single pressure chamber member A (the Si substrate 130), as illustrated in FIG. 17. The attachment is done while the center of each Si substrate 120 (for depositing films thereon) is aligned with the center of the wide partition wall 102b of the pressure chamber member A, as illustrated in FIG. 13A. After the attachment, the pressure chamber member A is pressed against, and thus brought into close contact with, the Si substrate 120 (for depositing films thereon) so that they are bonded to each other fluid-tightly. Furthermore, the Si substrate 120 (for depositing films thereon) and the pressure chamber member A bonded to each other are gradually heated in a heating furnace so as to completely set the adhesive 114. Then, a plasma treatment is performed so as to remove excessive portions of the adhesive 114.

Note that although the Si substrate 120 (for depositing films thereon) after the deposition process and the pressure chamber member A are bonded to each other in FIG. 13A, the Si substrate 130 (for forming the pressure chamber member) before the formation of the pressure chamber cavities 101 may alternatively be bonded to the Si substrate 120 (for depositing films thereon) after the deposition process.

Figure 14A:
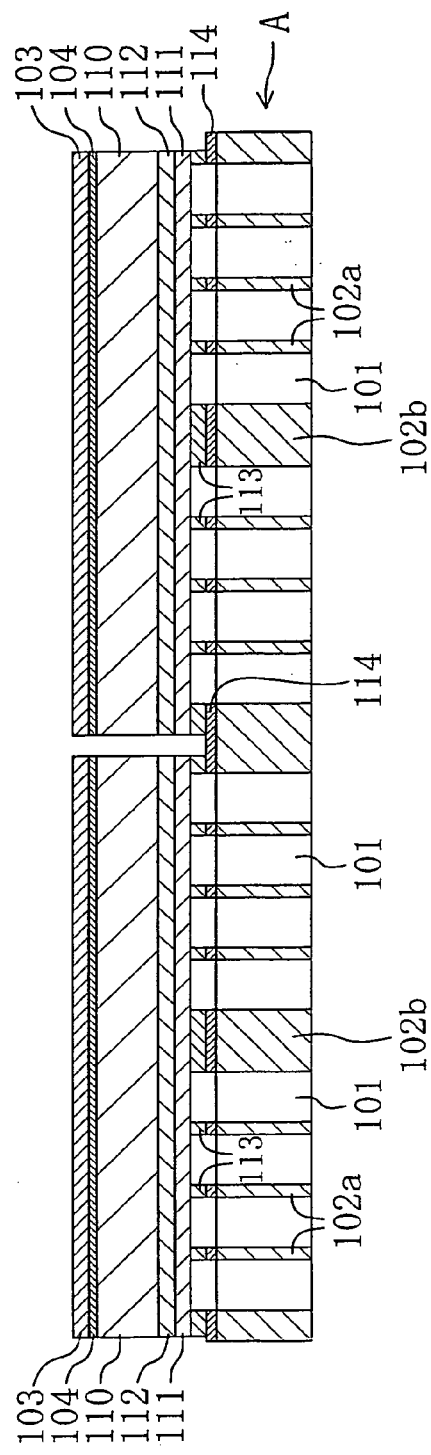
FIGS. 14A and 14B illustrate a step of removing a substrate (for depositing films thereon) and an adhesive layer, and a step of dividing a first electrode layer, respectively, in the method for manufacturing the ink jet head of FIG. 9.

Then, as illustrated in FIG. 13B, the intermediate layer 113 is etched into a predetermined pattern using the partition walls 102a and 102b of the pressure chamber member A as a mask (so that remaining portions of the intermediate layer 113 are continuous with the partition walls 102a and 102b (thus forming vertical walls)). Then, as illustrated in FIG. 14A, the Si substrate 120 (for depositing films thereon) and the adhesive layer 121 are removed by etching.

Figure 14B:
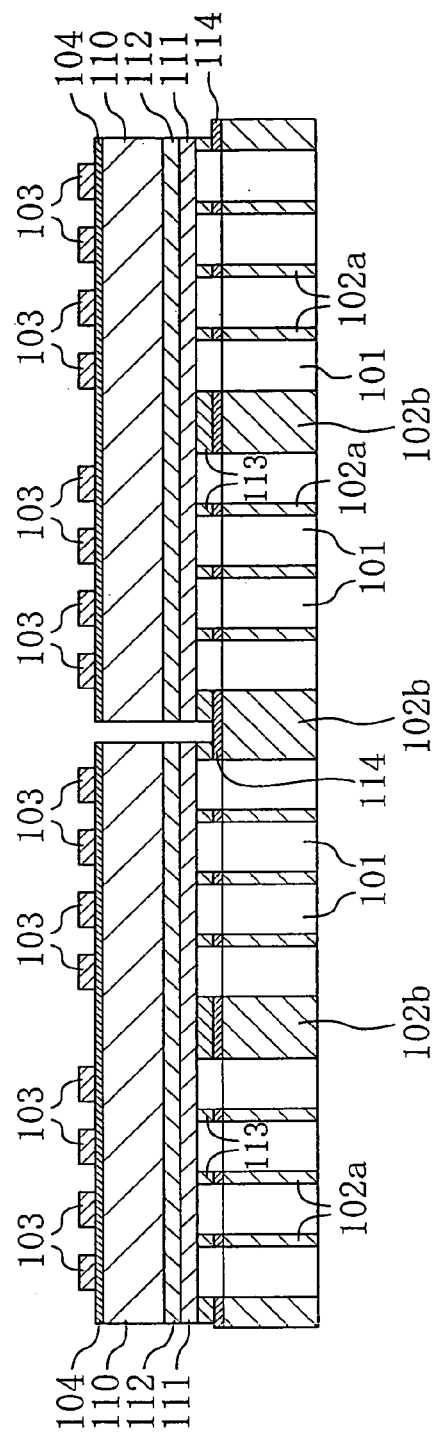

Then, as illustrated in FIG. 14B, the first electrode layer 103 located above the pressure chamber member A is etched by a photolithography technique so that the first electrode layer 103 is divided into portions each corresponding to one pressure chamber 102. Then, as illustrated in FIG. 15A, the orientation control layer 104 and the piezoelectric layer 110 are etched by a photolithography technique so as to be divided into portions arranged in a pattern similar to that of the first electrode layer 103. The remaining portions of the first electrode layer 103, the orientation control layer 104 and the piezoelectric layer 110 after the etching process are located above the respective pressure chambers 102. The center of the width of each of the first electrode layer 103, the orientation control layer 104 and the piezoelectric layer 110 precisely corresponds to the center of the width of the corresponding pressure chamber 102. Thus, the first electrode layer 103, the orientation control layer 104 and the piezoelectric layer 110 are divided into portions each corresponding to one pressure chamber 102, and then the silicon substrate 130 (for forming the pressure chamber member) is cut along the wide partition walls 102b, thereby obtaining four sets of the pressure chamber member A, each including four pressure chambers 102, and the actuator section B fixed to the upper surface of the pressure chamber member A, as illustrated in FIG. 15B.

Figure 16A:
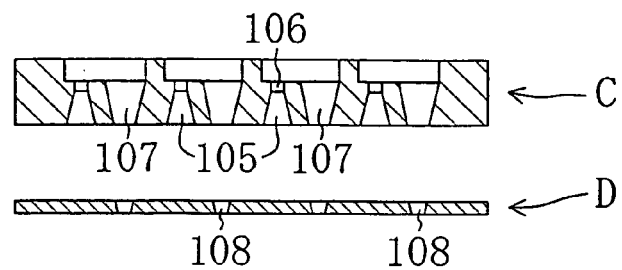
FIGS. 16A through 16D illustrate a step of producing an ink channel member and a nozzle plate, a step of bonding the ink channel member and the nozzle plate to each other, a step of bonding the pressure chamber member and the ink channel member to each other, and a completed ink jet head, respectively, in the method for manufacturing the ink jet head of FIG. 9.
Figure 16B:
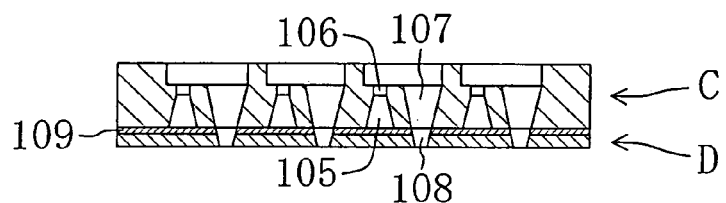

Then, as illustrated in FIG. 16A, the common ink chamber 105, the supply ports 106 and the ink channels 107 are formed in the ink channel member C, and the nozzle holes 108 are formed in the nozzle plate D. Then, as illustrated in FIG. 16B, the ink channel member C and the nozzle plate D are bonded together with an adhesive 109.

Figure 16C:
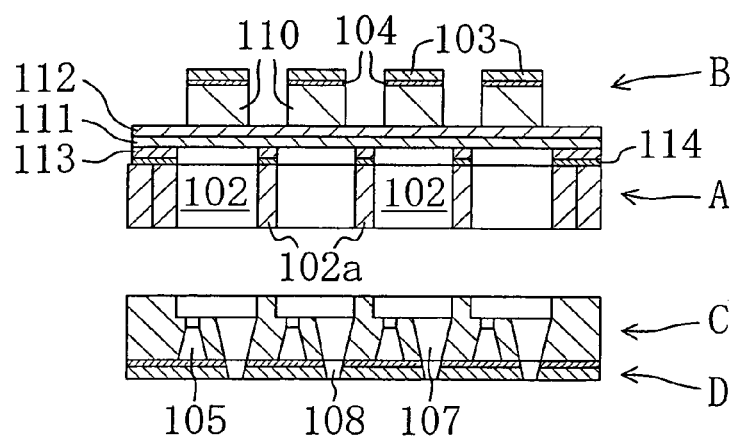
Figure 16D:
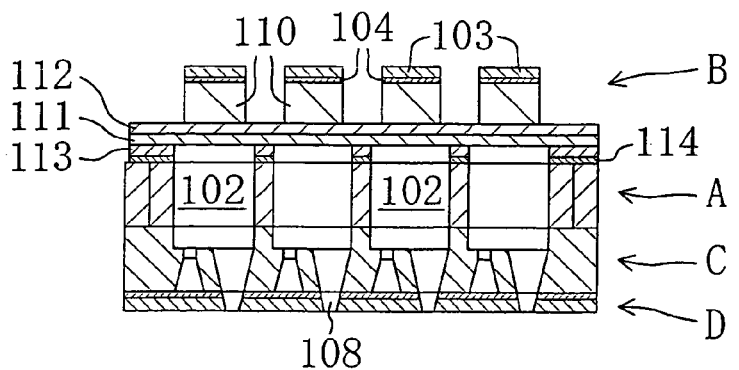

Then, as illustrated in FIG. 16C, an adhesive (not shown) is transferred onto the lower surface of the pressure chamber member A or the upper surface of the ink channel member C, and the pressure chamber member A and the ink channel member C are bonded together with this adhesive after they are aligned with each other. Through the process as described above, the ink jet head including the pressure chamber member A, the actuator section B, the ink channel member C and the nozzle plate D is completed, as illustrated in FIG. 16D.

When a predetermined voltage is applied between the first electrode layer 103 and the second electrode layer 112 of the ink jet head obtained as described above, the displacement occurs in the thickness direction of a portion of the vibration layer 111 corresponding to each pressure chamber 102 due to the piezoelectric effect of the piezoelectric layer 110, whereby ink in the pressure chamber 102 is discharged through the nozzle hole 108 communicated to the pressure chamber 102. The displacement in the thickness direction of a portion of the vibration layer 111 corresponding to the pressure chamber 102 was measured, indicating that the deviation in the displacement was σ=2.1%. Moreover, after applying a 20 V AC voltage having a frequency of 20 kHz for 10 days, deterioration in the ink-discharge performance was not observed with no ink-discharge defect.

On the other hand, an ink jet head similar to the ink jet head of the present invention was produced except only that the orientation control layer 104 was not provided. The displacement in the thickness direction of a portion of the vibration layer 111 corresponding to the pressure chamber 102 was measured while applying a predetermined voltage between the first electrode layer 103 and the second electrode layer 112 of the ink jet head. The deviation in the displacement was σ=7.9%. Moreover, after applying a 20 V AC voltage having a frequency of 20 kHz for 10 days, an ink-discharge defect was observed in locations corresponding to about 38% of all the pressure chambers 102. This defect was not due to clogging of ink or the like, but due to the occurrence of cracks in the piezoelectric layer 110. It is therefore believed that the actuator section B (the piezoelectric element) had a poor durability.

Thus, it can be seen that the ink jet head of the present embodiment has desirable durability and reliability with a small deviation in the ink-discharge performance.

Embodiment 4

Figure 18:
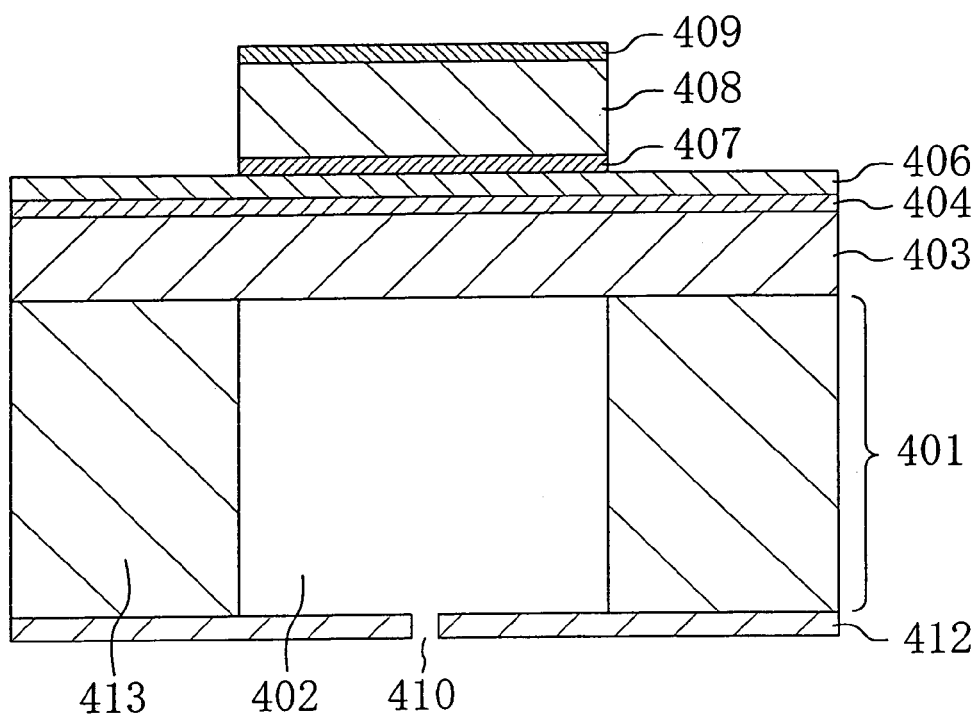
FIG. 18 is a cross-sectional view illustrating an important part of a pressure chamber member and an actuator section in another ink jet head according to an embodiment of the present invention.

FIG. 18 illustrates an important part of another ink jet head according to an embodiment of the present invention. In the ink jet head of the present embodiment, a substrate is used both for depositing films thereon and for forming the pressure chamber member, rather than using separate substrates, one for depositing films thereon and another for forming the pressure chamber member, as in the ink jet head of Embodiment 3.

Specifically, a vibration layer 403, an adhesive layer 404, a first electrode layer 406 (common electrode), an orientation control layer 407, a piezoelectric layer 408 and a second electrode layer 409 (separate electrode) are layered in this order on a pressure chamber substrate 401 (pressure chamber member) in which pressure chambers 402 have been formed by an etching process. The first electrode layer 406, the orientation control layer 407, the piezoelectric layer 408 and the second electrode layer 409 are arranged in this order to form a piezoelectric element. Moreover, the vibration layer 403 is provided on one surface of the piezoelectric element that is closer to the first electrode layer 406 via the adhesive layer 404. The adhesive layer 404 is provided for improving the adhesion between the vibration layer 403 and the first electrode layer 406, and may be omitted as the adhesive layer 121 of Embodiment 3. The materials of the first electrode layer 406, the orientation control layer 407, the piezoelectric layer 408 and the second electrode layer 409 are similar to those of the first electrode layer, the orientation control layer, the piezoelectric layer and the second electrode layer, respectively, of Example 9 described in Embodiment 2 (the contents of constituent elements in some of the materials are different). Moreover, the structures of the orientation control layer 407 and the piezoelectric layer 408 are similar to those of the orientation control layer and the piezoelectric layer, respectively, of Example 9. The crystal grains of the piezoelectric layer 408 are columnar grains which extend in the thickness direction of the piezoelectric layer 408 and in which the ratio of the average cross-sectional diameter to the length is from 1/50 to 1/14. It should be noted that the first electrode layer 406, the orientation control layer 407, the piezoelectric layer 408 and the second electrode layer 409 may have structures similar to those of the first electrode layer 14, the orientation control layer 15, the piezoelectric layer 16 and the second electrode layer 17, respectively, of Embodiment 1.

An Si substrate having a diameter of 4 inches and a thickness of 200 μm is used as the pressure chamber substrate 401. Also in this embodiment, the substrate 401 is not limited to an Si substrate, but may alternatively be a glass substrate, a metal substrate, or a ceramic substrate.

In the present embodiment, the vibration layer 403 has a thickness of 2.8 μm and is made of silicon dioxide. Note that the material of the vibration layer 403 is not limited to silicon dioxide, but may alternatively be any of those mentioned in Embodiment 3 (nickel, chromium, etc., or an oxide or nitride thereof). Moreover, the thickness of the vibration layer 403 is not limited to any particular thickness as long as it is in the range of 0.5 to 10 μm.

Next, a method for manufacturing the ink jet head as described above will be described with reference to FIGS. 19A and 19B.

Figure 19A:
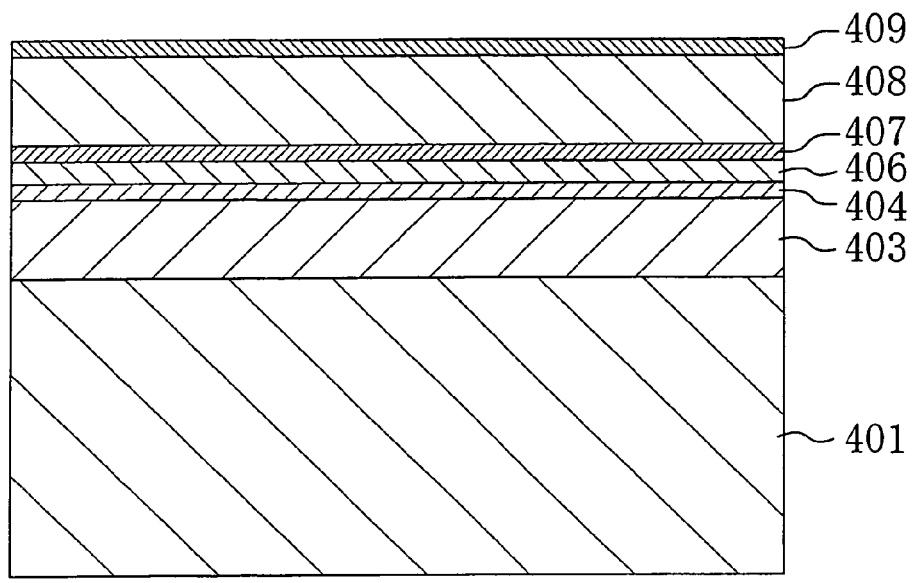
FIGS. 19A and 19B illustrate a deposition step, and a step of forming a pressure chamber, respectively, in a method for manufacturing the ink jet head of FIG. 18.

First, as illustrated in FIG. 19A, the vibration layer 403, the adhesive layer 404, the first electrode layer 406, the orientation control layer 407, the piezoelectric layer 408 and the second electrode layer 409 are formed in this order by a sputtering method on the pressure chamber substrate 401 on which the pressure chambers 402 have not been formed.

The vibration layer 403 is obtained by using a silicon dioxide sinter target and applying a high-frequency power of 300 W thereto for 8 hours at a room temperature without heating the pressure chamber substrate 401 in a mixed atmosphere of argon and oxygen at 0.4 Pa (gas volume ratio: $Ar:O_2=5:25$). Note that deposition method for the vibration layer 403 is not limited to a sputtering method, but may alternatively be a thermal CVD method, a plasma CVD method, a sol-gel method, or the like, or it may alternatively be formed through a thermal oxidization process on the pressure chamber substrate 401.

The adhesive layer 404 is obtained by using a Ti target and applying a high-frequency power of 100 W thereto for 1 minute while heating the pressure chamber substrate 401 to 400° C. in an argon gas at 1 Pa. The thickness of the adhesive layer 404 is 0.03 μm. Note that the material of the adhesive layer 404 is not limited to Ti, but may alternatively be tantalum, iron, cobalt, nickel, chromium, or a compound thereof (including Ti). Moreover, the thickness is not limited to any particular thickness as long as it is in the range of 0.005 to 0.1 μm.

The first electrode layer 406 was obtained by using an Ir target and applying a high-frequency power of 200 W thereto for 12 minutes while heating the pressure chamber substrate 401 to 600° C. in an argon gas at 1 Pa, using a sputtering apparatus. The first electrode layer 406 has a thickness of 0.15 μm, and is oriented along the (111) plane. In the first electrode layer 406, titanium or the like is not contained in the noble metal Ir, but as is the first electrode layer 14 of Embodiment 1, the first electrode layer 406 may be made of at least one noble metal selected from the group consisting of Pt, iridium, palladium and ruthenium, which contains titanium or the like (the content of titanium or the like is preferably greater than zero and less than or equal to 30 mol %), and the thickness thereof is not limited to any particular thickness as long as it is in the range of 0.05 to 2 μm.

The orientation control layer 407 is obtained by using a sinter target prepared by adding a 15 mol % excess of lead oxide (PbO) to PLT containing 10 mol % of lanthanum and applying a high-frequency power of 300 W thereto for 12 minutes while heating the pressure chamber substrate 401 to 620° C. in a mixed atmosphere of argon and oxygen (gas volume ratio: $Ar:O_2=19:1$) at a degree of vacuum of 0.8 Pa. The obtained lead lanthanum titanate film is the same as the orientation control layer of Example 9 and preferentially oriented along the (111) plane.

Note that as with the orientation control layer 15 of Embodiment 1, the La content of the orientation control layer 407 may be greater than zero and less than or equal to 25 mol %, and the lead content thereof may be in excess of the stoichiometric composition by an amount greater than zero and less than or equal to 30 mol %. Moreover, the material of the orientation control layer 407 may be PLZT obtained by adding zirconium to PLT (the zirconium content is preferably 20 mol % or less), or may be a material obtained by adding at least one of magnesium and manganese to PLT or PLZT (the amount of magnesium and manganese to be added is preferably greater than zero and less than or equal to 10 mol %). Moreover, the thickness of the orientation control layer 407 is not limited to any particular thickness as long as it is in the range of 0.01 to 0.2 µm.

The piezoelectric layer 408 is obtained by using a sinter target of $0.9PZT(Zr/Ti=48/52)-0.1Pb(Ni_{1/3}Nb_{2/3})O^3$ and applying a high-frequency power of 250 W thereto for 3 hours while heating the pressure chamber substrate 401 to 580° C. in a mixed atmosphere of argon and oxygen (gas volume ratio: $Ar:O_2=15:1$) at a degree of vacuum of 0.3 Pa. The obtained piezoelectric layer 408 has a thickness of 2.6 µm. The PZT/PNN ratio in the piezoelectric layer 408 may be any ratio so long as it is in the range of 99/1 to 50/50. Note that the Zr/Ti composition of the PZT is not limited to any particular composition as long as it is in the range of 30/70 to 70/30, and the thickness thereof is not limited to any particular thickness as long as it is in the range of 1 to 5 µm. Moreover, the piezoelectric layer 408 may be made of a material obtained by adding the Pb-containing complex perovskite compound described in Embodiment 1 to PZT, or may be made of a material obtained by further adding an additive, such as Sr, Nb or Al, to the PZT that contains the Pb-containing complex perovskite compound.

The second electrode layer 409 is obtained by using a Pt target and applying a high-frequency power of 200 W thereto for 10 minutes at a room temperature in an argon gas at 1 Pa. The thickness of the second electrode layer 409 is 0.2 µm. Note that the material of the second electrode layer 409 is not limited to Pt as long as it is a conductive material, and the thickness thereof is not limited to any particular thickness as long as it is in the range of 0.1 to 0.4 µm.

Then, a resist is applied by a spin coating method on the second electrode layer 409, and then patterned through exposure and development processes into a pattern corresponding to the pressure chambers 402 to be formed. Then, the second electrode layer 409, the piezoelectric layer 408 and the orientation control layer 407 are divided into portions by etching. The etching process is a dry etching process using a mixed gas of argon and an organic gas including fluorine element.

Figure 19B:
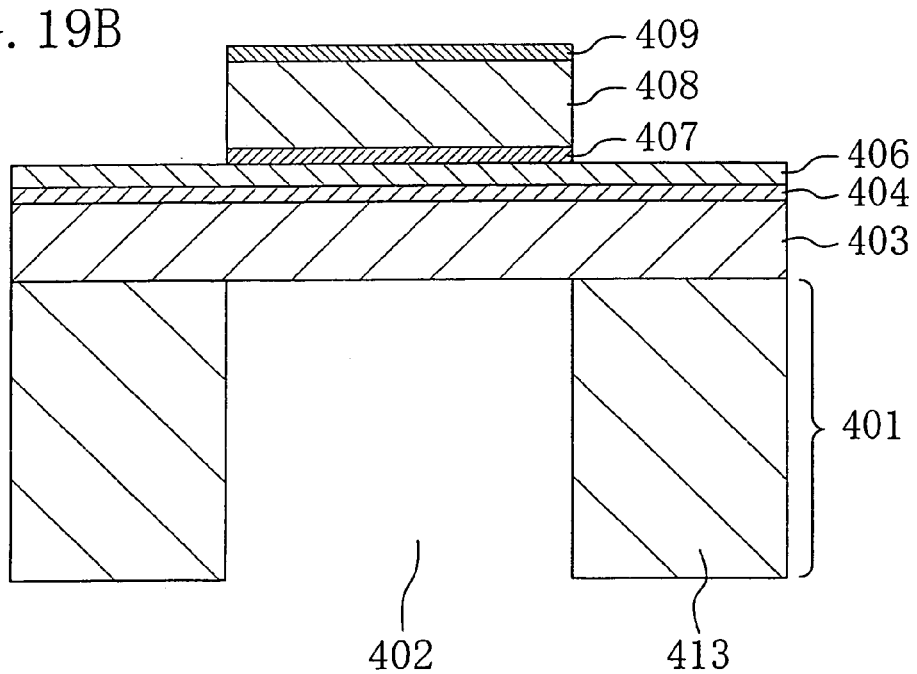

Then, as illustrated in FIG. 19B, the pressure chambers 402 are formed in the pressure chamber substrate 401. The pressure chambers 402 are formed by an anisotropic dry etching process using a sulfur hexafluoride gas, an organic gas including fluorine element, or a mixed gas thereof. Specifically, the pressure chambers 402 are formed by performing an anisotropic dry etching after forming an etching mask on one surface of the pressure chamber substrate 401 that is opposite to the other surface thereof on which various films have been formed so as to cover each portion thereof corresponding to a side wall 413 to be formed.

Then, a nozzle plate 412 with nozzle holes 410 formed therein is bonded with an adhesive to the surface of the pressure chamber substrate 401 that is opposite to the other surface thereof on which various films have been formed, thereby obtaining the ink jet head. The nozzle holes 410 are opened at predetermined positions in the nozzle plate 412 by a lithography method, a laser processing method, an electrical discharge machining method, or the like. Then, when the nozzle plate 412 is bonded to the pressure chamber substrate 401, they are aligned with each other so that the nozzle holes 410 correspond to the pressure chambers 402, respectively.

The displacement in the thickness direction of a portion of the vibration layer 403 corresponding to the pressure chamber 402 was measured while applying a predetermined voltage between the first electrode layer 406 and the second electrode layer 409 of an ink jet head obtained as described above. The deviation in the displacement was $\sigma=2.4\%$. Moreover, after applying a 20 V AC voltage having a frequency of 20 kHz for 10 days, deterioration in the ink-discharge performance was not observed with no ink-discharge defect.

On the other hand, an ink jet head similar to the ink jet head of the present invention was produced except only that the orientation control layer 407 was not provided. The displacement in the thickness direction of a portion of the vibration layer 403 corresponding to the pressure chamber 402 was measured while applying a predetermined voltage between the first electrode layer 406 and the second electrode layer 409 of the ink jet head. The deviation in the displacement was $\sigma=6.5\%$. Moreover, after applying a 20 V AC voltage having a frequency of 20 kHz for 10 days, an ink-discharge defect was observed in locations corresponding to about 35% of all the pressure chambers 402. This defect was not due to clogging of ink or the like, but due to the occurrence of cracks in the piezoelectric layer 408. It is therefore believed that the actuator section (the piezoelectric element) had a poor durability.

Thus, it can be seen that the ink jet head of the present embodiment has desirable durability and reliability and a small deviation in the ink-discharge performance, as the ink jet head of Embodiment 3.

Embodiment 5

Figure 20:
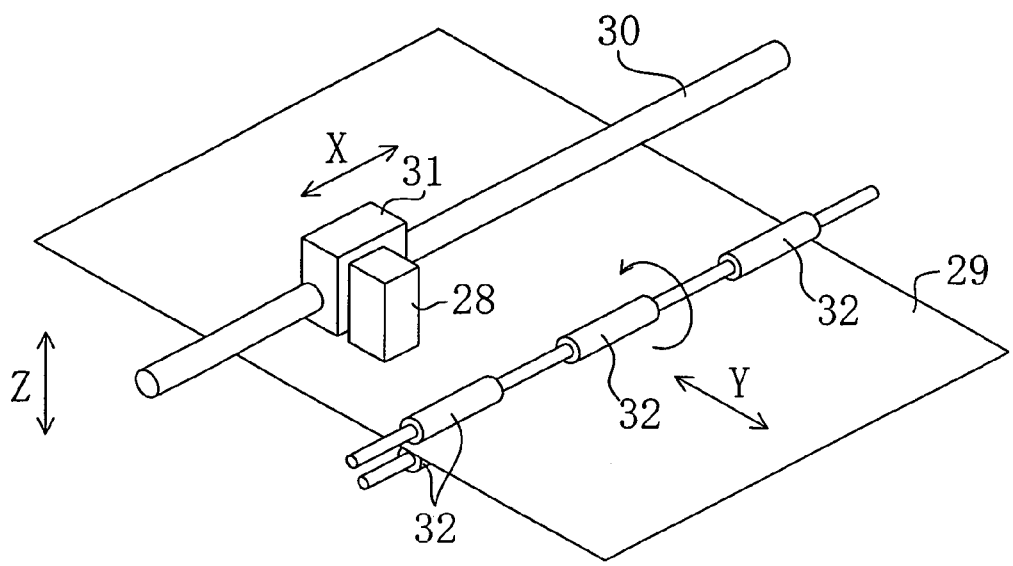
FIG. 20 is a schematic perspective view illustrating an ink jet recording apparatus according to an embodiment of the present invention.

FIG. 20 illustrates an ink jet recording apparatus 35 according to an embodiment of the present invention. The ink jet recording apparatus 35 includes an ink jet head 28, which is similar to the ink jet head of Embodiment 3 or 4. The ink jet head 28 is configured so that ink in each pressure chamber (the pressure chamber 102 of Embodiment 3 or the pressure chamber 402 of Embodiment 4) is discharged through a nozzle hole (the nozzle hole 108 of Embodiment 3 or the nozzle hole 410 of Embodiment 4), which is communicated to the pressure chamber, onto a recording medium 29 (e.g., recording paper) for recording information.

The ink jet head 28 is mounted on a carriage 31, which is provided on a carriage shaft 30 extending in the primary scanning direction X, and is reciprocated in the primary scanning direction X as the carriage 31 reciprocates along the carriage shaft 30. Thus, the carriage 31 forms relative movement means for relatively moving the ink jet head 28 and the recording medium 29 with respect to each other in the primary scanning direction X.

Moreover, the ink jet recording apparatus 35 includes a plurality of rollers 32 for moving the recording medium 29 in the secondary scanning direction Y, which is substantially perpendicular to the primary scanning direction X (width direction) of the ink jet head 28. Thus, the plurality of rollers 32 together form relative movement means for relatively moving the ink jet head 28 and the recording medium 29 with respect to each other in the secondary scanning direction Y. Note that in FIG. 20, arrow Z represents the vertical direction.

While the ink jet head 28 is moved by the carriage 31 from one side to the other in the primary scanning direction X, ink is discharged through the nozzle holes of the ink jet head 28 onto the recording medium 29. After one scan of recording operation, the recording medium 29 is moved by the rollers 32 by a predetermined amount, and then the next scan of recording operation is performed.

Since the ink jet recording apparatus 35 includes the ink jet head 28 similar to that of Embodiment 3 or 4, the ink jet recording apparatus 35 provides a desirable printing performance and durability.

Embodiment 6

Figure 21:
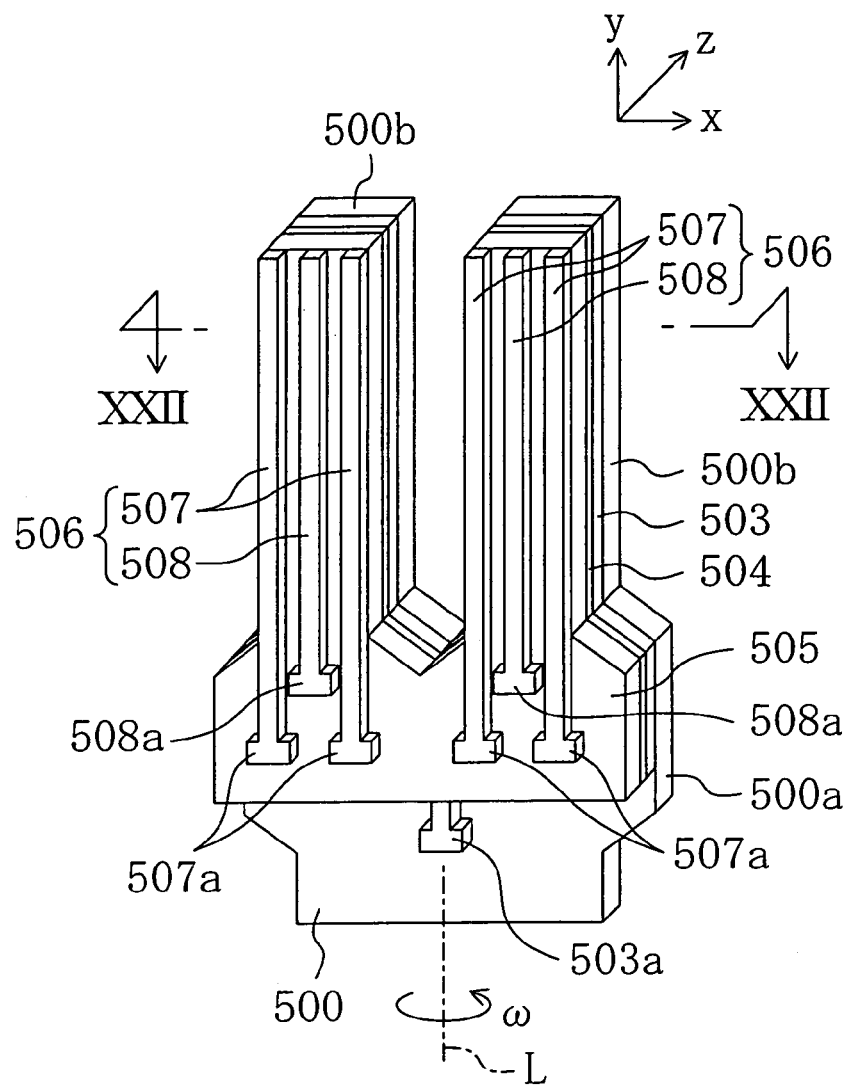
FIG. 21 is a schematic perspective view illustrating an angular velocity sensor according to an embodiment of the present invention.
Figure 22:
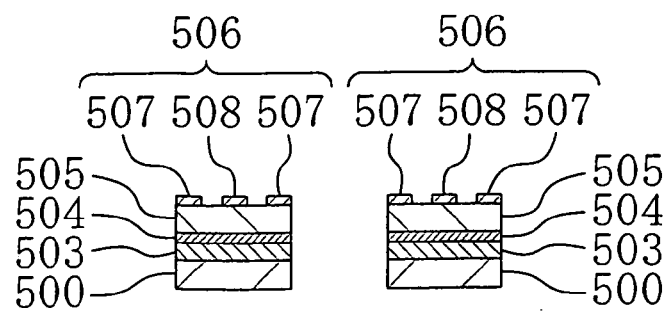
FIG. 22 is a cross-sectional view taken along line XXII-XXII of FIG. 21.

FIG. 21 and FIG. 22 illustrate an angular velocity sensor according to an embodiment of the present invention. The angular velocity sensor has a shape of a tuning fork, and can suitably be used in a vehicle-mounted navigation system, or the like.

The angular velocity sensor includes a substrate 500 made of a silicon wafer having a thickness of 0.3 mm (the substrate 500 may alternatively be a glass substrate, a metal substrate or a ceramic substrate). The substrate 500 includes a fixed portion 500a, and a pair of vibrating portions 500b extending from the fixed portion 500a in a predetermined direction (the direction of the rotation axis with respect to which the angular velocity is to be detected; the y direction in FIG. 21 in the present embodiment). The fixed portion 500a and the pair of vibrating portions 500b together form a shape of a tuning fork as viewed in the thickness direction of the substrate 500 (the z direction in FIG. 21), and the pair of vibrating portions 500b, corresponding to the arms of a tuning fork, extend in parallel to each other while being arranged next to each other in the width direction of the vibrating portions 500b.

A first electrode layer 503, an orientation control layer 504, a piezoelectric layer 505 and a second electrode layer 506 are layered in this order on the vibrating portions 500b of the substrate 500 and a portion of the fixed portion 500a close to the vibrating portions 500b. Note that also in the angular velocity sensor, it is preferred that an adhesive layer is provided between the substrate 500 and the first electrode layer 503, as in the piezoelectric element of Embodiment 1.

The first electrode layer 503, the orientation control layer 504, the piezoelectric layer 505 and the second electrode layer 506 are similar to the first electrode layer 14, the orientation control layer 15, the piezoelectric layer 16 and the second electrode layer 17, respectively, of Embodiment 1. Moreover, the structures of the orientation control layer 504 and the piezoelectric layer 505 are similar to those of the orientation control layer 15 and the piezoelectric layer 16, respectively. In the vicinity of one surface of the orientation control layer 504 that is closer to the first electrode layer 503, a (100)- or (001)-oriented region extends over titanium located on one surface of the first electrode layer 503 that is closer to the orientation control layer 504 so that the cross-sectional area of such a region in the direction perpendicular to the thickness direction gradually increases in the direction away from the first electrode layer 503 toward the piezoelectric layer 505. The crystal grains of the piezoelectric layer 505 are columnar grains which extend in the thickness direction of the piezoelectric layer 505 and in which the ratio of the average cross-sectional diameter to the length is from 1/50 to 1/14. It should be noted that the first electrode layer 503, the orientation control layer 504, the piezoelectric layer 505 and the second electrode layer 506 may have structures similar to those of the first electrode layer 24, the orientation control layer 25, the piezoelectric layer 26 and the second electrode layer 27, respectively, of Embodiment 2.

On each vibrating portion 500b, the second electrode layer 506 is patterned into three portions, i.e., two driving electrodes 507 for vibrating the vibrating portion 500b in the width direction thereof (the x direction in FIG. 21), and a detection electrode 508 for detecting a displacement (deflection) of the vibrating portion 500b in the thickness direction thereof (the z direction).

The two driving electrodes 507 extend along the lateral edges of the vibrating portion 500b that are opposing each other with respect to the width direction thereof (the x direction) and entirely across the vibrating portion 500b in the longitudinal direction thereof (the y direction). One end of each driving electrode 507 that is closer to the fixed portion 500a forms a connection terminal 507a on the fixed portion 500a. Note that only one driving electrode 507 may alternatively be provided on one of the opposite edges of each vibrating portion 500b.

On the other hand, the detection electrode 508 extends in the central portion of the vibrating portion 500b with respect to the width direction thereof and entirely across the vibrating portion 500b in the longitudinal direction thereof. As does the driving electrode 507, one end of the detection electrode 508 that is closer to the fixed portion 500a forms a connection terminal 508a on the fixed portion 500a. Note that a plurality of detection electrodes 508 may alternatively be provided on each vibrating portion 500b.

Note that the first electrode layer 503 forms a connection terminal 503a, extending away from the vibrating portion 500b, on the fixed portion 500a between the pair of vibrating portions 500b.

Applied between the first electrode layer 503 and the two driving electrodes 507 on the vibrating portion 500b is a voltage having a frequency that is resonant with the proper oscillation of the vibrating portion 500b so that the vibrating portion 500b vibrates in the width direction thereof. Specifically, two voltages of opposite polarity are applied to the two driving electrodes 507 while the ground voltage is applied to the first electrode layer 503, whereby when one lateral edge of the vibrating portion 500b expands, the other lateral edge contracts, and thus the vibrating portion 500b deforms toward the second lateral edge. On the other hand, when the first lateral edge of the vibrating portion 500b contracts, the second lateral edge expands, and thus the vibrating portion 500b deforms toward the first lateral edge. By repeating this operation, the vibrating portion 500b vibrates in the width direction thereof. Note that by applying a voltage to only one of the two driving electrodes 507 on each vibrating portion 500b, the vibrating portion 500b can be vibrated in the width direction thereof. The pair of vibrating portions 500b are configured so that they deform in opposite directions with respect to the width direction thereof and in symmetry with each other with respect to the center line L, which extends in the longitudinal direction of the vibrating portion 500b between the pair of vibrating portions 500b.

In the angular velocity sensor having such a configuration, if an angular velocity (O about the center line L is applied while the pair of vibrating portions 500b are being vibrated in the width direction thereof (the x direction) symmetrically with respect to the center line L, the two vibrating portions 500b are bent and deformed in the thickness direction (the z direction) by the Coriolis force (the pair of vibrating portions 500b are bent by the same amount but in opposite directions), thereby also bending the piezoelectric layer 505, and thus generating a voltage according to the magnitude of the Coriolis force between the first electrode layer 503 and the detection electrode 508. Then, the angular velocity co can be calculated based on the magnitude of the voltage (the Coriolis force).

The Coriolis force Fc is expressed as follows:

$$Fc = 2mv\omega,$$

where v denotes the velocity of each vibrating portion 500b in the width direction, and m denotes the mass of each vibrating portion 500b. Thus, the value of the angular velocity ω can be obtained from the Coriolis force Fc.

Next, a method for manufacturing the angular velocity sensor will be described with reference to FIGS. 23A through 23F and FIG. 24.

Figure 23A:
FIGS. 23A through 23F illustrate a method for manufacturing the angular velocity sensor of FIG. 21.
Figure 23B:
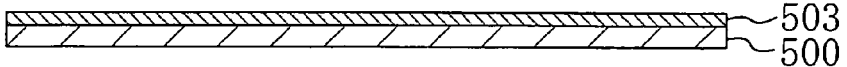
Figure 24:
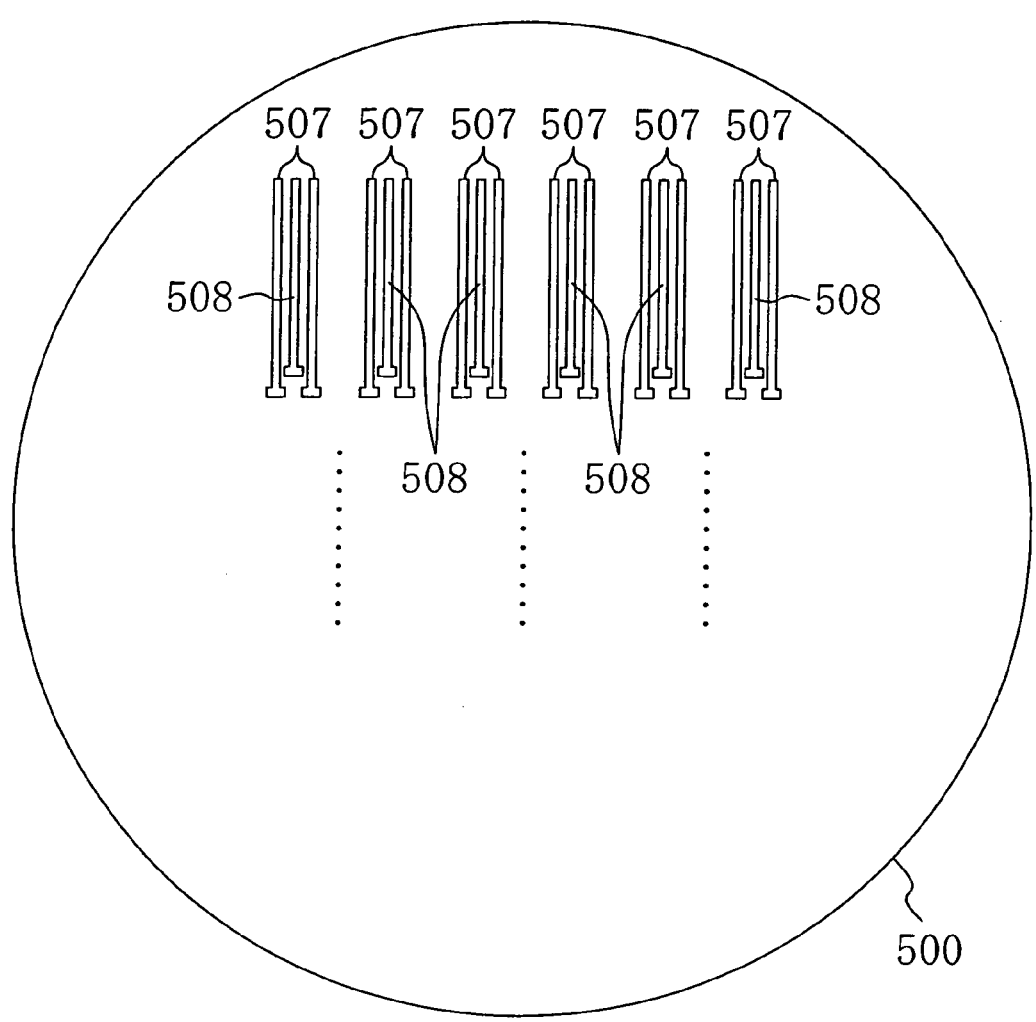
FIG. 24 is a plan view illustrating the method for manufacturing the angular velocity sensor after a second electrode layer is patterned.

As illustrated in FIG. 23A, the substrate 500 made of a 4-inch silicon wafer having a thickness of 0.3 mm is provided (see the plan view of FIG. 24). Then, as illustrated in FIG. 23B, the first electrode layer 503 is formed of iridium (Ir) to which 18 mol % of Ti is added on the substrate 500 by a sputtering method so as to have a thickness of 0.22 μm. The first electrode layer 503 is obtained by using a Ti target and an Ir target and applying high-frequency powers of 85 W and 200 W thereto, respectively, for 12 minutes while heating the substrate 500 to 400° C. in an argon gas at 1 Pa, using a multi-target sputtering apparatus. Titanium exists in a dotted pattern on a surface of the first electrode layer 503, and the titanium protrudes less than 2 nm from the surface.

Figure 23C:
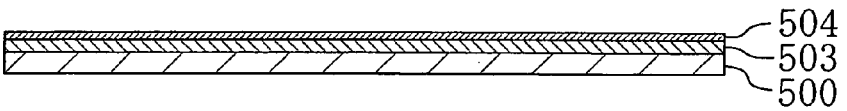

Then, as illustrated in FIG. 23C, the orientation control layer 504 is formed on the first electrode layer 503 by a sputtering method so as to have a thickness of 0.03 μm. The orientation control layer 504 is obtained by using a sinter target prepared by adding a 12 mol % excess of lead oxide (PbO) to PLT containing 14 mol % of lanthanum and applying a high-frequency power of 300 W thereto for 12 minutes while heating the substrate 500 to 600° C. in a mixed atmosphere of argon and oxygen (gas volume ratio: Ar:$O_2$=19:1) at a degree of vacuum of 0.8 Pa. According to this production method, as described above in Embodiment 1, in the vicinity of one surface of the orientation control layer 504 that is closer to the first electrode layer 503, a (100)- or (001)-oriented region extends over titanium so that the cross-sectional area of the region in the direction perpendicular to the thickness direction gradually increases in the upward direction away from the first electrode layer 503.

Figure 23D:
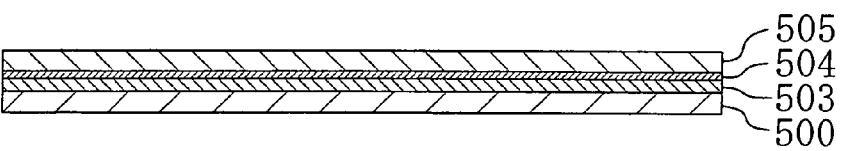

Then, as illustrated in FIG. 23D, the piezoelectric layer 505 is formed on the orientation control layer 504 by a sputtering method so as to have a thickness of 3.1 μm. The piezoelectric layer 505 is obtained by using a sinter target of 0.92PZT(Zr/Ti=55/45)–0.08Pb($Mg_{1/3}Nb_{2/3}$)$O^3$ and applying a high-frequency power of 250 W thereto for 3 hours while heating the substrate 500 to 610° C. in a mixed atmosphere of argon and oxygen (gas volume ratio: Ar:$O_2$=19:1) at a degree of vacuum of 0.3 Pa. The piezoelectric layer 505 is tetragonal, with the degree of (001) orientation thereof being 90% or more, as described in Embodiment 1. The PZT/PMN ratio in the piezoelectric layer 505 may be any ratio so long as it is in the range of 99/1 to 50/50. The Zr/Ti composition of the PZT may be any composition so long as it is in the range of 30/70 to 70/30. Furthermore, the piezoelectric layer 505 may have any thickness so long as it is in the range of 1 to 5 μm.

Figure 23E:
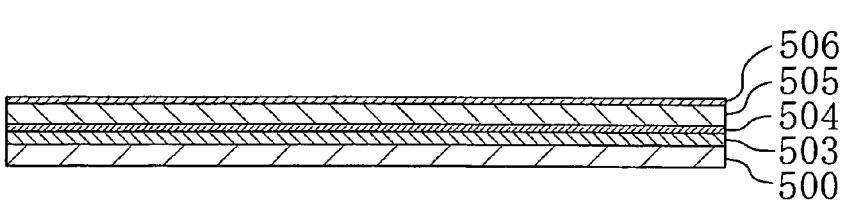

Then, as illustrated in FIG. 23E, the second electrode layer 506 is formed on the piezoelectric layer 505 by a sputtering method so as to have a thickness of 0.2 μm. The second electrode layer 506 is obtained by using a Pt target and applying a high-frequency power of 200 W thereto for 10 minutes at a room temperature in an argon gas at 1 Pa.

Figure 23F:
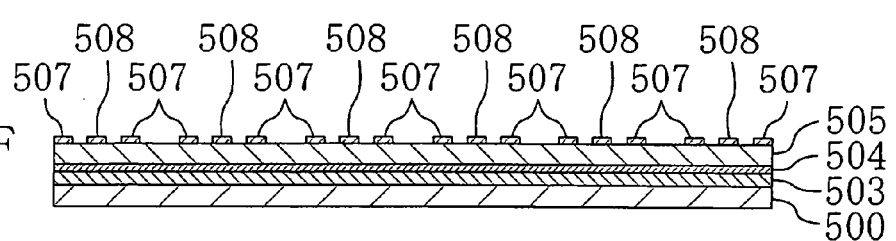

Then, as illustrated in FIG. 23F and FIG. 24, the second electrode layer 506 is patterned so as to form the driving electrodes 507 and the detection electrode 508. Specifically, a photosensitive resin is applied on the second electrode layer 506 and is exposed to light to form the pattern of the driving electrodes 507 and the detection electrode 508, and the unexposed portions of the photosensitive resin are removed. The second electrode layer 506 is etched and removed in locations where the photosensitive resin has been removed. Then, the photosensitive resin on the driving electrodes 507 and the detection electrode 508 is removed.

After patterning the second electrode layer 506, the piezoelectric layer 505, the orientation control layer 504 and the first electrode layer 503 are patterned in similar steps, and the substrate 500 is patterned, thereby forming the fixed portion 500a and the vibrating portions 500b. Thus, the angular velocity sensor is obtained.

Note that the deposition method for the various layers is not limited to a sputtering method, but may alternatively be any other suitable deposition method as long as a crystalline thin film is directly formed without the crystallization step using a heat treatment (e.g., a CVD method).

Figure 25:
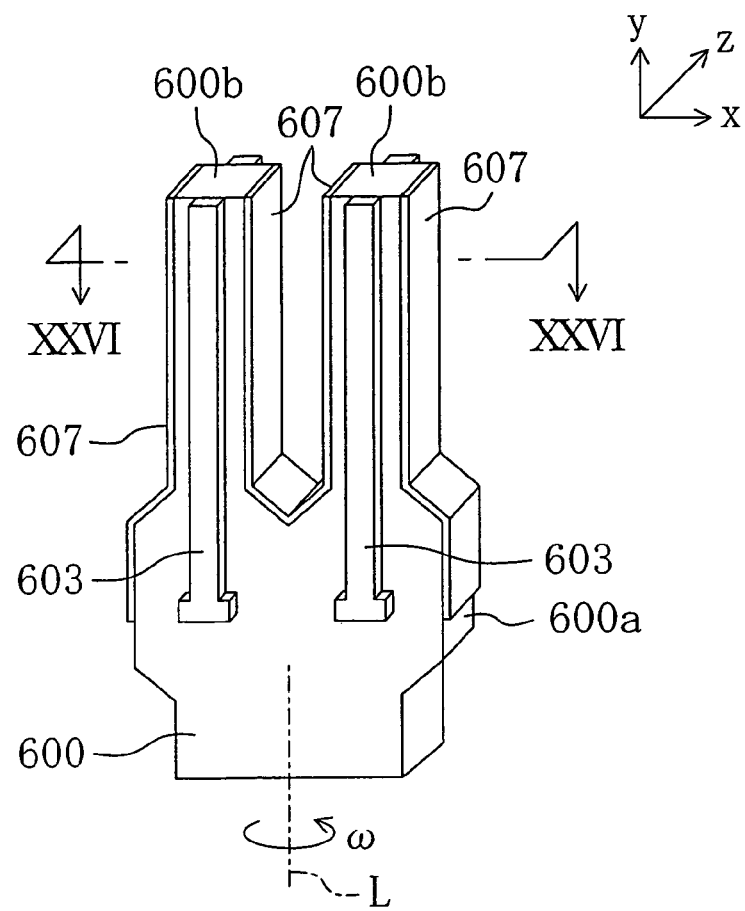
FIG. 25 is a schematic perspective view illustrating a conventional angular velocity sensor using quartz.
Figure 26:
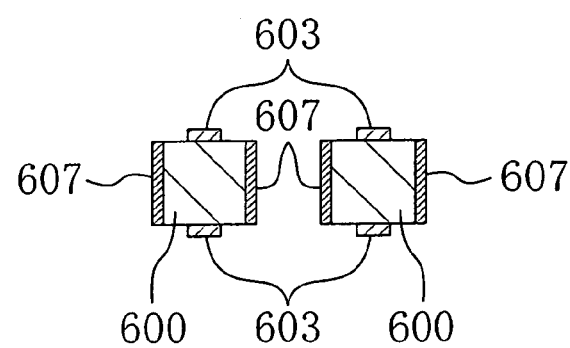
FIG. 26 is a cross-sectional view taken along line XXVI-XXVI of FIG. 25.

Now, a conventional angular velocity sensor will be described with reference to FIG. 25 and FIG. 26.

The conventional angular velocity sensor includes a piezoelectric member 600 made of quartz having a thickness of 0.3 mm. As does the substrate 500 of the angular velocity sensor of the present embodiment, the piezoelectric member 600 includes a fixed portion 600a, and a pair of vibrating portions 600b extending from the fixed portion 600a in one direction (the y direction in FIG. 25) in parallel to each other. The driving electrodes 603 for vibrating the vibrating portion 600b in the width direction thereof (the x direction in FIG. 25) are provided respectively on two surfaces of the vibrating portion 600b opposing each other in the thickness direction thereof (the z direction in FIG. 25), and detection electrodes 607 for detecting the displacement of the vibrating portion 600b in the thickness direction are provided respectively on two side surfaces of the vibrating portion 600b.

In the conventional angular velocity sensor, a voltage having a frequency that is resonant with the proper oscillation of the vibrating portion 600b is applied between the two driving electrodes 603 of each vibrating portion 600b so as to vibrate the pair of vibrating portions 600b in the width direction thereof (the x direction) symmetrically with respect to the center line L between the pair of vibrating portions 600b, as in the angular velocity sensor of the present embodiment. If an angular velocity co about the center line L is applied in this state, the pair of vibrating portions 600b are bent and deformed in the thickness direction (the z direction) by the Coriolis force, thereby generating a voltage according to the magnitude of the Coriolis force between the two detection electrodes 607 of each vibrating portion 600b. Then, the angular velocity ω can be calculated based on the magnitude of the voltage (the Coriolis force).

Since the conventional angular velocity sensor uses the piezoelectric member 600 made of quartz, the piezoelectric constant is as low as −3 pC/N. Moreover, since the fixed portion 600a and the vibrating portion 600b are machined, it is difficult to reduce the size thereof, and the dimensional precision thereof is low.

In contrast, in the angular velocity sensor of the present embodiment, the portion for detecting the angular velocity (the vibrating portion 500b) is the piezoelectric element having a similar structure to that of Embodiment 1. Therefore, the piezoelectric constant can be increased to be about 40 times as large as that of the conventional angular velocity sensor, and thus the size thereof can be reduced significantly. Moreover, minute processing with thin film formation techniques can be used, thereby significantly improving the dimensional precision. Furthermore, even if the angular velocity sensors are mass-produced industrially, it is possible to obtain angular velocity sensors with a high characteristics reproducibility and a small characteristics deviation, and with a high breakdown voltage and a high reliability.

Note that also in the angular velocity sensor of the present embodiment, as in the piezoelectric element of Embodiment 1, the orientation control layer 504 is preferably made of lead lanthanum zirconate titanate whose zirconium content is equal to or greater than zero and less than or equal to 20 mol % and whose lead content is in excess of the stoichiometric composition by an amount greater than zero and less than or equal to 30 mol %, or made of the lead lanthanum zirconate titanate to which at least one of magnesium and manganese is added. The lanthanum content of the lead lanthanum zirconate titanate is preferably greater than zero and less than or equal to 25 mol %. When at least one of magnesium and manganese is added to the lead lanthanum zirconate titanate, the total amount thereof to be added is preferably greater than zero and less than or equal to 10 mol %.

Moreover, the first electrode layer 503 is desirably made of at least one noble metal selected from the group consisting of platinum, iridium, palladium and ruthenium, which contains titanium or the like, and the content of titanium or the like is desirably greater than zero and less than or equal to 30 mol %.

Furthermore, the piezoelectric layer 505 may be made of PZT to which the Pb-containing complex perovskite compound described in Embodiment 1 has been added in an amount that is from 1 mol % to 50 mol %, or may be made of a material obtained by further adding Sr, Nb, Al or the like to the PZT that contains the Pb-containing complex perovskite compound.

Furthermore, while only one pair of vibrating portions 500b is provided in the substrate 500 in the angular velocity sensor of the present embodiment, a plurality of pairs of vibrating portions may alternatively be provided so as to detect angular velocities with respect to a plurality of axes extending in different directions.

Moreover, while the first electrode layer 503, the orientation control layer 504, the piezoelectric layer 505 and the second electrode layer 506 are layered in this order on the vibrating portions 500b of the substrate 500 and a portion of the fixed portion 500a close to the vibrating portions 500b in the angular velocity sensor of the present embodiment, these layers may alternatively be layered only on the vibrating portions 500b.

In addition, while the piezoelectric element of the present invention is applied to an ink jet head (an ink jet recording apparatus) and an angular velocity sensor in the embodiments described above, the piezoelectric element of the present invention may be used in various other applications including, but not limited to, thin film condensers, charge storage capacitors of non-volatile memory devices, various kinds of actuators, infrared sensors, ultrasonic sensors, pressure sensors, acceleration sensors, flow meters, shock sensors, piezoelectric transformers, piezoelectric igniters, piezoelectric speakers, piezoelectric microphones, piezoelectric filters, piezoelectric pickups, tuning-fork oscillators, and delay lines. Particularly, the piezoelectric element of the present invention may suitably be used in a thin film piezoelectric actuator for a disk apparatus provided in a head supporting mechanism, in which a head for recording or reproducing information to/from a disk being spun in a disk apparatus (a disk apparatus used as a storage device of a computer, etc.) is provided on a substrate, wherein the substrate is deformed and the head is displaced by a thin film piezoelectric element provided on the substrate (see, for example, Japanese Unexamined Patent Publication No. 2001-332041). The thin film piezoelectric element has a similar structure to that described in the embodiments above, in which the first electrode layer, the orientation control layer, the piezoelectric layer and the second electrode layer are layered in this order, with the second electrode layer being bonded to the substrate.

What is claimed is:

1. A piezoelectric element comprising: a first electrode layer; an orientation control layer provided on the first electrode layer; a piezoelectric layer provided on the orientation control layer; and a second electrode layer provided on the piezoelectric layer,
    wherein the orientation control layer is made of a cubic or tetragonal perovskite oxide;
    the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and
    crystal grains of the piezoelectric layer are columnar grains which extend thickness-wise in the piezoelectric layer and in which the ratio of the average cross-sectional diameter of the grains to the grain length is from 1/50 to 1/14.

2. The piezoelectric element of claim 1, wherein the orientation control layer is preferentially oriented along a (100) or (001) plane, and
    the piezoelectric layer is preferentially oriented along a (001) plane.

3. The piezoelectric element of claim 2, wherein the first electrode layer is made of a noble metal containing titanium or titanium oxide.

4. The piezoelectric element of claim 3, wherein the noble metal of the first electrode layer is at least one element selected from the group consisting of platinum, iridium, palladium and ruthenium, and
    the content of the titanium or titanium oxide which is contained in the noble metal is greater than zero and less than or equal to 30 mol %.

5. The piezoelectric element of claim 3, wherein titanium or titanium oxide existing at a surface of the first electrode layer that is closer to the orientation control layer protrudes less than 2 nm from the surface.

6. The piezoelectric element of claim 2, wherein the first electrode is made of a noble metal containing at least one substance selected from the group consisting of Mn, Fe, Co, Ni, Mg, Ca, Sr, Ba, Al, and oxides of these elements.

7. The piezoelectric element of claim 6, wherein the noble metal of the first electrode layer is at least one element selected from the group consisting of platinum, iridium, palladium and ruthenium, and
the content of the substance which is contained in the noble metal is greater than zero and less than or equal to 30 mol %.

8. The piezoelectric element of claim 6, wherein the substance contained in the noble metal of the first electrode layer and existing at a surface of the first electrode layer that is closer to the orientation control layer protrudes less than 2 nm from the surface.

9. The piezoelectric element of claim 1, wherein the orientation control layer and the piezoelectric layer are both preferentially oriented along a (111) plane.

10. The piezoelectric element of claim 3, wherein the degree of (111) orientation of the orientation control layer is 50% or more.

11. The piezoelectric element of claim 1, wherein in the chemical formula of the Pb-containing complex perovskite compound, the element A is at least one element selected from the group consisting of Mg, Mn, Ni, Co, Zn, and Cd, and the element B is Nb; and
in the chemical formula, the value of a is $1/3$ and the value of b is $2/3$.

12. The piezoelectric element of claim 1, wherein in the chemical formula of the Pb-containing complex perovskite compound, the element A is at least one element selected from the group consisting of Mg, Mn, and Ni, and the element B is Ta or Sb; and
in the chemical formula, the value of a is $1/3$ and the value of b is $2/3$.

13. The piezoelectric element of claim 1, wherein in the chemical formula of the Pb-containing complex perovskite compound, the element A is at least one element selected from the group consisting of Fe, Cr, In, Y, Sb, and Mn, and the element B is Nb; and
in the chemical formula, the value of a is $1/2$ and the value of b is $1/2$.

14. The piezoelectric element of claim 1, wherein in the chemical formula of the Pb-containing complex perovskite compound, the element A is at least one element selected from the group consisting of Fe, Cr, and Mn, and the element B is Ta; and
in the chemical formula, the value of a is $1/2$ and the value of b is $1/2$.

15. The piezoelectric element of claim 1, wherein in the chemical formula of the Pb-containing complex perovskite compound, the element A is at least one element selected from the group consisting of Mn, Ni, Co, Mg, and Zn, and the element B is Te or W; and
in the chemical formula, the value of a is $1/2$ and the value of b is $1/2$.

16. The piezoelectric element of claim 1, wherein the orientation control layer is made of lead lanthanum zirconate titanate whose zirconium content is equal to or greater than zero and less than or equal to 20 mol % and whose lead content is in excess of the stoichiometric composition by an amount greater than zero and less than or equal to 30 mol %, or made of the lead lanthanum zirconate titanate to which at least one of magnesium and manganese is added.

17. The piezoelectric element of claim 16, wherein the lanthanum content of the lead lanthanum zirconate titanate in the orientation control layer is greater than zero and less than or equal to 25 mol %.

18. The piezoelectric element of claim 16, wherein when at least one of magnesium and manganese is added to the lead lanthanum zirconate titanate in the orientation control layer, the total amount thereof to be added is greater than zero and less than or equal to 10 mol %.

19. The piezoelectric element of claim 1, wherein the first electrode layer is formed on a substrate, and
an adhesive layer for improving adhesion between the substrate and the first electrode layer is provided between the substrate and the first electrode layer.

20. An ink jet head, comprising: a piezoelectric element in which a first electrode layer, an orientation control layer, a piezoelectric layer and a second electrode layer are layered in this order; a vibration layer provided on one surface of the piezoelectric element that is closer to the second electrode layer; and a pressure chamber member bonded to one surface of the vibration layer that is away from the piezoelectric element and including a pressure chamber for storing ink therein, in which the vibration layer is displaced in a thickness direction by a piezoelectric effect of the piezoelectric layer of the piezoelectric element so as to discharge the ink out of the pressure chamber,
wherein the orientation control layer of the piezoelectric element is made of a cubic or tetragonal perovskite oxide;
the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and
crystal grains of the piezoelectric layer are columnar grains which extend thickness-wise in the piezoelectric layer and in which the ratio of the average cross-sectional diameter of the grains to the grain length is from $1/50$ to $1/14$.

21. An ink jet head, comprising: a piezoelectric element in which a first electrode layer, an orientation control layer, a piezoelectric layer and a second electrode layer are layered in this order; a vibration layer provided on one surface of the piezoelectric element that is closer to the first electrode layer; and a pressure chamber member bonded to one surface of the vibration layer that is away from the piezoelectric element and including a pressure chamber for storing ink therein, in which the vibration layer is displaced in a thickness direction by a piezoelectric effect of the piezoelectric layer of the piezoelectric element so as to discharge the ink out of the pressure chamber,
wherein the orientation control layer of the piezoelectric element is made of a cubic or tetragonal perovskite oxide;
the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and
crystal grains of the piezoelectric layer are columnar grains which extend thickness-wise in the piezoelectric layer and in which the ratio of the average cross-sectional diameter of the grains to the grain length is from $1/50$ to $1/14$.

22. An angular velocity sensor, comprising a substrate including a fixed portion and at least a pair of vibrating portions extending from the fixed portion in a predetermined direction, in which a first electrode layer, an orientation control layer, a piezoelectric layer and a second electrode layer are layered in this order at least on each of the vibrating portions of the substrate, and the second electrode layer on each of the vibrating portions is patterned into at least one driving electrode for vibrating the vibrating portion in a width direction thereof and at least one detection electrode for detecting a displacement of the vibrating portion in a thickness direction thereof, wherein the orientation control layer is made of a cubic or tetragonal perovskite oxide;

the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from 1/50 to 1/14.

23. An ink jet recording apparatus, comprising an ink jet head, the ink jet head including: a piezoelectric element in which a first electrode layer, an orientation control layer, a piezoelectric layer and a second electrode layer are layered in this order; a vibration layer provided on one surface of the piezoelectric element that is closer to the second electrode layer; and a pressure chamber member bonded to one surface of the vibration layer that is away from the piezoelectric element and including a pressure chamber for storing ink therein, the ink jet head being capable of being relatively moved with respect to a recording medium, in which while the ink jet head is moved with respect to the recording medium, the vibration layer is displaced in a thickness direction by a piezoelectric effect of the piezoelectric layer of the piezoelectric element in the ink jet head so as to discharge the ink out of the pressure chamber through a nozzle hole communicated to the pressure chamber onto the recording medium, thereby recording information, wherein the orientation control layer of the piezoelectric element of the ink jet head is made of a cubic or tetragonal perovskite oxide;

the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from 1/50 to 1/14.

24. An ink jet recording apparatus, comprising an ink jet head, the ink jet head including: a piezoelectric element in which a first electrode layer, an orientation control layer, a piezoelectric layer and a second electrode layer are layered in this order; a vibration layer provided on one surface of the piezoelectric element that is closer to the first electrode layer; and a pressure chamber member bonded to one surface of the vibration layer that is away from the piezoelectric element and including a pressure chamber for storing ink therein, the ink jet head being capable of being relatively moved with respect to a recording medium, in which while the ink jet head is moved with respect to the recording medium, the vibration layer is displaced in a thickness direction by a piezoelectric effect of the piezoelectric layer of the piezoelectric element in the ink jet head so as to discharge the ink out of the pressure chamber through a nozzle hole communicated to the pressure chamber onto the recording medium, thereby recording information, wherein the orientation control layer of the piezoelectric element of the ink jet head is made of a cubic or tetragonal perovskite oxide;

the piezoelectric layer has a rhombohedral or tetragonal crystalline structure and is made of lead zirconate titanate to which a Pb-containing complex perovskite compound whose chemical formula is expressed as $Pb(A_aB_b)O_3$ has been added in an amount that is from 1 mol % to 50 mol %; and crystal grains of the piezoelectric layer are columnar grains which extend thickness-wise in the piezoelectric layer and in which the ratio of the average cross-sectional diameter of the grains to the grain length is from 1/50 to 1/14.

* * * * *